US008982107B2

(12) United States Patent
Takahashi

(10) Patent No.: US 8,982,107 B2
(45) Date of Patent: Mar. 17, 2015

(54) SCANNING SIGNAL LINE DRIVE CIRCUIT AND DISPLAY DEVICE PROVIDED WITH SAME

(75) Inventor: Yoshihisa Takahashi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 230 days.

(21) Appl. No.: 13/640,905

(22) PCT Filed: Jan. 18, 2011

(86) PCT No.: PCT/JP2011/050782
§ 371 (c)(1),
(2), (4) Date: Oct. 12, 2012

(87) PCT Pub. No.: WO2011/148658
PCT Pub. Date: Dec. 1, 2011

(65) Prior Publication Data
US 2013/0033468 A1    Feb. 7, 2013

(30) Foreign Application Priority Data

May 24, 2010    (JP) .................................. 2010-118261

(51) Int. Cl.
*G09G 5/00*    (2006.01)
*G11C 19/28*   (2006.01)
*G09G 3/20*    (2006.01)
(Continued)

(52) U.S. Cl.
CPC    *G11C 19/28* (2013.01); *G09G 3/20* (2013.01); *G09G 3/3674* (2013.01); *G11C 19/184* (2013.01); *G09G 2310/0267* (2013.01); *G09G 2310/0286* (2013.01)
USPC ................. 345/204; 345/87; 345/89; 345/98; 345/100

(58) Field of Classification Search
USPC ............................................ 345/87–100, 204
See application file for complete search history.

(56) References Cited

U.S. PATENT DOCUMENTS

| 6,963,327 B2 | 11/2005 | Kawahata et al. |
| 7,460,634 B2 | 12/2008 | Deane |
| 7,529,333 B2 | 5/2009 | Kim et al. |

(Continued)

FOREIGN PATENT DOCUMENTS

| JP | 2002-203397 A | 7/2002 |
| JP | 2006-127630 A | 5/2006 |

(Continued)

OTHER PUBLICATIONS

An International Search Report, dated Apr. 12, 2011, issued in International Application No. PCT/JP2011/050782.

*Primary Examiner* — Jennifer Nguyen
(74) *Attorney, Agent, or Firm* — Lowe Hauptman & Ham, LLP

(57) ABSTRACT

A monolithic gate driver capable of operating with a relatively small number of circuit elements is realized. A stage constituent circuit constituting each stage of a shift register includes two output terminals connected to scanning signal lines, two thin-film transistors each having a drain terminal to which an output control clock signal is supplied and a source terminal connected to the output terminal, a first-node connected to the two thin-film transistors in common, a first-node control circuit, and an input terminal for receiving a set signal. In this configuration, the first-node changes from an OFF level to an ON level based on the set signal. Further, the first-node control circuit changes the first-node from the ON level to the OFF level.

8 Claims, 39 Drawing Sheets

(51) Int. Cl.
*G09G 3/36* (2006.01)
*G11C 19/18* (2006.01)

(56) References Cited

U.S. PATENT DOCUMENTS

| | | |
|---|---|---|
| 7,548,109 B2 | 6/2009 | Kajiwara et al. |
| 2005/0083292 A1* | 4/2005 | Moon et al. .................. 345/100 |
| 2007/0070021 A1* | 3/2007 | Ahin et al. .................. 345/100 |
| 2008/0226013 A1 | 9/2008 | Deane |
| 2008/0266275 A1* | 10/2008 | Tsai et al. .................. 345/204 |
| 2010/0085294 A1 | 4/2010 | Otose |

FOREIGN PATENT DOCUMENTS

| | | |
|---|---|---|
| JP | 2008-061323 A | 3/2008 |
| JP | 2008-508654 A | 3/2008 |
| JP | 2008-537275 A | 9/2008 |
| JP | 2010-092545 A | 4/2010 |

* cited by examiner

SCANNING SIGNAL LINE DRIVE CIRCUIT AND DISPLAY DEVICE PROVIDED WITH SAME

RELATED APPLICATIONS

The present application is a National Phase of International Application No. PCT/JP2011/050782, filed Jan. 18, 2011, and claims priority from, Japanese Application No. 2010-118261, filed May 24, 2010.

TECHNICAL FIELD

The present invention relates to a display device and a drive circuit thereof, and in particular to a scanning signal line drive circuit including a shift register for driving scanning signal lines provided for a display unit of the display device.

BACKGROUND ART

In recent years, as for liquid crystal display devices, a gate driver (scanning signal line drive circuit) for driving gate bus lines (scanning signal lines) have become increasingly monolithic. Conventionally, a gate driver has mostly been mounted as an IC (Integrated Circuit) chip on a peripheral part of a substrate that constitutes a liquid crystal panel. However, in recent years, it has gradually become more common to provide a gate driver directly on a substrate. Such a gate driver is called such as a "monolithic gate driver". In a liquid crystal display device provided with a monolithic gate driver, a thin-film transistor using amorphous silicon (a-Si) (hereinafter referred to as an "a-SiTFT") has been conventionally employed as a drive element. However, a thin-film transistor using microcrystalline silicon (μc-Si) or oxide semiconductor (e.g., IGZO) has become commonly employed in recent years. Mobility of microcrystalline silicon and oxide semiconductor is greater than that of amorphous silicon. Therefore, it is possible to achieve reduction of a picture-frame area and improved resolution by employing a thin-film transistor using microcrystalline silicon or oxide semiconductor as the drive element.

A display unit of an active matrix-type liquid crystal display device includes a plurality of source bus lines (video signal lines), a plurality of gate bus lines, and a plurality of pixel formation portions provided respectively corresponding to intersections between the plurality of source bus lines and the plurality of gate bus lines. These pixel formation portions are arranged in matrix to constitute a pixel array. Each pixel formation portion includes a thin-film transistor as a switching element having a gate terminal connected to a gate bus line that passes through the corresponding intersection and a source terminal connected to a source bus line that passes through this intersection, a pixel capacitance for storing a pixel voltage value, and so on. Such an active matrix-type liquid crystal display device is also provided with the above-described gate driver, and a source driver (video signal line drive circuit) for driving the source bus lines.

Although video signals indicating pixel voltage values are transmitted through the source bus lines, the source bus lines cannot transmit video signals indicating pixel voltage values for more than one line at one time (simultaneously). Therefore, writing (charging) of the video signals to the pixel capacitances in the pixel formation portions arranged in matrix is performed sequentially line by line. Thus, the gate driver is configured by a shift register having a plurality of stages so that the plurality of gate bus lines are sequentially selected for a predetermined period. Each stage of the shift register takes one of two states (a first state and a second state) at each time point, and outputs a signal indicating this state (hereinafter referred to as a "state signal") as a scanning signal. Then, video signals are written sequentially line by line to the pixel capacitances as described above by active scanning signals being outputted sequentially from the plurality of stages constituting the shift register.

In a conventional display device, each stage of the shift register is configured as illustrated in FIG. 37 (FIG. 2 of Japanese Patent Application Laid-Open No. 2006-127630) or in FIG. 38 (FIG. 2 of U.S. Pat. No. 7,529,333) (FIG. 38 illustrates two stages). Each stage of them is provided with an output control transistor having a source terminal connected to a scanning signal output terminal and a drain terminal supplied with a clock signal. Then, an ON/OFF state of the output control transistor is controlled by controlling a potential of a node connected to a gate terminal of the output control transistor, and a potential of a clock signal when the output control transistor is in the ON state appears as a scanning signal. It should be noted that FIG. 39 is a circuit diagram showing a configuration of two stages in a shift register of the conventional display device, and the two stages correspond to a stage constituent circuit according to a first embodiment that will be later described.

Further, Japanese Patent Application Laid-Open No. 2008-508654, Japanese Patent Application Laid-Open No. 2008-537275, Japanese Patent Application Laid-Open No. 2002-203397, and Japanese Patent Application Laid-Open No. 2008-61323 also disclose a configuration of a shift register provided for a display device and such.

PRIOR ART DOCUMENTS

Patent Documents

[Patent Document 1] Japanese Patent Application Laid-Open No. 2006-127630
[Patent Document 2] U.S. Pat. No. 7,529,333
[Patent Document 3] Japanese Patent Application Laid-Open No. 2008-508654
[Patent Document 4] Japanese Patent Application Laid-Open No. 2008-537275
[Patent Document 5] Japanese Patent Application Laid-Open No. 2002-203397
[Patent Document 6] Japanese Patent Application Laid-Open No. 2008-61323

SUMMARY OF THE INVENTION

Problems to be Solved by the Invention

According to the conventional configuration, gate bus lines provided for a display unit correspond one on one to stages in a shift register, and each stage in the shift register requires a circuit (hereinafter referred to as "first-node control circuit") for controlling a potential of a node (hereinafter referred to as a "first-node") connected to a gate terminal of the output control transistor. Specifically, it is necessary to provide the first-node control circuits as many as the number of the gate bus lines. In general, as the first-node control circuit is configured by a plurality of circuit elements, a monolithic gate driver includes a large number of circuit elements. Accordingly, a yield ratio of the monolithic gate driver is lower than that of a conventional gate driver. In addition, as a large number of circuit elements are required, the size of a mounting are is an obstructive factor for downsizing.

Thus, an object of the present invention is to realize a monolithic gate driver capable of operating with a relatively small number of circuit elements.

SUMMARY OF THE INVENTION

Problems to be Solved by the Invention

A first aspect of the present invention is directed to a scanning signal line drive circuit of a display device, that drives scanning signal lines provided for a display unit, the circuit comprising:
a shift register having a plurality of stages that sequentially transfer a shift pulse based on a plurality of clock signals that are externally inputted and are cyclically driven to one of a first level and a second level, wherein
a stage constituent circuit constituting each stage of the shift register includes:
  P (where P is an integer equal to or greater than 2) output nodes connected to the scanning signal lines and each configured to output a scanning signal for driving the scanning signal line;
  P output control switching elements respectively corresponding to the P output nodes, each of the P output control switching elements having a second electrode to which an output control clock signal for controlling a level of the scanning signal outputted from the output node is supplied and a third electrode connected to the output node; and
  a first-node commonly connected to first electrodes of the P output control switching elements,
the second electrode of each of the P output control switching elements included in the stage constituent circuit is supplied with one of the plurality of clock signals as the output control clock signal such that signals different from each other are respectively supplied to the second electrodes of the P output control switching elements, and
in each stage constituent circuit,
  the scanning signal outputted from one of the P output nodes is supplied as the shift pulse to a stage constituent circuit subsequent to the each stage constituent circuit, and
  the first-node changes to an ON level based on the shift pulse outputted from a stage constituent circuit preceding the each stage constituent circuit.

According to a second aspect of the present invention, in the first aspect of the present invention,
the stage constituent circuit includes two output nodes as the P output nodes and two output control switching elements as the P output control switching elements.

According to a third aspect of the present invention, in the second aspect of the present invention,
two clock signals are inputted as the output control clock signals to the stage constituent circuit, on-duty of the two clock signals being substantially one thirds, the two clock signals being out of phase by 120 degrees.

According to a fourth aspect of the present invention, in the third aspect of the present invention,
  the stage constituent circuit
  further includes a first-node controller configured to turn the first-node to an OFF level, and
  receives one of the two clock signals as a first clock and the other of the two clock signals as a second clock, the two clock signals being inputted as the output control clock signals, the one of the two clock signals being first driven to the ON level during a period in which the first-node is in the ON level, the other of the two clock signals being later driven to the ON level during this period,
  each stage constituent circuit is supplied with, as the shift pulse, a scanning signal later driven to the ON level out of two scanning signals outputted from the two output nodes included in a previous-stage stage constituent circuit of the each stage constituent circuit, and
  the first-node controller changes the first-node from the ON level to the OFF level during a period after a scanning signal later driven to the ON level out of two scanning signals outputted from the two output nodes included in the stage constituent circuit or the second clock changes from the ON level to the OFF level until the first clock next changes from the OFF level to the ON level.

According to a fifth aspect of the present invention, in the fourth aspect of the present invention,
in each stage constituent circuit, the first-node controller changes the first-node from the ON level to the OFF level based on a scanning signal first driven to the ON level out of two scanning signals outputted from the two output nodes included in a next-stage stage constituent circuit of the each stage constituent circuit or a clock signal inputted as the first clock to the next-stage stage constituent circuit of the each stage constituent circuit.

According to a sixth aspect of the present invention, in the second aspect of the present invention,
two clock signals are inputted as the output control clock signals to the stage constituent circuit, on-duty of the two clock signals being substantially half, the two clock signals being out of phase by 90 degrees.

According to a seventh aspect of the present invention, in the sixth aspect of the present invention,
  the stage constituent circuit
  further includes a first-node controller configured to turn the first-node to an OFF level, and
  receives one of the two clock signals as a first clock and the other of the two clock signals as a second clock, the two clock signals being inputted as the output control clock signals, the one of the two clock signals being first driven to the ON level during a period in which the first-node is in the ON level, the other of the two clock signals being later driven to the ON level during this period,
  each stage constituent circuit is supplied with, as the shift pulse, a scanning signal later driven to the ON level out of two scanning signals outputted from the two output nodes included in a previous-stage stage constituent circuit of the each stage constituent circuit, and
  the first-node controller changes the first-node from the ON level to the OFF level during a period after a scanning signal later driven to the ON level out of two scanning signals outputted from the two output nodes included in the stage constituent circuit or the second clock changes from the ON level to the OFF level until the first clock next changes from the OFF level to the ON level.

According to an eighth aspect of the present invention, in the seventh aspect of the present invention,
in each stage constituent circuit, the first-node controller changes the first-node from the ON level to the OFF level based on a scanning signal later driven to the ON level out of two scanning signals outputted from the two output nodes included in a next-stage stage constituent circuit of the each stage constituent circuit or a clock signal inputted as the second clock to the next-stage stage constituent circuit of the each stage constituent circuit.

According to a ninth aspect of the present invention, in the first aspect of the present invention, P clock signals out of Q (where Q is an integer equal to or greater than 3) clock signals are inputted as the output control clock signals to the stage constituent circuit, on-duty of the Q clock signals being substantially an R-th part, the Q clock signals being out of phase by (360/Q) degrees, a relation between P, Q, and R satisfying an expression listed below.

$$(P/Q)+(1/R) \leq 1$$

According to a tenth aspect of the present invention, in the ninth aspect of the present invention, a relation between P, Q, and R satisfies an expression listed below, and in each stage constituent circuit, the first-node changes to the ON level based on a scanning signal that is P-th driven to the ON level out of the scanning signals outputted from the output nodes included in a previous-stage constituent circuit of the each stage constituent circuit, and changes to an OFF level based on a scanning signal that is (Q-P)th driven to the ON level out of the scanning signals outputted from the output nodes included in the stage constituent circuit subsequent to the each stage constituent circuit.

$$(P/Q)+(1/R)=1$$

According to an eleventh aspect of the present invention, in the ninth aspect of the present invention, the stage constituent circuit further includes a first-node controller configured to turn the first-node to an OFF level, and receives one of the P clock signals as a first-outputted clock and a different one of the P clock signals as a last-outputted clock, the one of the P clock signals being first driven to the ON level during a period in which the first-node is in the ON level, the different one of the P clock signals being last driven to the ON level during this period, the stage constituent circuit is supplied with, as the shift pulse, a signal that changes from the OFF level to the ON level during a period after the last-outputted clock changes from the ON level to the OFF level until the first-outputted clock next changes from the OFF level to the ON level, and the first-node controller changes the first-node from the ON level to the OFF level during a period after a scanning signal last driven to the ON level out of P scanning signals outputted from the P output nodes included in the stage constituent circuit or the last-outputted clock changes from the ON level to the OFF level until the first-outputted clock next changes from the OFF level to the ON level.

According to a twelfth aspect of the present invention, in the eleventh aspect of the present invention, in each stage constituent circuit, the first-node controller changes the first-node from the ON level to the OFF level based on one scanning signal out of the scanning signals outputted from the output nodes included in a stage constituent circuits subsequent to the each stage constituent circuit or the output control clock signal supplied to the second electrode of the output control switching element having the third electrode connected to the output node for outputting the one scanning signal, the one scanning signal being driven to the ON level during a period after a scanning signal last driven to the ON level out of P scanning signals outputted from the P output nodes included in the each stage constituent circuit or the last-outputted clock changes from the ON level to the OFF level until the first-outputted clock next changes from the OFF level to the ON level.

According to a thirteenth aspect of the present invention, in the first aspect of the present invention, the stage constituent circuit further includes P output node controllers configured to respectively turn the P output nodes to an OFF level, and each output node controller changes the output node from the ON level to the OFF level based on a control signal that is supplied to the P output node controllers in common.

According to a fourteenth aspect of the present invention, in the thirteenth aspect of the present invention, the stage constituent circuit further includes an all-output-node controller configured to generate the control signal, and the all-output-node controller generates the control signal based on one of one scanning signal first driven to the ON level out of P scanning signals outputted from the stage constituent circuit, the output control clock signal supplied to the second electrode of the output control switching element having the third electrode connected to the output node for outputting the one scanning signal, the shift pulse, and the potential of the first-node.

According to a fifteenth aspect of the present invention, in the first aspect of the present invention, the stage constituent circuit further includes:
P output node controllers configured to respectively turn the P output nodes to an OFF level; and
a first-node controller configured to turn the first-node to the OFF level, wherein each output node controller changes the output node from the ON level to the OFF level based on a control signal that is supplied to the P output node controllers in common, and the first-node controller changes the first-node from the ON level to the OFF level based on the control signal.

According to a sixteenth aspect of the present invention, in the fifteenth aspect of the present invention, the stage constituent circuit further includes a common controller configured to generate the control signal, and the common controller generates the control signal based on one of the shift pulse and the potential of the first-node.

According to a seventeenth aspect of the present invention, in the first aspect of the present invention, the stage constituent circuit includes a first-node control switching element whose second electrode or third electrode is connected to the first-node, and the first-node control switching element is a thin-film transistor having a multi-channel structure.

According to an eighteenth aspect of the present invention, in the first aspect of the present invention, there are a plurality of the shift registers, when taking the plurality of clock signals inputted to each shift register as a clock signal group, phases of the clock signal groups of the plurality of the shift registers are different from each other, among the plurality of shift registers, the output nodes that output scanning signals driven to the ON level at identical timing are connected by the scanning signal line.

According to a nineteenth aspect of the present invention, in the eighteenth aspect of the present invention, a first shift register out of the plurality of shift registers is externally supplied with a start pulse, the start pulse being a pulse signal for generating the shift pulse and to be supplied to a first stage of the plurality of stages, and the shift registers other than the first shift register are supplied with a scanning signal outputted from the first shift register as the start pulse.

According to a twentieth aspect of the present invention, in the eighteenth aspect of the present invention, a second shift register out of the plurality of shift registers is externally supplied with an end pulse, the end pulse being a pulse signal for stopping an operation of sequentially transferring the shift pulse to the plurality of stages and to be supplied to a last stage of the plurality of stages, and the shift registers other than the second shift register are supplied with a scanning signal outputted from the second shift register as the end pulse.

According to a twenty-first aspect of the present invention, in the first aspect of the present invention, all of the switching elements included in each stage constituent circuit are respectively constituted by thin-film transistors of an identical channel.

A twenty-second aspect of the present invention is directed to a display device, comprising:

the display unit; and the scanning signal line drive circuit according to the first aspect of the present invention.

According to a twenty-third aspect of the present invention, in the twenty-second aspect of the present invention, the display device being a driver-monolithic type in which the display unit and the scanning signal line drive circuit are formed on one substrate.

A twenty-fourth aspect of the present invention is directed to a method of driving a plurality of scanning signal lines provided for a display unit by a scanning signal line drive circuit including a shift register having a plurality of stages that sequentially transfer a shift pulse based on a plurality of clock signals that are externally inputted and are cyclically driven to one of a first level and a second level, the method comprising:

for a stage constituent circuit constituting each stage of the shift register, a first-node turnon step of turning a first-node included in the stage constituent circuit to an ON level; and P (where P is an integer equal to or greater than 2) times of output node turnon steps of respectively turning P output nodes connected to the scanning signal lines and included in the stage constituent circuit during a period in which the first-node is maintained at the ON level, wherein the stage constituent circuit includes P output control switching elements respectively corresponding to the P output nodes, each of the P output control switching elements having a second electrode to which an output control clock signal for controlling a level of a scanning signal outputted from the output node to drive the scanning signal line is supplied and a third electrode connected to the output node, and in each stage constituent circuit, the scanning signal outputted from one of the P output nodes is supplied as the shift pulse to a stage constituent circuit subsequent to the each stage constituent circuit, and in the first-node turnon step, the P output control switching elements are turned to the ON state by the first-node changing to the ON level based on the shift pulse outputted from a stage constituent circuit preceding the each stage constituent circuit.

Effects of the Invention

According to the first aspect of the present invention, each stage of the shift register is provided with the P output nodes for outputting scanning signals. The clock signals that are different from each other are supplied as the output control clock signals to the second electrodes of the P output control switching elements whose third electrodes are respectively connected to the P output nodes. Accordingly, the P scanning signals that are sequentially driven to the ON level are outputted from each stage of the shift register. Therefore, the scanning signal lines as a whole are driven by the shift register as in the conventional example. Here, the first electrodes of the P output control switching elements are connected in common to the first-node that is turned to the ON level based on the shift pulse. Accordingly, the shift register as a whole requires a relatively small number of the circuit elements for controlling the state of the output control switching elements as compared to the conventional example. Thus, it is possible to drive the scanning signal lines as a whole as in the conventional example using a scanning signal line drive circuit configured by a relatively small number of circuit elements as compared to the conventional example. Accordingly, a yield ratio is improved as compared to the conventional example. Further, it is possible to downsize the display device.

According to the second aspect of the present invention, it is possible to reduce the number of the circuit elements that constitute the scanning signal line drive circuit without complicating the configuration of each stage of the shift register.

According to the third aspect of the present invention, the scanning signal line drive circuit capable of operating with a relatively small number of clock signals can be configured by a relatively small number of circuit elements as compared to the conventional example.

According to the fourth aspect of the present invention, during a period in which the scanning signal outputted from each stage of the shift register is to be driven to the OFF level, the output control switching elements included in the each stage are turned to the OFF state. Accordingly, it is possible to suppress an occurrence of an abnormal operation in the shift register.

According to the fifth aspect of the present invention, similarly to the fourth aspect of the present invention, it is possible to suppress an occurrence of an abnormal operation in the shift register.

According to the sixth aspect of the present invention, the scanning signal line drive circuit capable of operating with a relatively small number of clock signals can be configured by a relatively small number of circuit elements as compared to the conventional example.

According to the seventh aspect of the present invention, similarly to the fourth aspect of the present invention, it is possible to suppress an occurrence of an abnormal operation in the shift register.

According to the eighth aspect of the present invention, similarly to the fourth aspect of the present invention, it is possible to suppress an occurrence of an abnormal operation in the shift register.

According to the ninth aspect of the present invention, the scanning signals show substantially the same waveform in all the scanning signal lines, and it is possible to suppress an occurrence of display unevenness.

According to the tenth aspect of the present invention, it is possible to operate the scanning signal line drive circuit with a further reduced number of clock signals.

According to the eleventh aspect of the present invention, similarly to the fourth aspect of the present invention, it is possible to suppress an occurrence of an abnormal operation in the shift register.

According to the twelfth aspect of the present invention, similarly to the fourth aspect of the present invention, it is possible to suppress an occurrence of an abnormal operation in the shift register.

According to the thirteenth aspect of the present invention, in each stage of the shift register, the P output node controllers for turning the P output nodes that output the scanning signals to the OFF level are controlled by a single control signal supplied to the P output node controllers in common. Accordingly, it is possible to prevent the scanning signals from being driven to the ON level during periods other than a selection period while reducing the number of the circuit elements that constitute the scanning signal line drive circuit as compared to the conventional example.

According to the fourteenth aspect of the present invention, it is possible to prevent the output node included in each stage from being turned to the OFF level during a period in which the scanning signal outputted from the each stage of the shift register is to be driven to the ON level. Accordingly, it is possible to suppress an occurrence of an abnormal operation in the shift register.

According to the fifteenth aspect of the present invention, the P output node controllers for turning the P output nodes that output the scanning signals to the OFF level and the first-node controller for turning the first-node connected to the first electrodes of the P output control switching elements to the OFF level are controlled by a single control signal. Accordingly, it is possible to prevent the scanning signals from being driven to the ON level during periods other than the selection period while reducing the number of the circuit elements that constitute the scanning signal line drive circuit as compared to the conventional example.

According to the sixteenth aspect of the present invention, similarly to the fourteenth aspect of the present invention, it is possible to suppress an occurrence of an abnormal operation in the shift register.

According to the seventeenth aspect of the present invention, it is possible to suppress a decrease of the potential of the first-node during the selection period, and stability of a circuit operation is improved.

According to the eighteenth aspect of the present invention, it is possible to realize a configuration in which each scanning signal line is driven by the plurality of drive circuits using a smaller number of circuit elements as compared to the conventional example. Further, even when there is a difference between waveforms of the plurality of scanning signals outputted from the respective stages of the shift register, the scanning signals show substantially the same waveform for all of the scanning signal lines. With this, it is possible to suppress an occurrence of display unevenness.

According to the nineteenth aspect of the present invention, it is possible to reduce the number of the signals required for starting the operation of the plurality of shift registers.

According to the twentieth aspect of the present invention, it is possible to reduce the number of the signals required for stopping the operation of the plurality of shift registers.

According to the twenty-first aspect of the present invention, it is possible to reduce production cost of the scanning signal line drive circuit.

According to the twenty-second aspect of the present invention, it is possible to realize a display device having a scanning signal line drive circuit obtaining the same effect according to the first aspect of the present invention.

According to the twenty-third aspect of the present invention, in a display device of a driver-monolithic type in which a display unit and a scanning signal line drive circuit are formed on the same substrate, the same effect according to the first aspect of the present invention is obtained.

MODES FOR CARRYING OUT THE INVENTION

Hereinafter, embodiments according to the present invention will be described with reference to the accompanying drawings. It should be noted that in the following description, a gate terminal (gate electrode), a drain terminal (drain electrode), and a source terminal (source electrode) of a thin-film transistor respectively correspond to a first electrode, a second electrode, and a third electrode. Further, the description is given assuming that all thin-film transistors provided within a shift register are of an N-channel type.

1. First Embodiment 1.1 Overall Configuration and Operation

Figure 2:
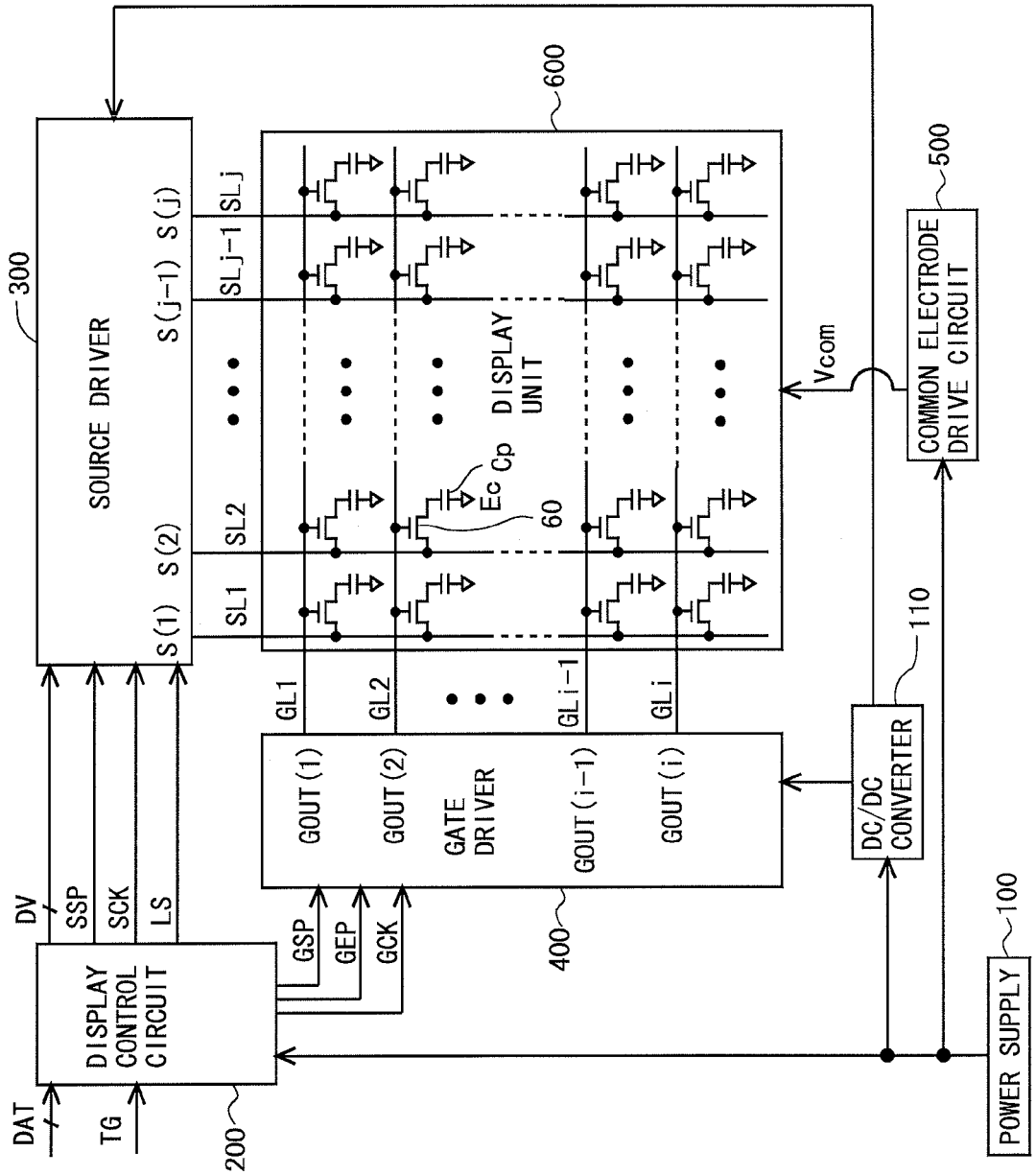
FIG. 2 is a block diagram for illustration of an overall configuration of the liquid crystal display device according to the first embodiment.

FIG. 2 is a block diagram for illustration of an overall configuration of an active matrix-type liquid crystal display device according to a first embodiment of the present invention. As illustrated in FIG. 2, this liquid crystal display device is provided with a power supply 100, a DC/DC converter 110, a display control circuit 200, a source driver (video signal line drive circuit) 300, a gate driver (scanning signal line drive circuit) 400, a common electrode drive circuit 500, and a display unit 600. Here, the gate driver 400 is formed using such as amorphous silicon, polycrystalline silicon, microcrystalline silicon, or oxide semiconductor (e.g., IGZO) on a display panel including the display unit 600. Specifically, in this embodiment, the gate driver 400 and the display unit 600 are formed on the same substrate (an array substrate that is one of two substrates that constitute a liquid crystal panel).

The display unit 600 is provided with a pixel circuit having a plurality of (j) source bus lines (video signal lines) SL1-SLj, a plurality of (i) gate bus lines (scanning signal lines) GL1-GLi, and a plurality of (i×j) pixel formation portions provided respectively corresponding to intersections between the source bus lines SL1-SLj and the gate bus lines GL1-GLi. The plurality of pixel formation portions are arranged in matrix and constitute a pixel array. Each of the pixel formation portions is configured by a thin-film transistor (TFT) 60 that is a switching element having a gate terminal connected to a gate bus line that passes a corresponding one of the intersections and a source terminal connected to a source bus line that passes this intersection, a pixel electrode connected to a drain terminal of the thin-film transistor 60, a common electrode Ec that is an opposite electrode provided in common to the plurality of pixel formation portions, and a liquid crystal layer provided in common to the plurality of pixel formation portions and sandwiched between the pixel electrodes and the common electrode Ec. Further, a liquid crystal capacitance constituted by the pixel electrodes and the common electrode Ec constitutes a pixel capacitance Cp. While an auxiliary capacitance is generally provided in parallel with the liquid crystal capacitance in order to reliably maintain a voltage in the pixel capacitance Cp, a description and illustration of the auxiliary capacitance is omitted as the auxiliary capacitance is not directly related to the present invention.

The power supply 100 supplies a predetermined power supply voltage to the DC/DC converter 110, the display control circuit 200, and the common electrode drive circuit 500. The DC/DC converter 110 generates a predetermined direct voltage for operating the source driver 300 and the gate driver 400 based on the power supply voltage, and supplies it to the source driver 300 and the gate driver 400. The common electrode drive circuit 500 supplies a predetermined potential Vcom to the common electrode Ec.

The display control circuit 200 receives an externally supplied image signal DAT and an externally supplied group of timing signals TG including such as a horizontal synchronizing signal and a vertical synchronizing signal, and outputs a digital video signal DV, and a source start pulse signal SSP, a source clock signal SCK, a latch strobe signal LS, a gate start pulse signal GSP, a gate end pulse signal GEP, and a gate clock signal GCK that are for controlling display of images in the display unit 600. It should be noted that in this embodiment, the gate clock signal GCK is configured by three-phase clock signals GCK1 (hereinafter referred to as a "first gate clock signal"), GCK2 (hereinafter referred to as a "second gate clock signal"), and GCK3 (hereinafter referred to as a "third gate clock signal") as will be described later. Further, the gate clock signal GCK is generated from the power supply voltage, and its high-level side potential is VDD and is low-level side potential is VSS.

The source driver 300 receives the digital video signal DV, the source start pulse signal SSP, the source clock signal SCK, and the latch strobe signal LS that are outputted from the display control circuit 200, and applies driving video signals S(1)-S(j) respectively to the source bus lines SL1-SLj.

The gate driver 400 repeats application of active scanning signals GOUT(1)-GOUT(i) respectively to the gate bus lines GL1-GLi with a cycle of single vertical scanning period based on the gate start pulse signal GSP, the gate end pulse signal GEP, and the gate clock signal GCK outputted from the display control circuit 200. The gate driver 400 will be described later in detail.

In the above described manner, an image based on the image signal DAT externally supplied is displayed in the display unit 600, by applying the driving video signals S(1)-S(j) respectively to the source bus lines SL1-SLj, and by applying the scanning signals GOUT(1)-GOUT(i) respectively to the gate bus lines GL1-GLi.

1.2 Configuration and Operation of Gate Driver

Figure 3:
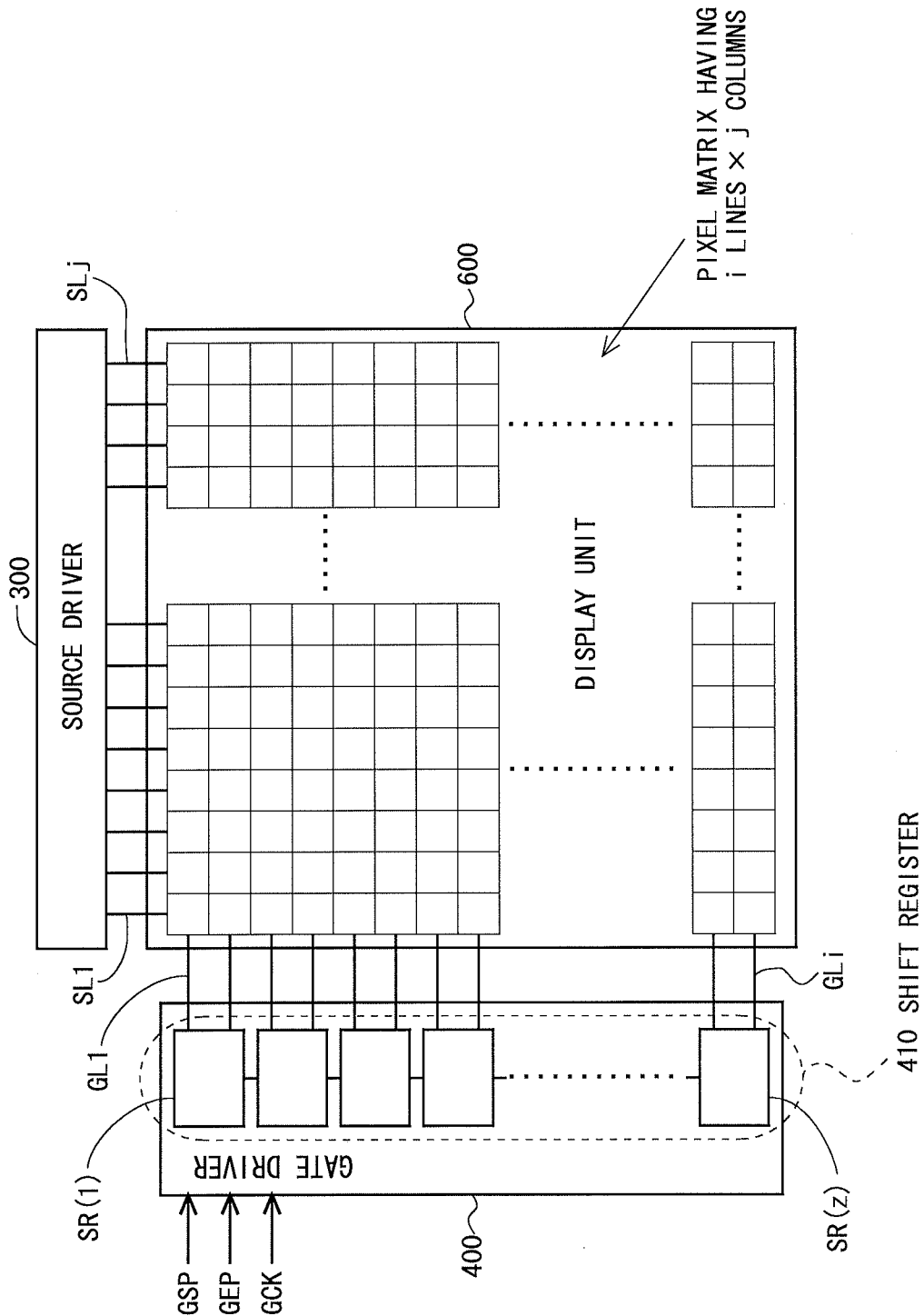
FIG. 3 is a block diagram for illustration of a configuration of the gate driver according to the first embodiment.

Next, an outline of a configuration and an operation of the gate driver 400 according to this embodiment will be described with reference to FIG. 3 to FIG. 5. As illustrated in FIG. 3, the gate driver 400 is configured by a shift register 410 having a plurality of stages. The display unit 600 is provided with a pixel matrix having i lines×j columns. Each stage of the shift register 410 corresponds to two lines of the pixel matrix. Specifically, each stage of the shift register 410 outputs a signal (hereinafter referred to as a "first state signal") indicating a state of a node connected to a preceding line (hereinafter referred to as a "preceding gate bus line") of two consecutive gate bus lines and a signal (hereinafter referred to as a "second state signal") indicating a state of a node connected to a succeeding line (hereinafter referred to as a "succeeding gate bus line") of the two consecutive gate bus lines. The first state signal and the second state signal are supplied to the gate bus lines as scanning signals. It should be noted that in the following description, a circuit that constitutes each stage of the shift register 410 is referred to as a "stage constituent circuit".

As illustrated in FIG. 3, the shift register 410 includes z stage constituent circuits SR(1)-SR(z). These z stage constituent circuits SR(1)-SR(z) are connected in series with each other. In this embodiment, "z=i/2" is established, as a single stage in the shift register 410 corresponds to two lines of the pixel matrix as described above. It should be noted that in the following description, a period in which a first state signal at a high level is outputted from a stage constituent circuit and a scanning signal at the high level is applied to a preceding gate bus line associated with this stage constituent circuit is referred to as a "first selection period", and a period in which a second state signal at the high level is outputted from a stage constituent circuit and a scanning signal at the high level is applied to a succeeding gate bus line associated with this stage constituent circuit is referred to as a "second selection period".

Figure 4:
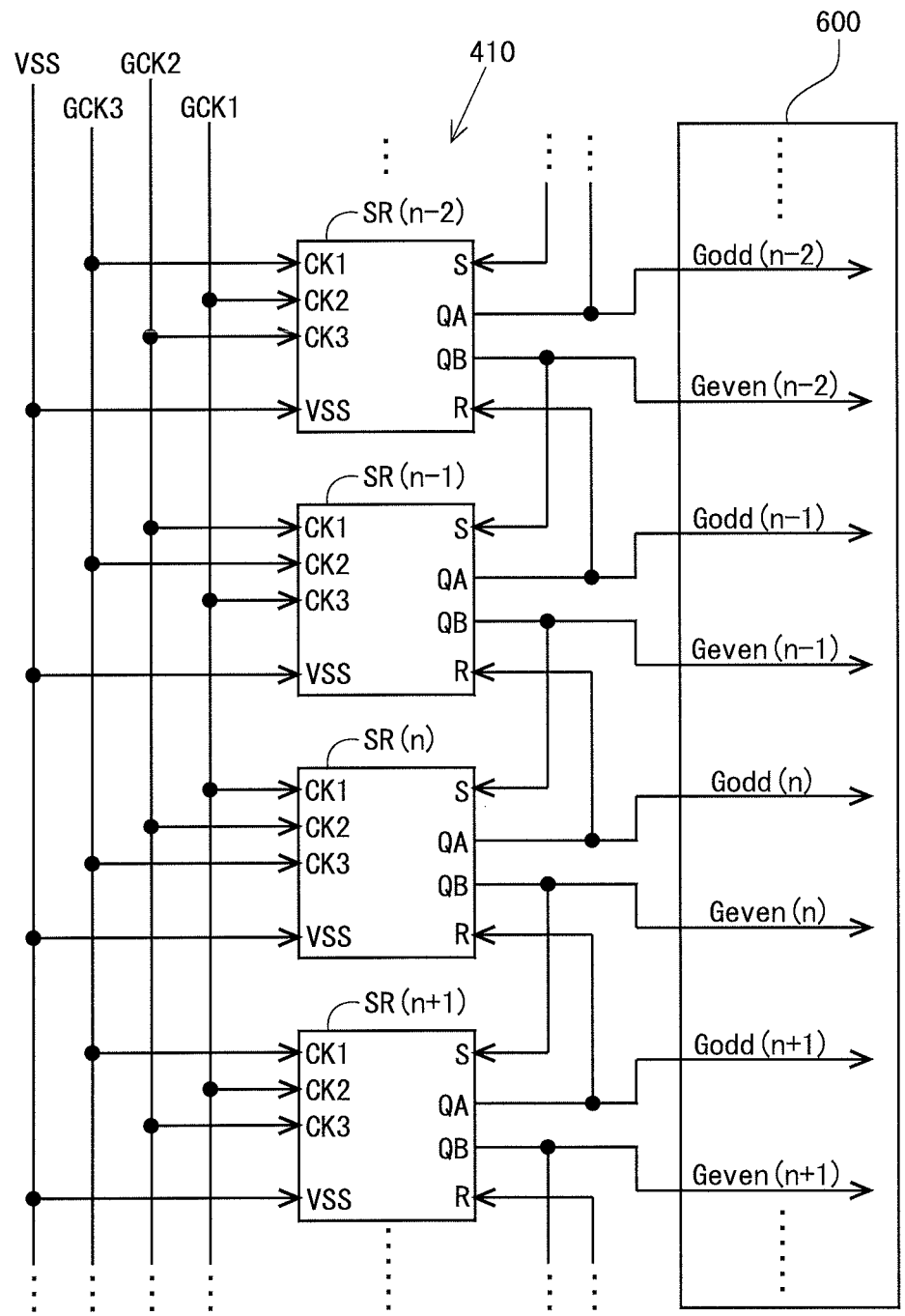
FIG. 4 is a block diagram showing a configuration of the shift register within the gate driver according to the first embodiment.
Figure 5:
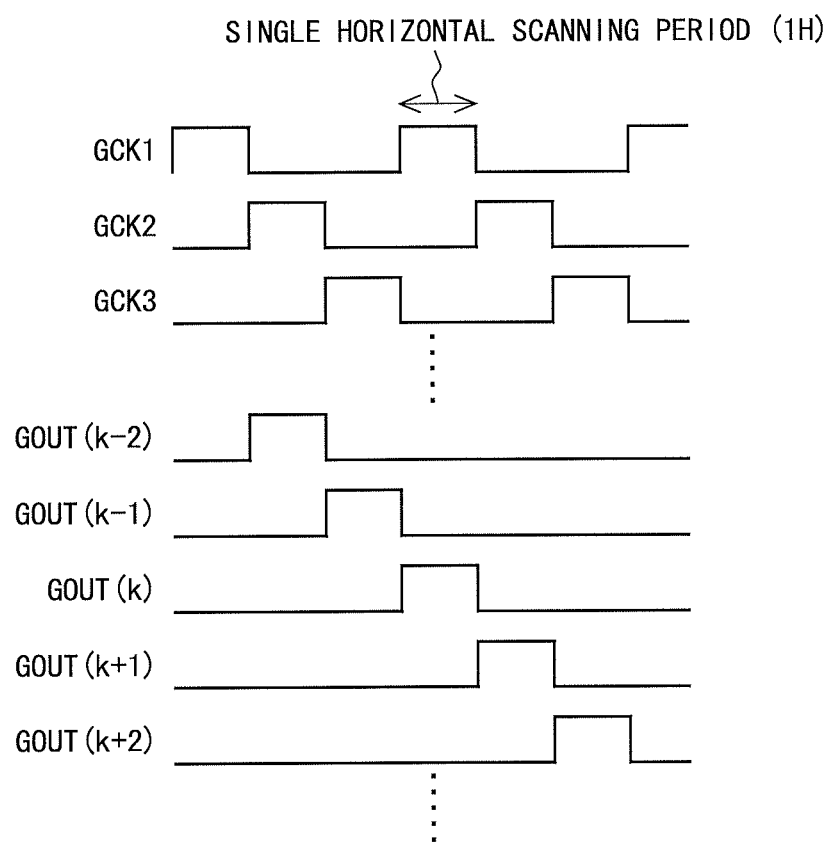
FIG. 5 is a signal waveform diagram for illustration of an operation of the gate driver according to the first embodiment.

FIG. 4 is a block diagram showing a configuration of the shift register 410 within the gate driver 400. As described above, the shift register 410 is configured by the z stage constituent circuits SR(1)-SR(z). Here, FIG. 4 shows the stage constituent circuits of a (n−2)th stage to a (n+1)th stage. Each stage constituent circuit includes an input terminal for receiving a clock signal CK1 (hereinafter referred to as a "first clock"), an input terminal for receiving a clock signal CK2 (hereinafter referred to as a "second clock"), an input terminal for receiving a clock signal CK3 (hereinafter referred to as a "third clock"), an input terminal for receiving a low-level DC power supply potential VSS (a magnitude of this potential is also referred to as a "VSS potential"), an input terminal for receiving a set signal S, an input terminal for receiving a reset signal R, an output terminal for outputting a first state signal QA, and an output terminal for outputting a second state signal QB. Here, the input terminal for receiving the clock signal CK3 is not necessarily required.

The shift register 410 is supplied with, as the gate clock signal GCK, the first gate clock signal GCK1, the second gate clock signal GCK2, and the third gate clock signal GCK3 that are three-phase clock signals. As illustrated in FIG. 5, the first gate clock signal GCK1, the second gate clock signal GCK2, and the third gate clock signal GCK3 are driven to the high level (H level) only for a single horizontal scanning period in three horizontal scanning periods. Specifically, on-duty of the first to the third gate clock signals GCK1-GCK3 is substantially one thirds. Further, a phase of the second gate clock signal GCK2 is delayed from a phase of the first gate clock signal GCK1 by 120 degrees (by a period substantially corresponding to a single horizontal scanning period), and a phase of the third gate clock signal GCK3 is delayed from a phase of the second gate clock signal GCK2 by another 120 degrees.

Signals supplied to the input terminals of each stage (each stage constituent circuit) of the shift register 410 are as described below (see FIG. 4). The (n−2)th stage is supplied with the third gate clock signal GCK3 as the first clock CK1, the first gate clock signal GCK1 as the second clock CK2, and the second gate clock signal GCK2 as the third clock CK3. The (n−1)th stage is supplied with the second gate clock signal GCK2 as the first clock CK1, the third gate clock signal GCK3 as the second clock CK2, and the first gate clock signal GCK1 as the third clock CK3. The n-th stage is supplied with the first gate clock signal GCK1 as the first clock CK1, the second gate clock signal GCK2 as the second clock CK2, and the third gate clock signal GCK3 as the third clock CK3. Through all the stages of the shift register 410, three stages having the same configurations as those of the (n−2)th stage to the n-th stage are repeatedly provided. Further, an any stage is supplied with the second state signal QB outputted from a previous stage as the set signal S, and the first state signal QA outputted from a next stage as the reset signal R. However, the first stage is supplied with the gate start pulse signal GSP as the set signal S, and the z-th stage (final stage) is supplied with the gate end pulse signal GEP as the reset signal R. Here, the low-level DC power supply potential VSS is supplied to all of the stage constituent circuits in common.

In the configuration described above, when the gate start pulse signal GSP is supplied as the set signal S to the first stage SR(1) of the shift register 410, a pulse included in the gate start pulse signal GSP (this pulse is included in the second state signal QB outputted from each stage) is transferred sequentially from the first stage SR(1) to the z-th stage SR(z) based on the first to the third gate clock signals GCK1-GCK3. Specifically, this pulse functions as a shift pulse of the shift register 410. Corresponding to the transferring of the pulse, the first state signal QA outputted from the first stage SR(1), the second state signal QB outputted from the first stage SR(1), the first state signal QA outputted from the second stage SR(2), the second state signal QB outputted from the second stage SR(2), . . . , the first state signal QA outputted from the z-th stage SR(z), and the second state signal QB outputted from the z-th stage SR(z) are sequentially driven to the high level. These first state signals QA and the second state signals QB are respectively supplied to the gate bus lines GL1-GLi as the scanning signals GOUT(1)-GOUT(i). In this manner, as illustrated in FIG. 5, the scanning signals that are sequentially driven to the high level (active) for a single horizontal scanning period are supplied to the gate bus lines within the display unit 600. It should be noted that in this embodiment, the first state signal QA becomes a scanning signal for driving an odd-numbered gate bus line, and the second state signal QB becomes a scanning signal for driving an even-numbered gate bus line.

1.3 Stage Constituent Circuit

1.3.1 Outline of Stage Constituent Circuit

Figure 1:
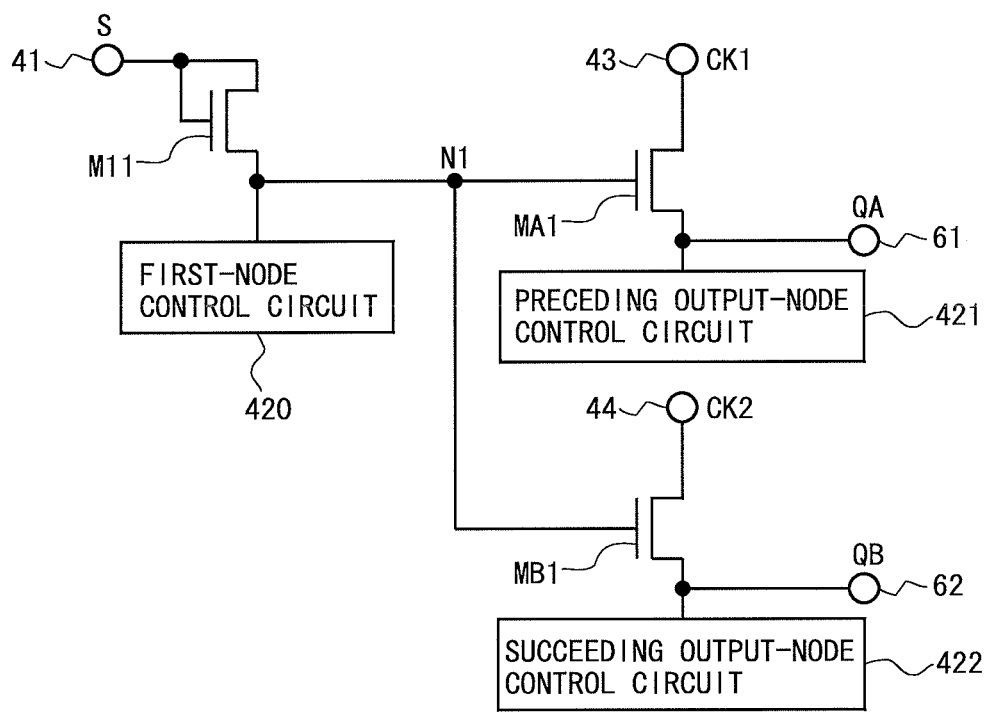
FIG. 1 is a configurational diagram schematically showing a main section of a stage constituent circuit included in a shift register within a gate driver of a liquid crystal display device according to a first embodiment of the present invention.

FIG. 1 is a configurational diagram schematically showing a main section of a stage constituent circuit according to this embodiment. As illustrated in FIG. 1, this stage constituent circuit includes, as main components, three the thin-film transistors MA1, MB1, and M11, an input terminal 41 for receiving the set signal S, an output terminal 61 for outputting the first state signal QA, an output terminal 62 for outputting the second state signal QB, an input terminal 43 for receiving the first clock CK1, an input terminal 44 for receiving the second clock CK2, a first-node control circuit (first-node controller) 420 for controlling a potential of a first-node N1 connected to a gate terminal of the thin-film transistor MA1 and a gate terminal of the thin-film transistor MB1 and a source terminal of the thin-film transistor M11, a preceding output-node control circuit 421 for controlling a potential of the output terminal 61, and a succeeding output-node control circuit 422 for controlling a potential of the output terminal 62.

In such a configuration, the potential of the first-node N1 increases based on the set signal S (the second state signal QB outputted from a previous-stage stage constituent circuit). Specifically, during a period in which both the first clock CK1 and the second clock CK2 are maintained at a low level, the potential of the first-node N1 changes from the low level to the high level. With this, the thin-film transistors MA1 and MB1 are turned to an ON state. Thereafter, first, the first state signal QA at the high level is outputted from this stage constituent circuit by the first clock CK1 being driven to the high level. Then, the second state signal QB at the high level is outputted from this stage constituent circuit by the second clock CK2 being driven to the high level. In this manner, an odd-numbered gate bus line and an even-numbered gate bus line connected to this stage constituent circuit are supplied with the scanning signals that are sequentially driven to the high level for a single horizontal scanning period.

1.3.2 Detailed Configuration of Stage Constituent Circuit

Figure 6:
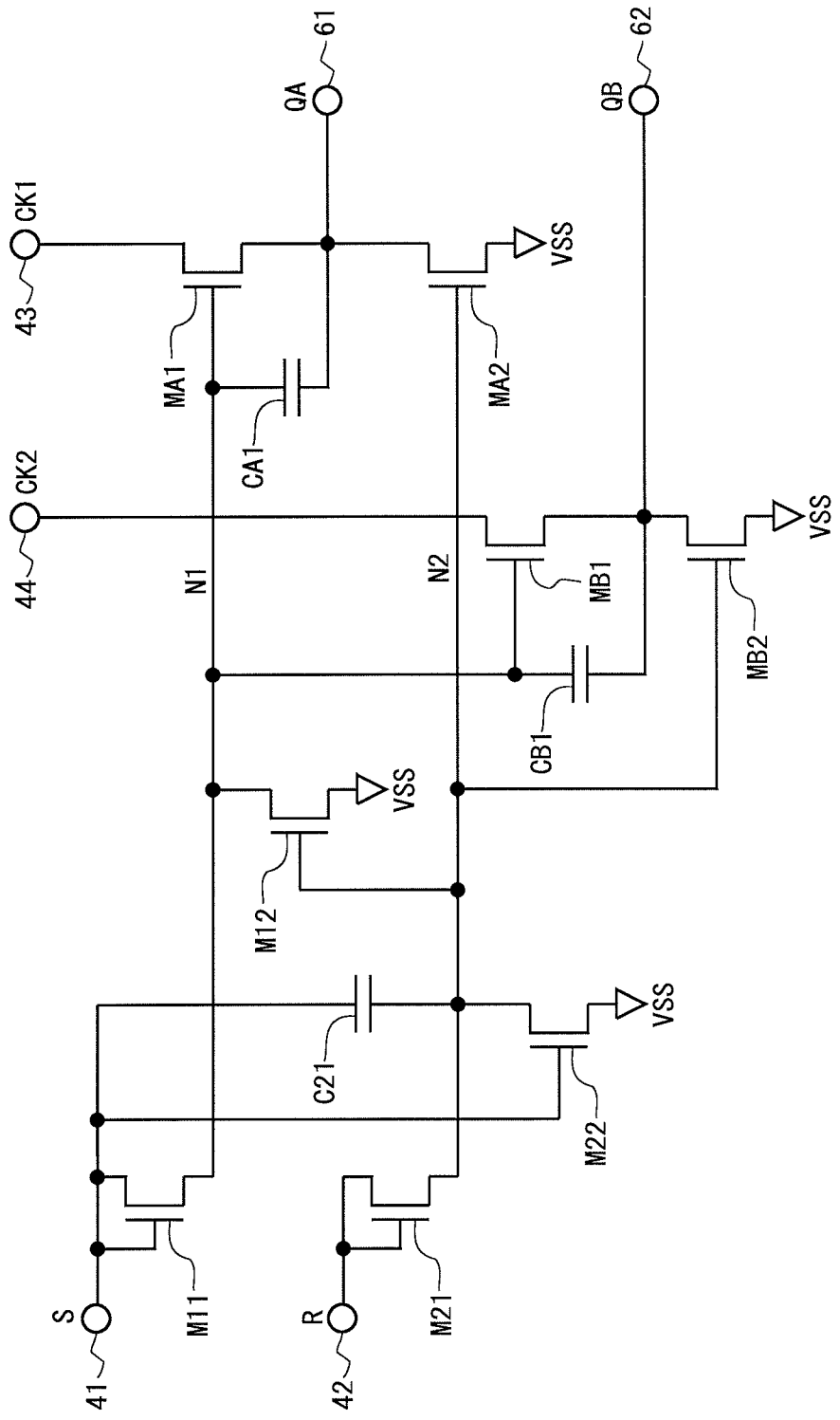
FIG. 6 is a circuit diagram showing a detailed configuration of the stage constituent circuit according to the first embodiment.

FIG. 6 is a circuit diagram showing a detailed configuration of a stage constituent circuit (a configuration of a single stage in the shift register 410) according to this embodiment. As illustrated in FIG. 6, this stage constituent circuit is provided with eight thin-film transistors M11, M21, M12, M22, MA1, MA2, MB1, and MB2 and three capacitors C21, CA1, and CB1. Additionally, this stage constituent circuit includes the four input terminals 41-44 and the two output terminals 61 and 62, in addition to the input terminal for the low-level DC power supply potential VSS. The input terminal for receiving the set signal S is indicated by the reference numeral 41, the input terminal for receiving the reset signal R is indicated by the reference numeral 42, the input terminal for receiving the first clock CK1 is indicated by the reference numeral 43, and the input terminal for receiving the second clock CK2 is indicated by the reference numeral 44. The output terminal for outputting the first state signal QA is indicated by the reference numeral 61, and the output terminal for outputting the second state signal QB is indicated by the reference numeral 62.

Next, a connecting relation among components within the stage constituent circuit is described. A source terminal of the thin-film transistor M11, a drain terminal of the thin-film transistor M12, a gate terminal of the thin-film transistor MA1, a gate terminal of the thin-film transistor MB1, one end of the capacitor CA1, and one end of the capacitor CB1 are connected to each other via the first-node N1. A source terminal of the thin-film transistor M21, a drain terminal of the thin-film transistor M22, a gate terminal of the thin-film transistor M12, a gate terminal of the thin-film transistor MA2, a gate terminal of the thin-film transistor MB2, and one end of the capacitor C21 are connected to each other via a second-node N2.

For the thin-film transistor M11, a gate terminal and a drain terminal are connected to the input terminal 41 (that is, diode-connected), and the source terminal is connected to the first-node N1. For the thin-film transistor M21, a gate terminal and a drain terminal are connected to the input terminal 42 (that is, diode-connected), and the source terminal is connected to the second-node N2. For the thin-film transistor M12, the gate terminal is connected to the second-node N2, the drain terminal is connected to the first-node N1, and a source terminal is connected to the input terminal for the DC power supply potential VSS. For the thin-film transistor M22, a gate terminal is connected to the input terminal 41, the drain terminal is connected to the second-node N2, and a source terminal is connected to the input terminal for the DC power supply potential VSS. For the thin-film transistor MA1, the gate terminal is connected to the first-node N1, a drain terminal is connected to the input terminal 43, and a source terminal is connected to the output terminal 61. For the thin-film transistor MA2, the gate terminal is connected to the second-node N2, a drain terminal is connected to the output terminal 61, and a source terminal is connected to the input terminal for the DC power supply potential VSS. For the thin-film transistor MB1, the gate terminal is connected to the first-node N1, a drain terminal is connected to the input terminal 44, and a source terminal is connected to the output terminal 62. For the thin-film transistor MB2, the gate terminal is connected to the second-node N2, a drain terminal is connected to the output terminal 62, and a source terminal is connected to the input terminal for the DC power supply potential VDD. For the capacitor C21, the one end is connected to the second-node N2, and the other end is connected to the input terminal 41. For the capacitor CA1, the one end is connected to the first-node N1, and the other end is connected to the output terminal 61. For the capacitor CB1, the one end is connected to the first-node N1, and the other end is connected to the output terminal 62.

Next, functions of the components in the stage constituent circuit are described. The thin-film transistor M11 changes the potential of the first-node N1 to the high level when the set signal S is at the high level. The thin-film transistor M21 changes a potential of the second-node N2 to the high level when the reset signal R is at the high level. The thin-film transistor M12 changes the potential of the first-node N1 to the VSS potential when the potential of the second-node N2 is at the high level. The thin-film transistor M22 changes the potential of the second-node N2 to the VSS potential when the set signal S is at the high level. The thin-film transistor MA1 supplies a potential of the first clock CK1 to the output terminal 61 when the potential of the first-node N1 is at the high level. The thin-film transistor MA2 changes a potential of the output terminal 61 to the VSS potential when the potential of the second-node N2 is at the high level. The thin-film transistor MB1 supplies a potential of the second clock CK2 to the output terminal 62 when the potential of the first-node N1 is at the high level. The thin-film transistor MB2 changes a potential of the output terminal 62 to the VSS potential when the potential of the second-node N2 is at the high level. The capacitor C21 functions so as to stabilize a circuit operation by decreasing the potential of the second-node N2 when a gate bus line connected to this stage constituent circuit is in a selected state. The capacitor CA1 functions as a compensation capacitance for maintaining the potential of the first-node N1 at the high level during a period in which a gate bus line connected to the output terminal 61 is in the selected state. The capacitor CB1 functions as a compensation capacitance for maintaining the potential of the first-node N1 at the high level during a period in which a gate bus line connected to the output terminal 62 is in the selected state.

It should be noted that in this embodiment, the thin-film transistors MA1 and MB1 realize output control switching elements, the output terminals 61 and 62 realize output nodes, and the first clock CK1 and the second clock CK2 realize output control clock signals.

1.3.3 Operation of Stage Constituent Circuit

Figure 7:
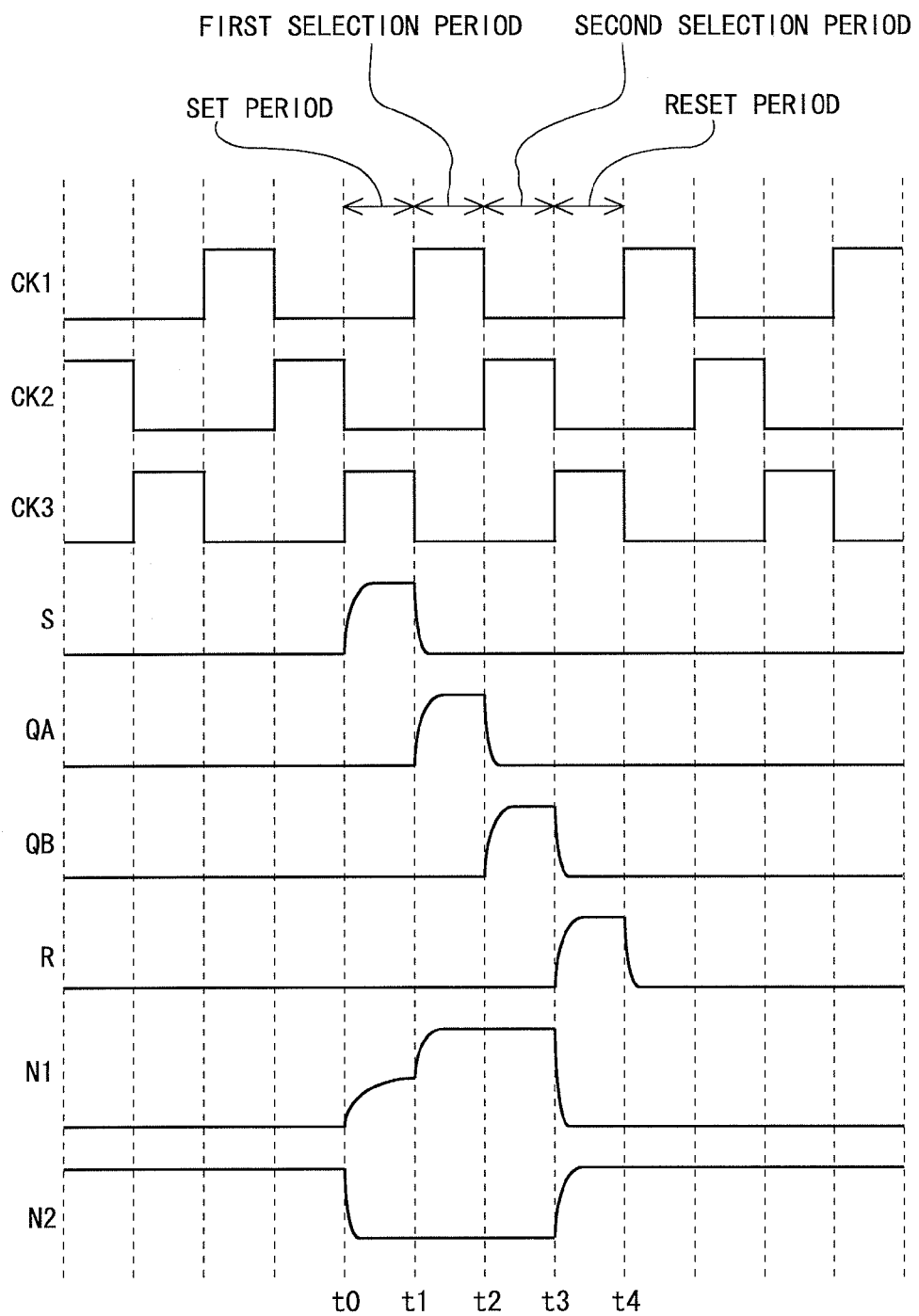
FIG. 7 is a signal waveform diagram for illustration of an operation of the stage constituent circuit according to the first embodiment.

Next, an operation of the stage constituent circuit according to this embodiment will be described with reference to FIG. 6 and FIG. 7. In FIG. 7, a period from time t1 to time t2 corresponds to the first selection period, and a period from time t2 to time t3 corresponds to the second selection period. It should be noted that in the following description, a single horizontal scanning period immediately before the first selection period is referred to as a "set period", and a single horizontal scanning period immediately after the second selection period is referred to as a "reset period". A period other than the first selection period, the second selection period, the set period, and the reset period is referred to as a "normal operation period".

In the normal operation period (periods before time t0 and after time t4), the potential of the second-node N2 is maintained at the high level. Accordingly, the thin-film transistors M12, MA2, and MB2 are in the ON state. As there is a parasitic capacitance between the gate and the drain of the thin-film transistor MA1, a noise is generated at the first-node N1 due to fluctuation of a waveform of the first clock CK1 (see FIG. 7). However, as the thin-film transistor M12 is in the ON state, the potential of the first-node N1 is pulled to the low level. Likewise, as there is a parasitic capacitance between the gate and the drain of the thin-film transistor MB1, a noise is generated at the first-node N1 due to fluctuation of a waveform of the second clock CK2 (see FIG. 7). However, as the thin-film transistor M12 is in the ON state, the potential of the first-node N1 is pulled to the low level. Further, a noise also occurs in the first state signal QA (the output terminal 61) due to the noise generated at the first-node N1 or fluctuation of a video signal voltage. However, as the thin-film transistor MA2 is in the ON state, a potential of the first state signal QA is pulled to the low level. In addition, a noise also occurs in the second state signal QB (the output terminal 62) due to the noise generated at the first-node N1 or fluctuation of a video signal voltage. However, as the thin-film transistor MB2 is in the ON state, a potential of the second state signal QB is pulled to the low level. Thus, the potential of the first-node N1, the potential of the first state signal QA, and the potential of the second state signal QB are maintained at the low level during this period.

In the set period (at time t0), the set signal S changes from the low level to the high level. As the thin-film transistor M11 is diode-connected as illustrated in FIG. 6, the thin-film transistor M11 is turned to the ON state by the set signal S being driven to the high level, and the capacitors CA1 and CB1 are charged (precharged, in this case). With this, the potential of the first-node N1 changes from the low level to the high level, and the thin-film transistors MA1 and MB1 are turned to the ON state. However, in the set period, as the first clock CK1 and the second clock CK2 are at the low level, the potential of the first state signal QA and the potential of the second state signal QB are maintained at the low level. Further, the thin-film transistor M22 is turned to the ON state by the set signal S being driven to the high level, and the potential of the second-node N2 is turned to the low level. With this, the thin-film transistors M12, MA2, and MB2 are turned to an OFF state. Thus, during the set period, the capacitor C21 is charged based on a potential difference between the input terminal 41 and the second-node N2, as the set signal S is driven to the high level and the potential of the second-node N2 is turned to the low level.

In the first selection period (at time t1), the set signal S changes from the high level to the low level. At this time, as the potential of the second-node N2 is at the low level, the thin-film transistor M12 is in the OFF state. Thus, the first-node N1 is turned to a floating state. Here, at time t1, the first clock CK1 changes from the low level to the high level. As there is a parasitic capacitance between the gate and the drain of the thin-film transistor MA1 as described above, the potential of the first-node N1 increases as a potential of the input terminal 43 increases (the first-node N1 is bootstrapped). As a result, the thin-film transistor MA1 is fully turned to the ON state, and the potential of the first state signal QA increases up to a level sufficient for turning the gate bus line connected to the output terminal 61 of this stage constituent circuit to the selected state. It should be noted that, during this period, while the thin-film transistor MB1 is also fully turned to the ON state, the potential of the second state signal QB is maintained at the low level as the second clock CK2 is maintained at the low level. In the meantime, as there is a parasitic capacitance also between the gate and the drain of the thin-film transistor M12, the potential of the second-node N2 is going to increase as the potential of the first-node N1 increases. However, because of the fact that the capacitor C21 is charged based on the potential difference between the input terminal 41 and the second-node N2 during the set period, and that the set signal S changes form the high level to the low level during this period, the potential of the second-node N2 is maintained at the low level.

In the second selection period (at time t2), the first clock CK1 changes from the high level to the low level. The thin-film transistor MA1 is in the ON state at time t2, and therefore the potential of the first state signal QA decreases as the potential of the input terminal 43 decreases. By the potential of the first state signal QA decreasing in this manner, the potential of the first-node N1 is also going to decrease via the capacitor CA1. However, by the second clock CK2 changing from the low level to the high level at time t2, the potential of the first-node N1 is going to increase as a potential of the input terminal 44 increases (the first-node N1 is bootstrapped) due to the presence of the parasitic capacitance between the gate and the drain of the thin-film transistor MB1. Thus, during this period, the potential of the first-node N1 is maintained at the high level. Because of the fact that the thin-film transistor MB1 has already been fully turned to the ON state as described above, and that the second clock CK2 has changed to the high level, the potential of the second state signal QB increases up to a level sufficient for turning the gate bus line connected to the output terminal 62 of this stage constituent circuit to the selected state.

In the reset period (at time t3), the second clock CK2 changes from the high level to the low level. The thin-film transistor MB1 is in the ON state at time t3, and therefore the potential of the second state signal QB decreases as the potential of the input terminal 44 decreases. By the potential of the second state signal QB decreasing in this manner, the potential of the first-node N1 also decreases via the capacitor CB1. Further, the reset signal R changes from the low level to the high level during this period. Accordingly, the thin-film transistor M21 is turned to the ON state, and the potential of the second-node N2 is turned to the high level. With this, the thin-film transistors M12, MB2, and MA2 are turned to the ON state. As a result, in the reset period, the potential of the first-node N1 and the potential of the second state signal QB decrease down to the low level, and the potential of the first state signal QA reliably decreases down to the low level regardless of the presence of noises and such.

1.4 Effects

Figure 39:
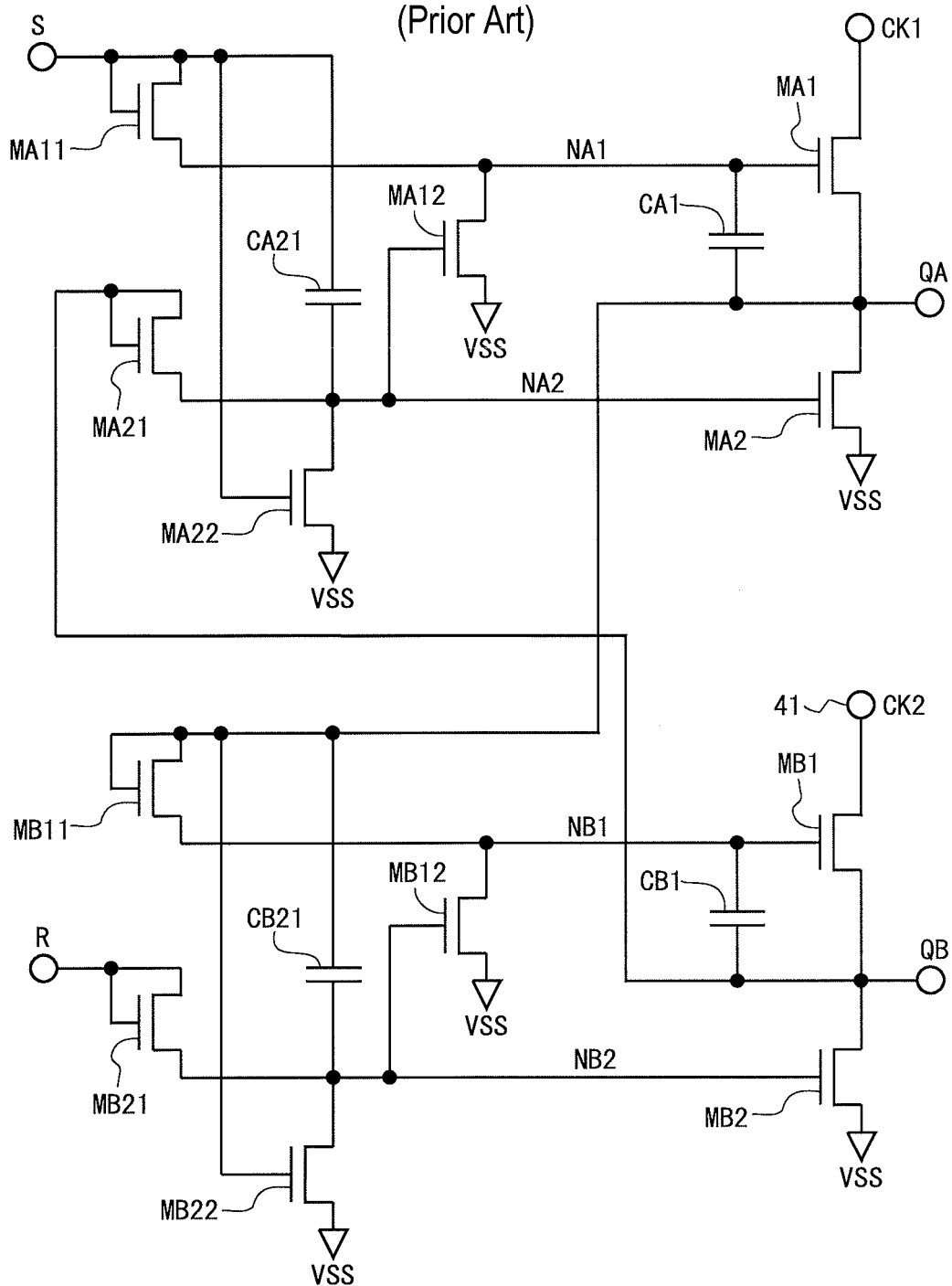
FIG. 39 is a circuit diagram showing a configuration of two stages in the shift register of the conventional display device, the two stages corresponding to a stage constituent circuit according to the first embodiment.

According to this embodiment, each stage of the shift register 410 is provided with the two output terminals 61 and 62 for outputting scanning signals. The clock signals CK1 and CK2 that are different from each other are supplied to the drain terminals of the two thin-film transistors MA1 and MB1 as the output control switching element whose source terminals are respectively connected to the two output terminals 61 and 62. Accordingly, the scanning signal that is driven to the ON level relatively earlier and the scanning signal that is driven to the ON level relatively later are outputted from each stage of the shift register 410. Specifically, each stage of the shift register 410 drives two gate bus lines. FIG. 39 is a circuit diagram showing a configuration of two stages in the shift register according to the conventional example, and corresponds to a circuit diagram (see FIG. 6) showing a configuration of a single stage of the shift register (stage constituent circuit) according to this embodiment. As can be seen from FIG. 6 and FIG. 39, the number of the thin-film transistors is reduced down to eight from twelve, and the number of the capacitors is reduced down to three from four. In this embodiment, even though the number of the circuit elements is reduced in this manner as compared to the conventional example, the gate bus lines as a whole are driven as in the conventional example because each stage of the shift register 410 drives the two gate bus lines.

As described above, according to this embodiment, it is possible to realize a monolithic gate driver capable of operating with a relatively small number of circuit elements. Accordingly, a yield ratio is improved as compared to the conventional example. Further, as an area of circuits for the gate driver is reduced, it is possible to downsize the liquid crystal display device.

1.5 Modified Examples

Next, modified examples of the first embodiment will be described.

1.5.1 First Modified Example

Figure 8:
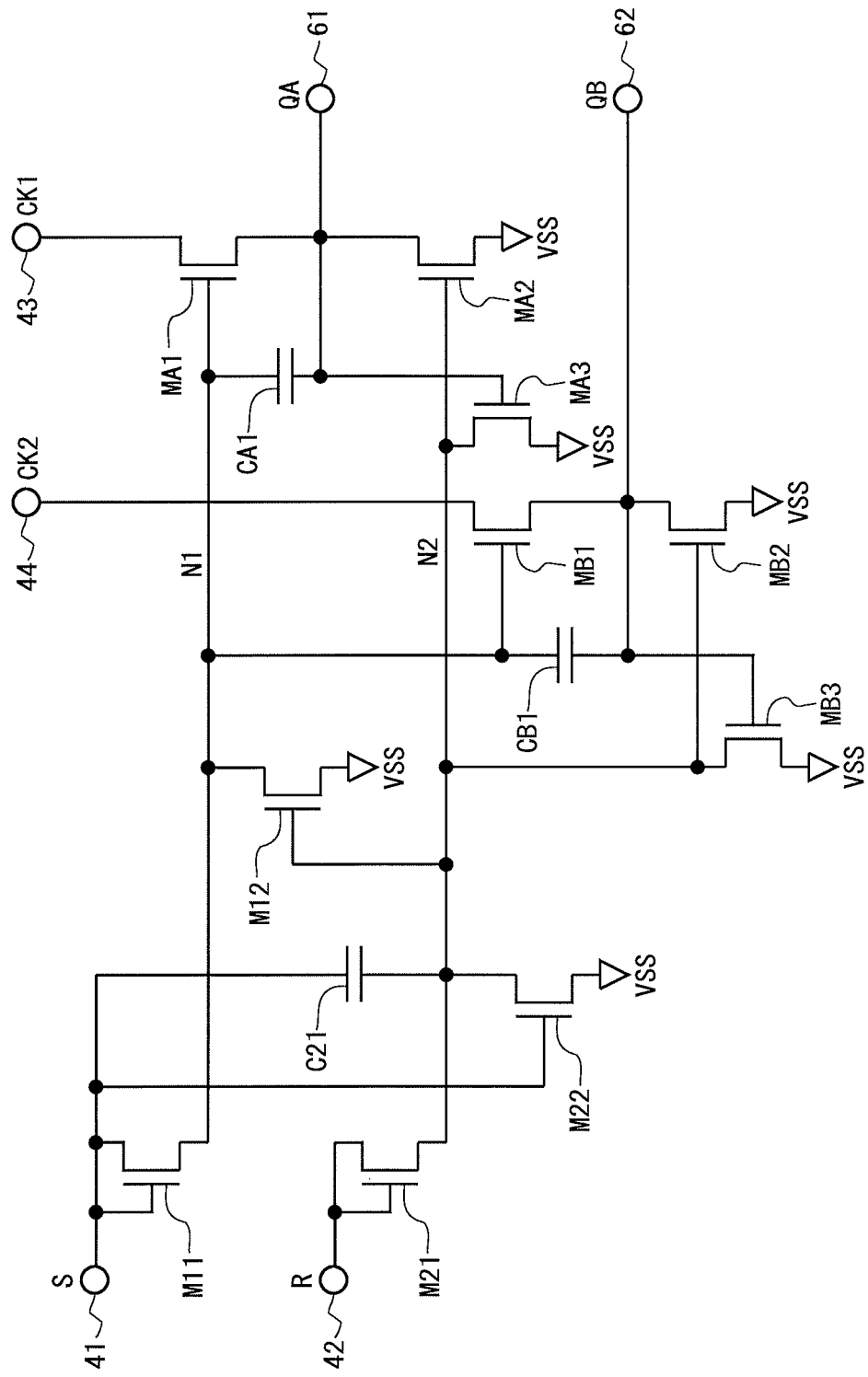
FIG. 8 is a circuit diagram showing a detailed configuration of the stage constituent circuit according to a first modified example of the first embodiment.

FIG. 8 is a circuit diagram showing a detailed configuration of the stage constituent circuit according to a first modified example of the first embodiment. Here, an overall configuration and an operation of a liquid crystal display device and a configuration and an operation of a gate driver are the same as those in the first embodiment, and therefore descriptions for these are omitted.

In this modified example, the stage constituent circuit is provided with thin-film transistors MA3 and MB3, in addition to the components of the first embodiment illustrated in FIG. 6. For the thin-film transistor MA3, a gate terminal is connected to the output terminal 61, a drain terminal is connected to the second-node N2, and a source terminal is connected to the input terminal for the DC power supply potential VSS. For the thin-film transistor MB3, a gate terminal is connected to the output terminal 62, a drain terminal is connected to the second-node N2, and a source terminal is connected to the input terminal for the DC power supply potential VSS. The thin-film transistor MA3 changes the potential of the second-node N2 to the VSS potential when the potential of the first state signal QA is at the high level. The thin-film transistor MB3 changes the potential of the second-node N2 to the VSS potential when the potential of the second state signal QB is at the high level.

As described above, the gate terminal of the thin-film transistor MA3 is connected to the output terminal 61, and the gate terminal of the thin-film transistor MB3 is connected to the output terminal 62. Further, the potential of the first state signal QA (the potential of the output terminal 61) is turned to the high level during the first selection period, and the potential of the second state signal QB (the potential of the output terminal 62) is turned to the high level during the second selection period (see FIG. 7). Thus, the thin-film transistor MA3 is turned to the ON state during the first selection period, and the thin-film transistor MB3 is turned to the ON state during the second selection period. With this, throughout the first selection period and the second selection period, the potential of the second-node N2 is pulled to the low level. Therefore, according to this modified example, the potential of the second-node N2 is reliably maintained at the low level throughout the first selection period and the second selection period, and the stability of the circuit operation is improved.

1.5.2 Second Modified Example

Figure 9:
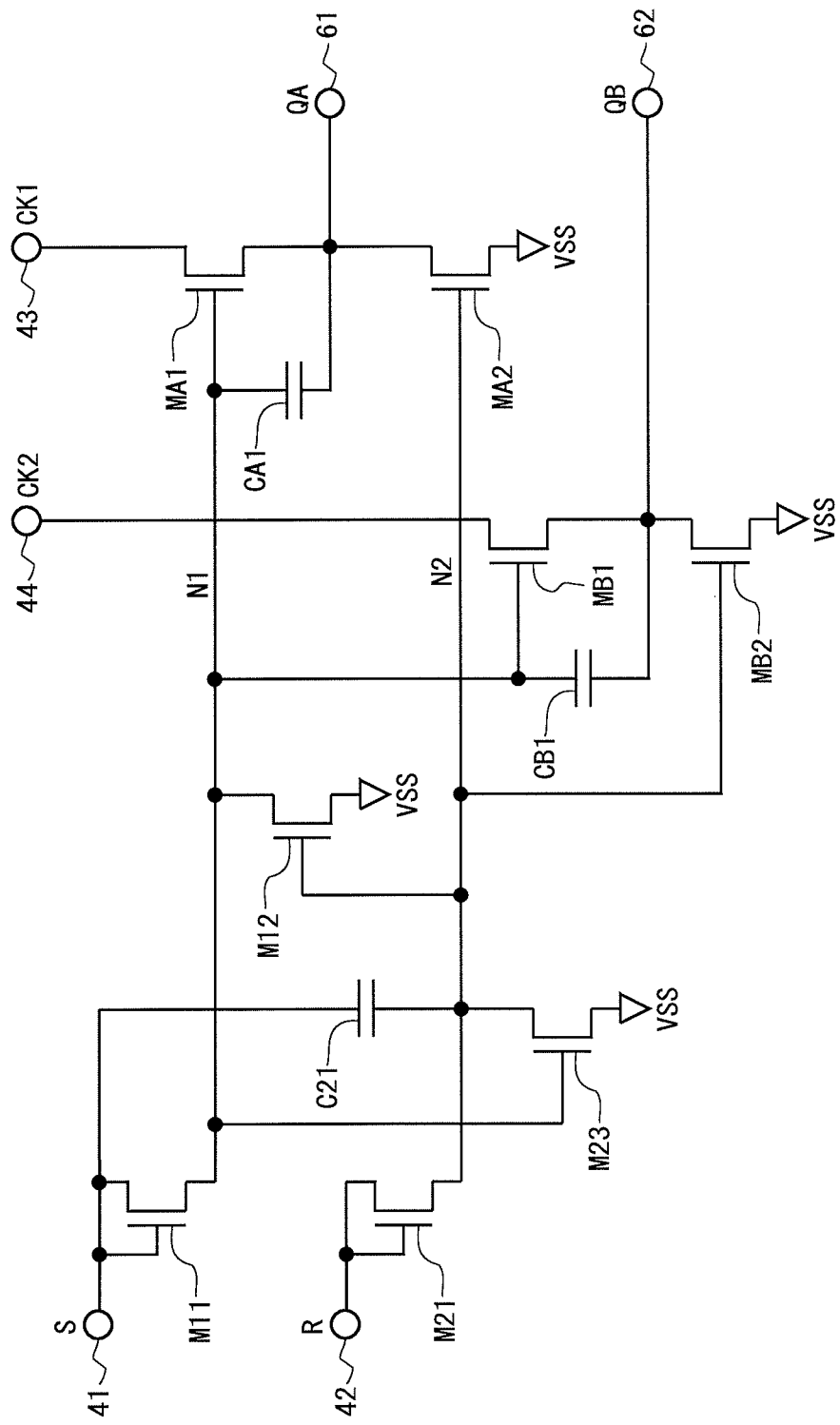
FIG. 9 is a circuit diagram showing a detailed configuration of the stage constituent circuit according to a second modified example of the first embodiment.

FIG. 9 is a circuit diagram showing a detailed configuration of the stage constituent circuit according to a second modified example of the first embodiment. Here, an overall configuration and an operation of a liquid crystal display device and a configuration and an operation of a gate driver are the same as those in the first embodiment, and therefore descriptions for these are omitted.

In this modified example, the stage constituent circuit is provided with a thin-film transistor M23 in place of the thin-film transistor M22 of the first embodiment illustrated in FIG. 6. For thin-film transistor M23, a gate terminal is connected to the first-node N1, a drain terminal is connected to the second-node N2, and a source terminal is connected to the input terminal for the DC power supply potential VSS. The thin-film transistor M23 changes the potential of the second-node N2 to the VSS potential when the potential of the first-node N1 is at the high level.

In this modified example, in the set period, the potential of the first-node N1 changes from the low level to the high level by the set signal S changing from the low level to the high level and the thin-film transistor M11 being turned to the ON state. Then, by the potential of the first-node N1 being turned to the high level, the thin-film transistor M23 is turned to the ON state and the potential of the second-node N2 is turned to the low level. An operation other than this part is the same as that of the first embodiment, and it is possible to obtain the same effects as those in the first embodiment.

1.5.3 Third Modified Example

Figure 10:
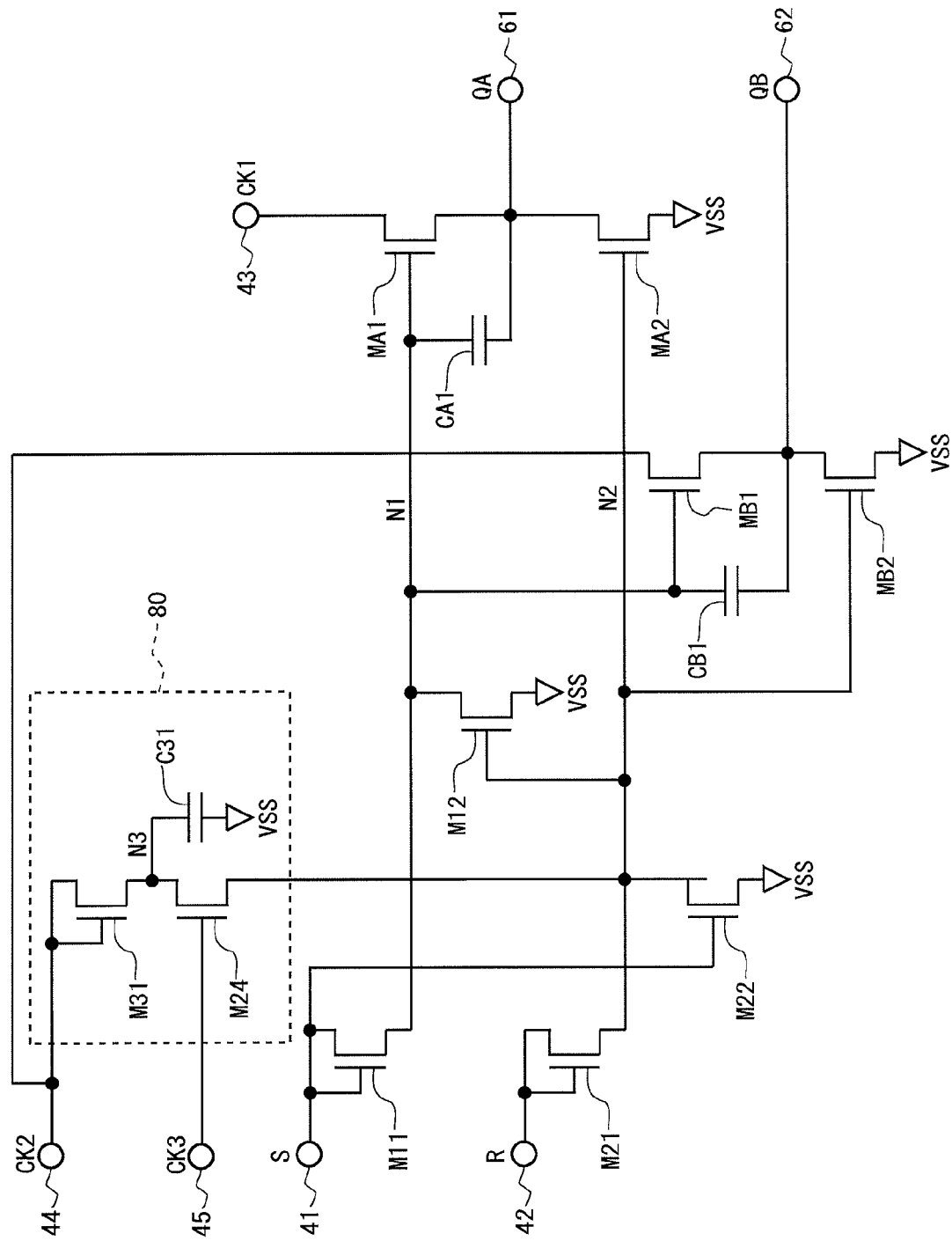
FIG. 10 is a circuit diagram showing a detailed configuration of the stage constituent circuit according to a third modified example of the first embodiment.

FIG. 10 is a circuit diagram showing a detailed configuration of the stage constituent circuit according to a third modified example of the first embodiment. Here, an overall configuration and an operation of a liquid crystal display device and a configuration and an operation of a gate driver are the same as those in the first embodiment, and therefore descriptions for these are omitted.

In this modified example, the stage constituent circuit is provided with a charge replenishment circuit 80 for supplying an electric charge to the second-node N2 every predetermined period in place of the capacitor C21 of the first embodiment illustrated in FIG. 6. The stage constituent circuit is also provided with an input terminal 45 for receiving the third clock CK3. The charge replenishment circuit 80 includes two thin-film transistors M24 and M31 and one capacitor C31. A drain terminal of the thin-film transistor M24, a source terminal of the thin-film transistor M31, and one end of the capacitor C31 are connected to each other via a third-node N3. For the thin-film transistor M24, a gate terminal is connected to the input terminal 45, the drain terminal is connected to the third-node N3, and a source terminal is connected to the second-node N2. For the thin-film transistor M31, a gate terminal and a drain terminal are connected to the input terminal 44 (that is, diode-connected), and the source terminal is connected to the third-node N3. For the capacitor C31, the one end is connected to the third-node N3, and the other end is connected to the input terminal for the DC power supply potential VSS. The thin-film transistor M31 changes a potential of the third-node N3 to the high level when the second clock CK2 is at the high level. The thin-film transistor M24 supplies an electric charge from the third-node N3 to the second-node N2 when the third clock CK3 is at the high level. The capacitor C31 accumulates an electric charge to be supplied to the second-node N2.

Figure 11:
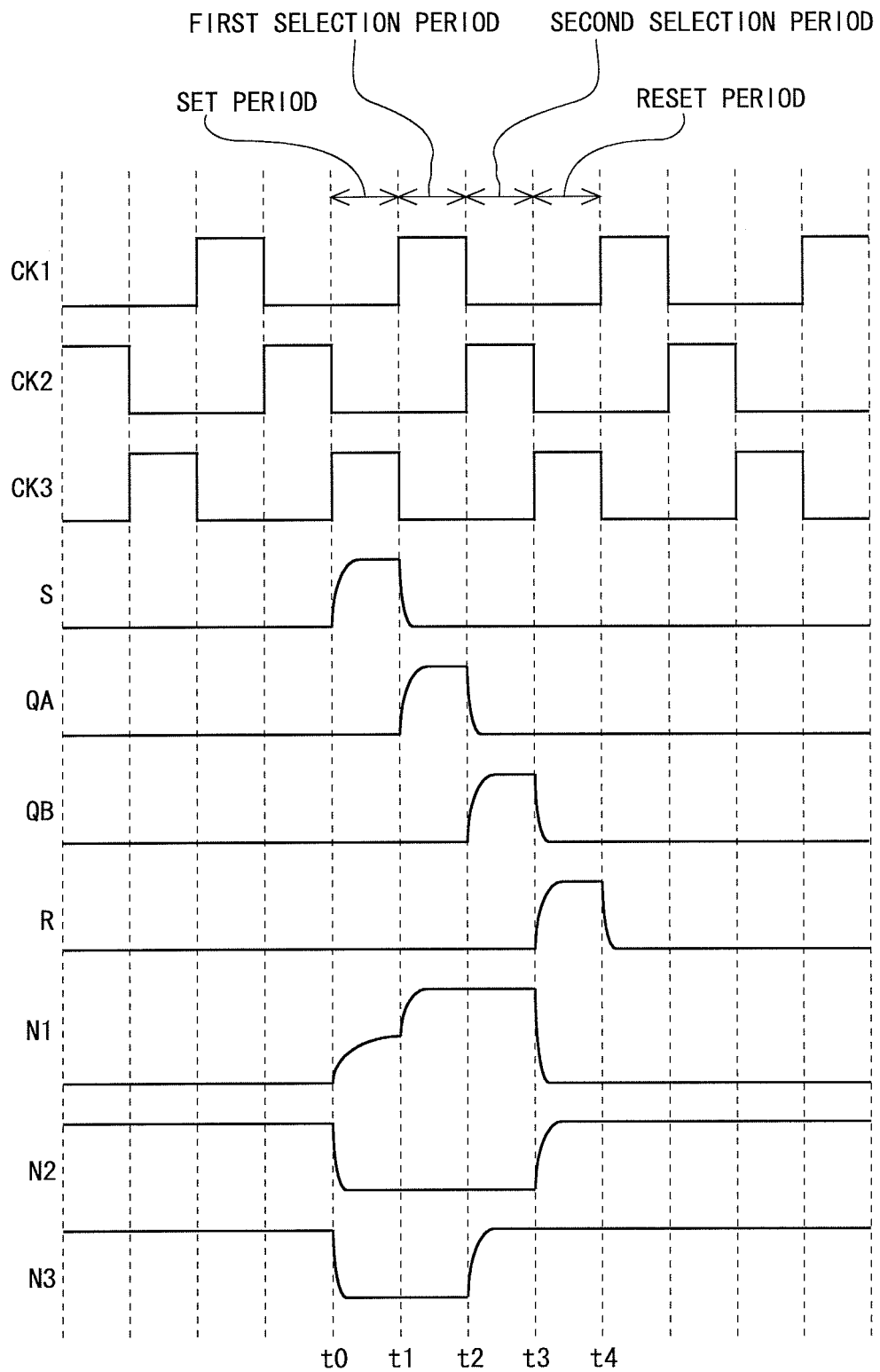
FIG. 11 is a signal waveform diagram for illustration of an operation of the stage constituent circuit according to the third modified example of the first embodiment.

Next, an operation of the stage constituent circuit according to this modified example will be described with reference to FIG. 10 and FIG. 11. In this modified example, the thin-film transistor M31 is in the ON state during a period in which the second clock CK2 is at the high level, and the thin-film transistor M24 is in the ON state during a period in which the third clock CK3 is at the high level. Accordingly, when the thin-film transistor M31 is turned to the ON state in one horizontal scanning period, the thin-film transistor M24 is turned to the ON state in the next horizontal scanning period. Here, when the thin-film transistor M31 is in the ON state, the thin-film transistor M24 is in the OFF state, and the capacitor C31 is charged. By contrast, when the thin-film transistor M24 is in the ON state, the thin-film transistor M31 is in the OFF state, and the electric charge accumulated in the capacitor C31 is supplied to the second-node N2. It should be noted that at time t0, as the third clock CK3 changes from the low level to the high level, the thin-film transistor M24 is turned to the ON state. At this time, as the thin-film transistor M22 is in the ON state, the capacitor C31 is fully discharged and the potential of the third-node N3 decreases down to the low level. Thereafter, the potential of the third-node N3 increases by the second clock CK2 changing from the low level to the high level at time t2. Thus, according to this modified example, during the normal operation period, even when a current leakage occurs in a thin-film transistor (e.g., the thin-film transistor M21) connected to the second-node N2, the potential of the second-node N2 is reliably maintained at the high level by the supply of an electric charge. With this, the stability of the circuit operation is improved.

In the meantime, when a drive frequency is made low in order to reduce power consumption, for example, the length of a single frame period is extended. According to the conventional configuration, the longer the length of a single frame period becomes, the more the potential of the second-node N2 decreases due to the current leakage in the thin-film transistor. By contrast, according to this modified example, as an electric charge is supplied to the second-node N2 every predetermined period, the potential of the second-node N2 can be maintained at the high level regardless of the length of a single frame period. As described above, according to this modified example, particularly when low-frequency driving is performed, it is possible to effectively suppress an occurrence of an abnormal operation due to the decrease of the potential of the second-node N2.

2. Second Embodiment 2.1 Configuration of Stage Constituent Circuit

Figure 12:
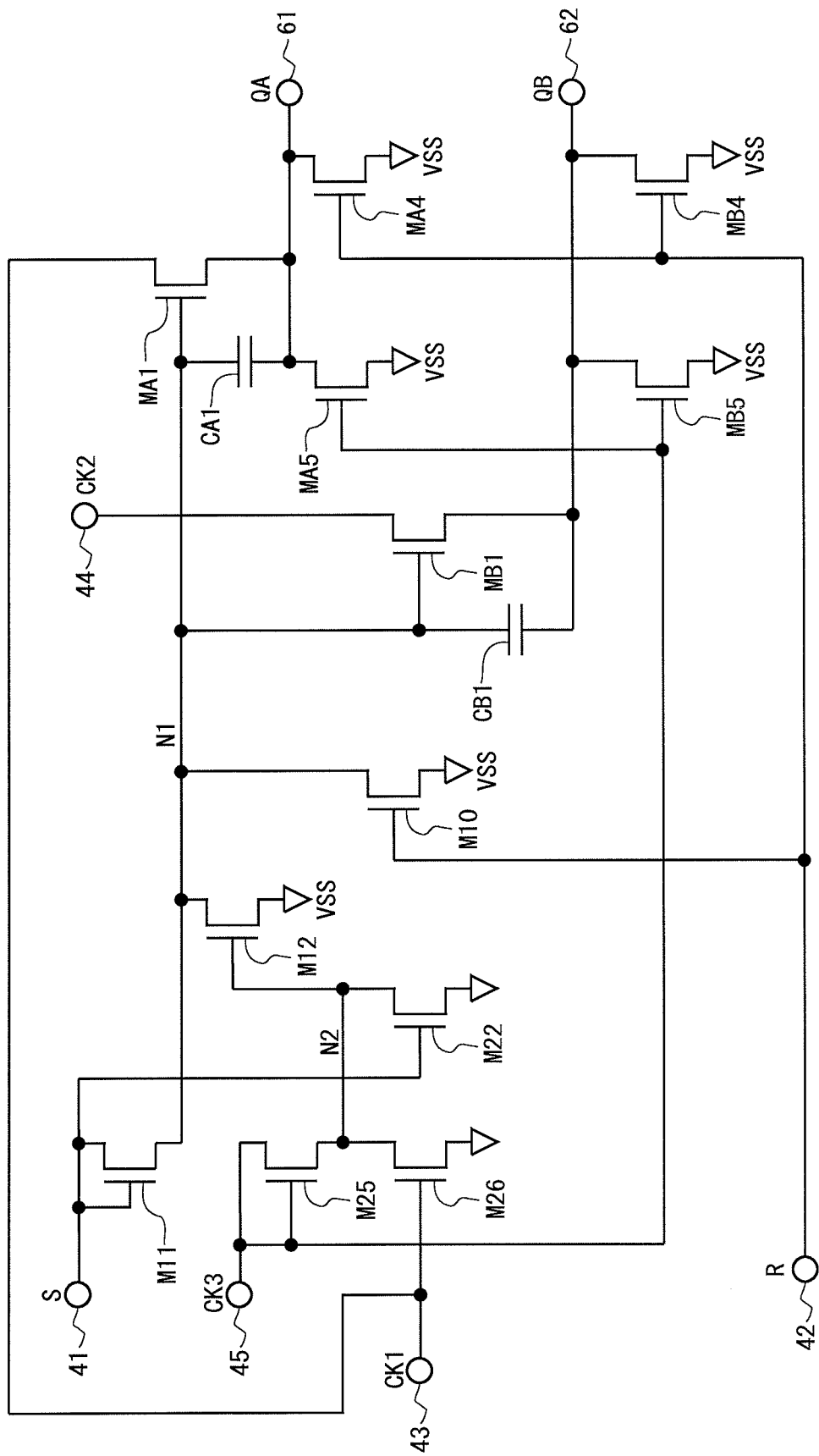
FIG. 12 is a circuit diagram showing a detailed configuration of a stage constituent circuit according to a second embodiment of the present invention.

FIG. 12 is a circuit diagram showing a detailed configuration of a stage constituent circuit according to a second embodiment of the present invention. Here, an overall configuration and an operation of a liquid crystal display device and a configuration and an operation of a gate driver are the same as those in the first embodiment, and therefore descriptions for these are omitted.

As illustrated in FIG. 12, this stage constituent circuit is provided with twelve thin-film transistors M10, M11, M12, M22, M25, M26, MA1, MA4, MA5, MB1, MB4, and MB5 and the two capacitors CA1 and CB1. Additionally, this stage constituent circuit includes the five input terminal 41-45 and the two output terminals 61 and 62, in addition to the input terminal for the low-level DC power supply potential VSS.

Next, a connecting relation among components within the stage constituent circuit is described. A drain terminal of the thin-film transistor M10, the source terminal of the thin-film transistor M11, the drain terminal of the thin-film transistor M12, the gate terminal of the thin-film transistor MA1, the gate terminal of the thin-film transistor MB1, the one end of the capacitor CA1, and the one end of the capacitor CB1 are connected to each other via the first-node N1. The gate terminal of the thin-film transistor M12, the drain terminal of the thin-film transistor M22, a source terminal of the thin-film transistor M25, and a drain terminal of the thin-film transistor M26 are connected to each other via the second-node N2.

For the thin-film transistor M10, the gate terminal is connected to the input terminal 42, the drain terminal is connected to the first-node N1, and the source terminal is connected to the input terminal for the DC power supply potential VSS. For the thin-film transistor M11, the gate terminal and the drain terminal are connected to the input terminal 41 (that is, diode-connected), and the source terminal is connected to the first-node N1. For the thin-film transistor M12, the gate terminal is connected to the second-node N2, the drain terminal is connected to the first-node N1, and the source terminal is connected to the input terminal for the DC power supply potential VSS. For the thin-film transistor M22, the gate terminal is connected to the input terminal 41, the drain terminal is connected to the second-node N2, and the source terminal is connected to the input terminal for the DC power supply potential VSS. For the thin-film transistor M25, a gate terminal and a drain terminal are connected to the input terminal 45 (that is, diode-connected), and the source terminal is connected to the second-node N2. For the thin-film transistor M26, a gate terminal is connected to the input terminal 43, the drain terminal is connected to the second-node N2, and a source terminal is connected to the input terminal for the DC power supply potential VSS. For the thin-film transistor MA1, the gate terminal is connected to the first-node N1, the drain terminal is connected to the input terminal 43, and the source terminal is connected to the output terminal 61. For the thin-film transistor MA4, a gate terminal is connected to the input terminal 42, a drain terminal is connected to the output terminal 61, and a source terminal is connected to the input terminal for the DC power supply potential VSS. For the thin-film transistor MA5, a gate terminal is connected to the input terminal 45, a drain terminal is connected to the output terminal 61, and a source terminal is connected to the input terminal for the DC power supply potential VSS. For the thin-film transistor MB1, the gate terminal is connected to the first-node N1, the drain terminal is connected to the input terminal 44, and the source terminal is connected to the output terminal 62. For the thin-film transistor MB4, a gate terminal is connected to the input terminal 42, a drain terminal is connected to the output terminal 62, and a source terminal is connected to the input terminal for the DC power supply potential VDD. For the thin-film transistor MB5, a gate terminal is connected to the input terminal 45, a drain terminal is connected to the output terminal 62, and a source terminal is connected to the input terminal for the DC power supply potential VDD. For the capacitor CA1, the one end is connected to the first-node N1, and the other end is connected to the output terminal 61. For the capacitor CB1, the one end is connected to the first-node N1, and the other end is connected to the output terminal 62.

Next, functions of the components in the stage constituent circuit are described. The thin-film transistor M10 changes the potential of the first-node N1 to the VSS potential when the reset signal R is at the high level. The thin-film transistor M11 changes the potential of the first-node N1 to the high level when the set signal S is at the high level. The thin-film transistor M12 changes the potential of the first-node N1 to the VSS potential when the potential of the second-node N2 is at the high level. The thin-film transistor M22 changes the potential of the second-node N2 to the VSS potential when the set signal S is at the high level. The thin-film transistor M25 changes the potential of the second-node N2 to the high level when the third clock CK3 is at the high level. The thin-film transistor M26 changes the potential of the second-node N2 to the VSS potential when the first clock CK1 is at the high level. The thin-film transistor MA1 supplies the potential of the first clock CK1 to the output terminal 61 when the potential of the first-node N1 is at the high level. The thin-film transistor MA4 changes the potential of the output terminal 61 to the VSS potential when the reset signal R is at the high level. The thin-film transistor MA5 changes the potential of the output terminal 61 to the VSS potential when the third clock CK3 is at the high level. The thin-film transistor MB1 supplies the potential of the second clock CK2 to the output terminal 62 when the potential of the first-node N1 is at the high level. The thin-film transistor MB4 changes the potential of the output terminal 62 to the VSS potential when the reset signal R is at the high level. The thin-film transistor MB5 changes the potential of the output terminal 62 to the VSS potential when the third clock CK3 is at the high level. The capacitor CA1 functions as the compensation capacitance for maintaining the potential of the first-node N1 at the high level during the period in which the gate bus line connected to the output terminal 61 is in the selected state. The capacitor CB1 functions as the compensation capacitance for maintaining the potential of the first-node N1 at the high level during the period in which the gate bus line connected to the output terminal 62 is in the selected state.

2.2 Operation of Stage Constituent Circuit

Figure 13:
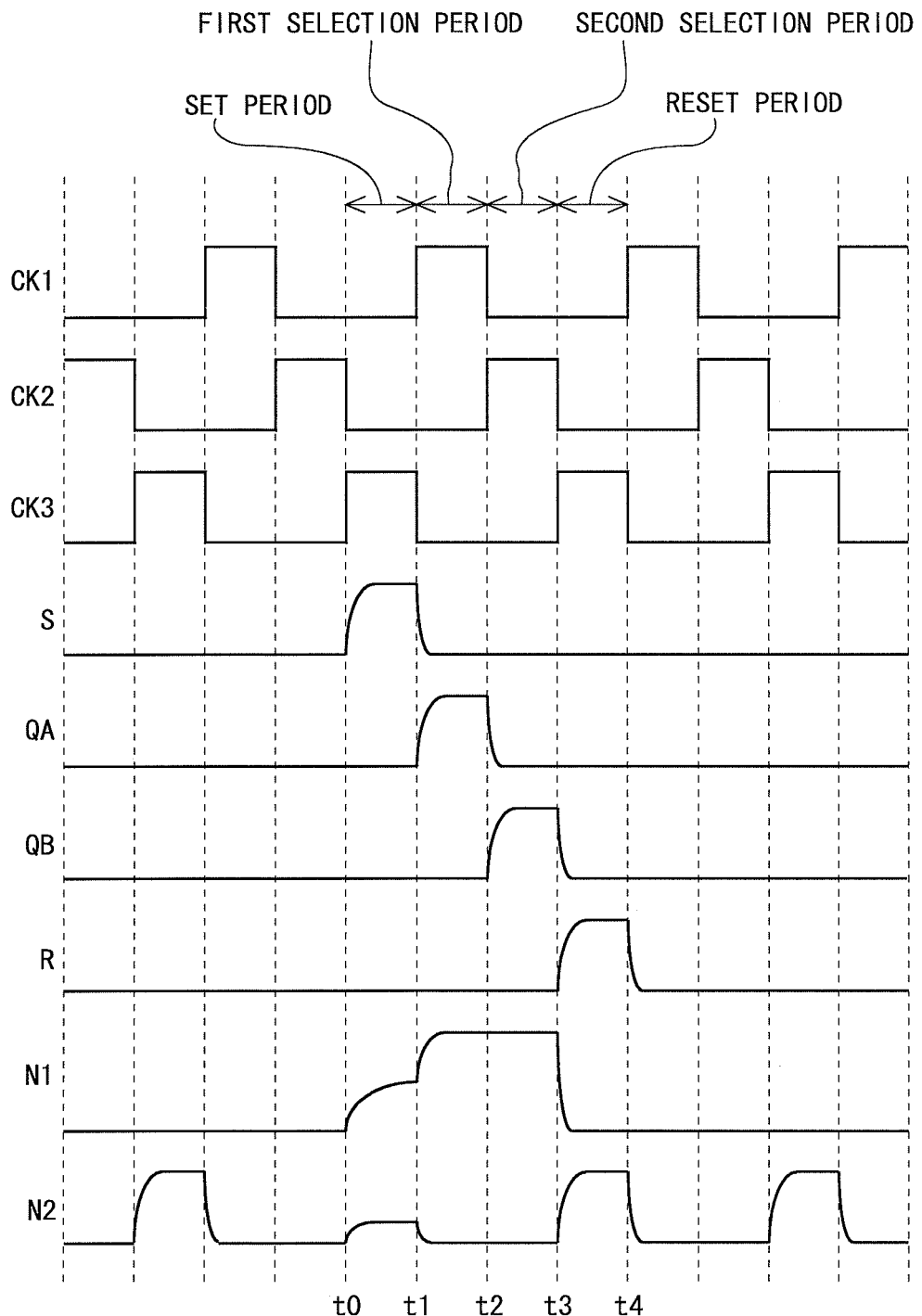
FIG. 13 is a signal waveform diagram for illustration of an operation of the stage constituent circuit according to the second embodiment.

Next, an operation of the stage constituent circuit according to this embodiment will be described with reference to FIG. 12 and FIG. 13. As described above, the potential of the second-node N2 increases to the high level when the third clock CK3 is at the high level, and the potential of the second-node N2 decreases to the VSS potential when the first clock CK1 is at the high level. Accordingly, in the normal operation period (periods before time t0 and after time t4), as illustrated in FIG. 13, the potential of the second-node N2 changes from the low level to the high level when the third clock CK3 changes from the low level to the high level, and the potential of the second-node N2 changes from the high level to the low level when the first clock CK1 changes from the low level to the high level. In this manner, the potential of the second-node N2 is turned to the high level and the thin-film transistor M12 is turned to the ON state every predetermined period. In the meantime, as there is a parasitic capacitance between the gate and the drain of the thin-film transistor MA1, a noise is generated at the first-node N1 due to fluctuation of a waveform of the first clock CK1 (see FIG. 13). Likewise, as there is a parasitic capacitance between the gate and the drain of the thin-film transistor MB1, a noise is generated at the first-node N1 due to fluctuation of a waveform of the second clock CK2 (see FIG. 13). However, as the thin-film transistor M12 is turned to the ON state every predetermined period, the potential of the first-node N1 is maintained at the low level. Further, a noise also occurs in the first state signal QA (the output terminal 61) due to the noise generated at the first-node N1 or fluctuation of a video signal voltage. However, as the thin-film transistor MA5 is turned to the ON state every predetermined period based on the third clock CK3, the potential of the first state signal QA is maintained at the low level. In addition, a noise also occurs in the second state signal QB (the output terminal 62) due to the noise generated at the first-node N1 or fluctuation of a video signal voltage. However, as the thin-film transistor MB5 is turned to the ON state every predetermined period based on the third clock CK3, the potential of the second state signal QB is maintained at the low level. Thus, during the normal operation period, the potential of the first-node N1, the potential of the first state signal QA, and the potential of the second state signal QB are maintained at the low level.

In the set period, similarly to the first embodiment, the potential of the first-node N1 changes from the low level to the high level, and the thin-film transistors MA1 and MB1 are turned to the ON state. Here, while the thin-film transistor M22 is turned to the ON state based on the set signal S, the potential of the second-node N2 slightly increases by the third clock CK3 being driven to the high level. As this increase of the potential is suppressed to be small by an action of the thin-film transistor M22, an action of the thin-film transistor M12 is suppressed and therefore the increase of the potential of the first-node N1 is not prevented. In the first selection period, similarly to the first embodiment, the potential of the first state signal QA increases up to a level sufficient for turning the gate bus line connected to the output terminal 61 of this stage constituent circuit to the selected state. Here, as the thin-film transistor M26 is turned to the ON state by the first clock CK1 being driven to the high level, the potential of the second-node N2 is fully pulled to the low level. In the second selection period, similarly to the first embodiment, the potential of the first state signal QA decreases, the potential of the first-node N1 is maintained at the high level, and the potential of the second state signal QB increases up to a level sufficient for turning the gate bus line connected to the output terminal 62 of this stage constituent circuit to the selected state. In the reset period, similarly to the first embodiment, the potential of the second state signal QB decreases, and the potential of the first-node N1 also decreases. Further, in the reset period, the thin-film transistors M10, MB4, and MA4 are turned to the ON state by the reset signal R changing from the low level to the high level. As a result, in the reset period, the potential of the first-node N1 and the potential of the second state signal QB decrease down to the low level, and the potential of the first state signal QA reliably decreases down to the low level regardless of the presence of noises and such.

2.3 Effect

According to this embodiment, it is possible to reduce a period during which the thin-film transistor M12 is in the ON state. With this, the shift register can be configured such that no thin-film transistor is turned to the ON state for an extended period of time. Accordingly, even when a shift register is configured by switching elements that may deteriorate when driving for an extended period of time, it is possible to stably drive the shift register using a small number of elements.

3. Third Embodiment

3.1 Configuration of Shift Register

Figure 14:
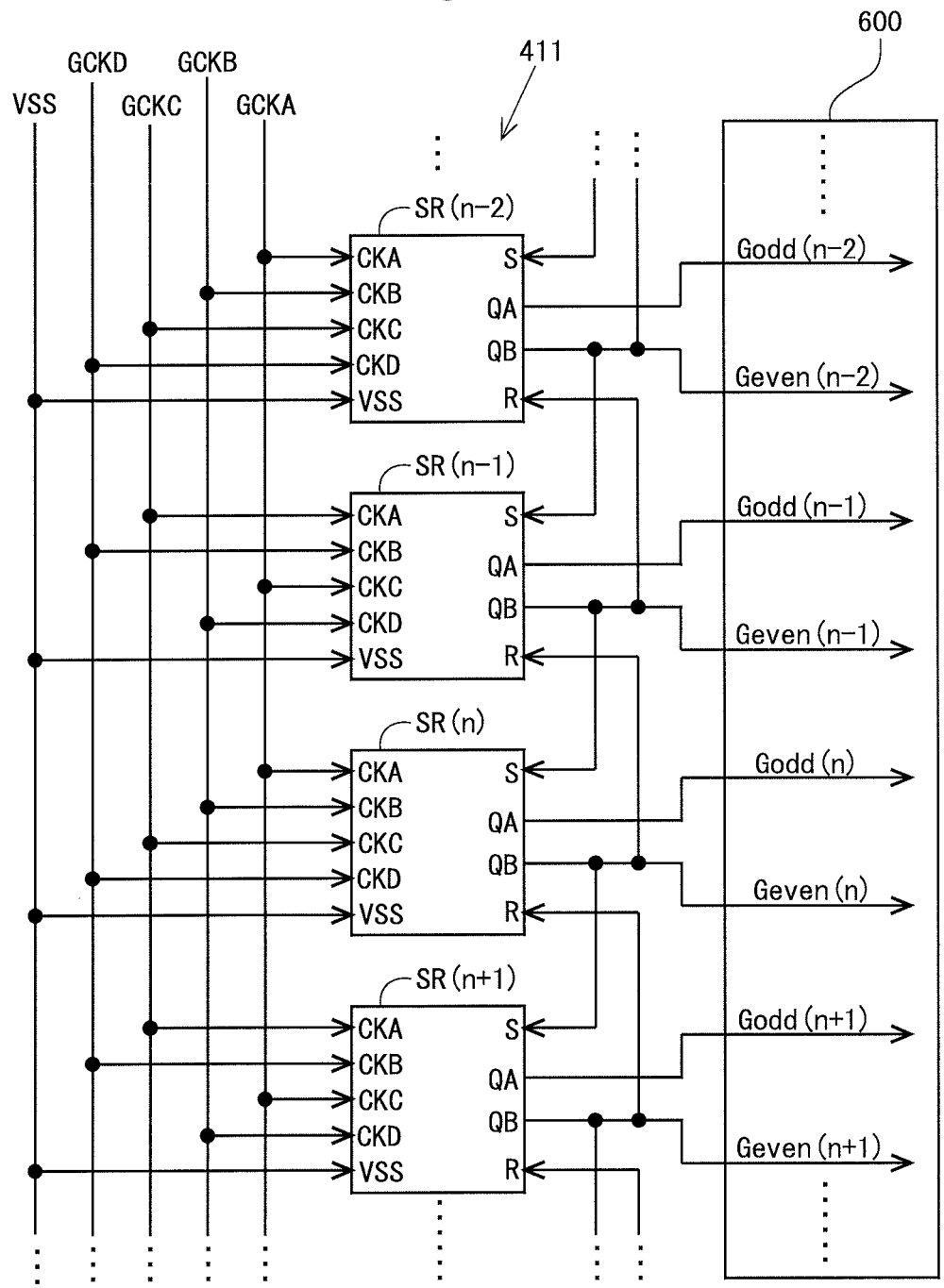
FIG. 14 is a block diagram showing a configuration of a shift register according to a third embodiment of the present invention.

FIG. 14 is a block diagram showing a configuration of a shift register 411 according to a third embodiment of the present invention. Here, an overall configuration and an operation of a liquid crystal display device are the same as those in the first embodiment, and therefore descriptions for these are omitted. Similarly to the first embodiment (see FIG. 3 and FIG. 4), the shift register 411 is configured by the z stage constituent circuits SR(1)-SR(z). Each stage constituent circuit includes an input terminal for receiving a clock signal CKA (hereinafter referred to as a "first clock"), an input terminal for receiving a clock signal CKB (hereinafter referred to as a "second clock"), an input terminal for receiving a clock signal CKC (hereinafter referred to as a "third clock"), an input terminal for receiving a clock signal CKD (hereinafter referred to as a "fourth clock"), the input terminal for receiving the low-level DC power supply potential VSS, the input terminal for receiving the set signal S, the input terminal for receiving the reset signal R, the output terminal for outputting the first state signal QA, and the output terminal for outputting the second state signal QB.

Figure 15:
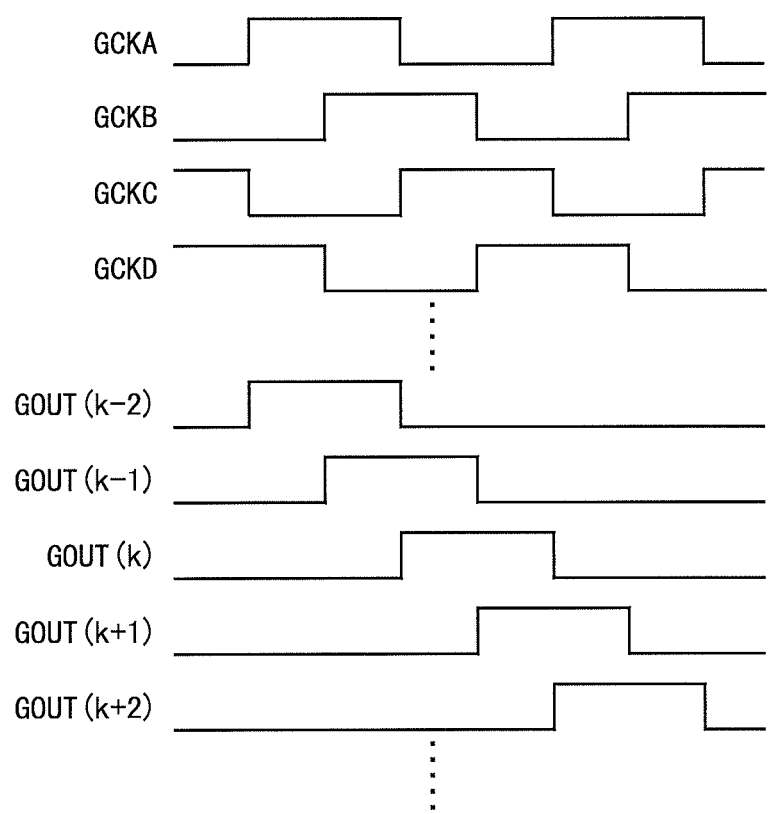
FIG. 15 is a signal waveform diagram for illustration of an operation of a gate driver according to the third embodiment.

The shift register 411 is supplied with, as the gate clock signal GCK, a first gate clock signal GCKA, a second gate clock signal GCKB, a third gate clock signal GCKC, and a fourth gate clock signal GCKD that are four-phase clock signals. As illustrated in FIG. 15, the first gate clock signal GCKA and the third gate clock signal GCKC are out of phase with each other by 180 degrees, and the second gate clock signal GCKB and the fourth gate clock signal GCKD are out of phase with each other by 180 degrees. Further, a phase of the second gate clock signal GCKB is delayed from a phase of the first gate clock signal GCKA by 90 degrees. Here, on-duty of the first to the fourth gate clock signals GCKA-GCKD is substantially a half.

Signals supplied to the input terminals of each stage (each stage constituent circuit) of the shift register 411 are as described below. The (n−1)th stage is supplied with the third gate clock signal GCKC as the first clock CKA, the fourth gate clock signal GCKD as the second clock CKB, the first gate clock signal GCKA as the third clock CKC, and the second gate clock signal GCKB as the fourth clock CKD. The n-th stage is supplied with the first gate clock signal GCKA as the first clock CKA, the second gate clock signal GCKB as the second clock CKB, the third gate clock signal GCKC as the third clock CKC, and the fourth gate clock signal GCKD as the fourth clock CKD. Through all the stages of the shift register 411, two stages having the same configurations as those of the (n−1)th stage and the n-th stage are repeatedly provided. Further, an any stage is supplied with the second state signal QB outputted from the previous stage as the set signal S, and the second state signal QB outputted from the next stage as the reset signal R. However, the first stage is supplied with the gate start pulse signal GSP as the set signal S, and the z-th stage (final stage) is supplied with the gate end pulse signal GEP as the reset signal R. Here, the low-level DC power supply potential VSS is supplied to all of the stage constituent circuits in common.

In the configuration described above, when the gate start pulse signal GSP is supplied as the set signal S to the first stage SR(1) of the shift register 411, a pulse included in the gate start pulse signal GSP (this pulse is included in the second state signal QB outputted from each stage) is transferred sequentially from the first stage SR(1) to the z-th stage SR(z) based on the first to the fourth gate clock signals GCKA-GCKD. Then, corresponding to the transferring of the pulse, the first state signal QA outputted from the first stage SR(1), the second state signal QB outputted from the first stage SR(1), the first state signal QA outputted from the second stage SR(2), the second state signal QB outputted from the second stage SR(2), . . . , the first state signal QA outputted from the z-th stage SR(z), and the second state signal QB outputted from the z-th stage SR(z) are sequentially driven to the high level. At this time, a latter half of a period in which the first state signal QA outputted from one stage is at the high level overlaps with a former half of a period in which the second state signal QB outputted the one stage is at the high level. In addition, a latter half of the period in which the second state signal QB outputted from the one stage is at the high level overlaps with a former half of a period in which the first state signal QA outputted from a next stage of the one stage is at the high level. These first state signals QA and the second state signals QB are respectively supplied to the gate bus lines GL1-GLi as the scanning signals GOUT(1)-GOUT(i). In this manner, as illustrated in FIG. 15, the scanning signals that are sequentially driven to the high level (active) are supplied to the gate bus lines within the display unit 600 such that there is a period in which two scanning signals supplied to adjacent two of the gate bus lines are driven to the high level at the same time.

3.2 Configuration of Stage Constituent Circuit

Figure 16:
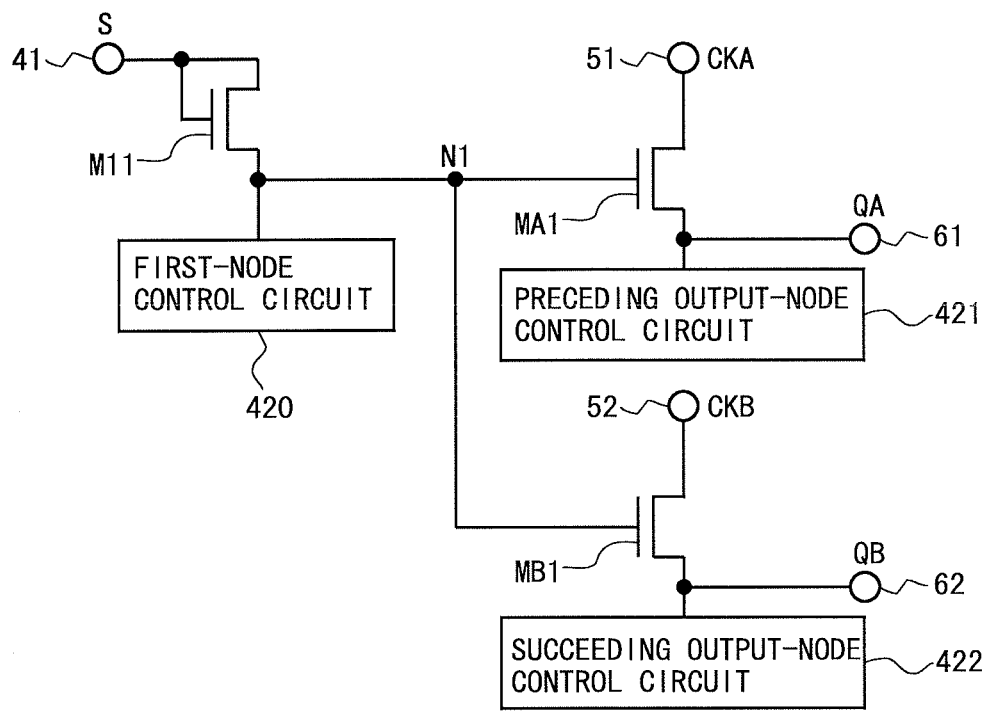
FIG. 16 is a configurational diagram schematically showing a main section of a stage constituent circuit according to the third embodiment.

FIG. 16 is a configurational diagram schematically showing a main section of a stage constituent circuit according to this embodiment. According to the first embodiment (see FIG. 1), the input terminals 43 and 44 for receiving the first clock CK1 and the second clock CK2 out of the three-phase clock signals are provided. In this embodiment, input terminals 51 and 52 for receiving the first clock CKA and the second clock CKB out of the four-phase clock signals are provided in place of the input terminals 43 and 44. A configuration other than this part is the same as that in the first embodiment.

Figure 17:
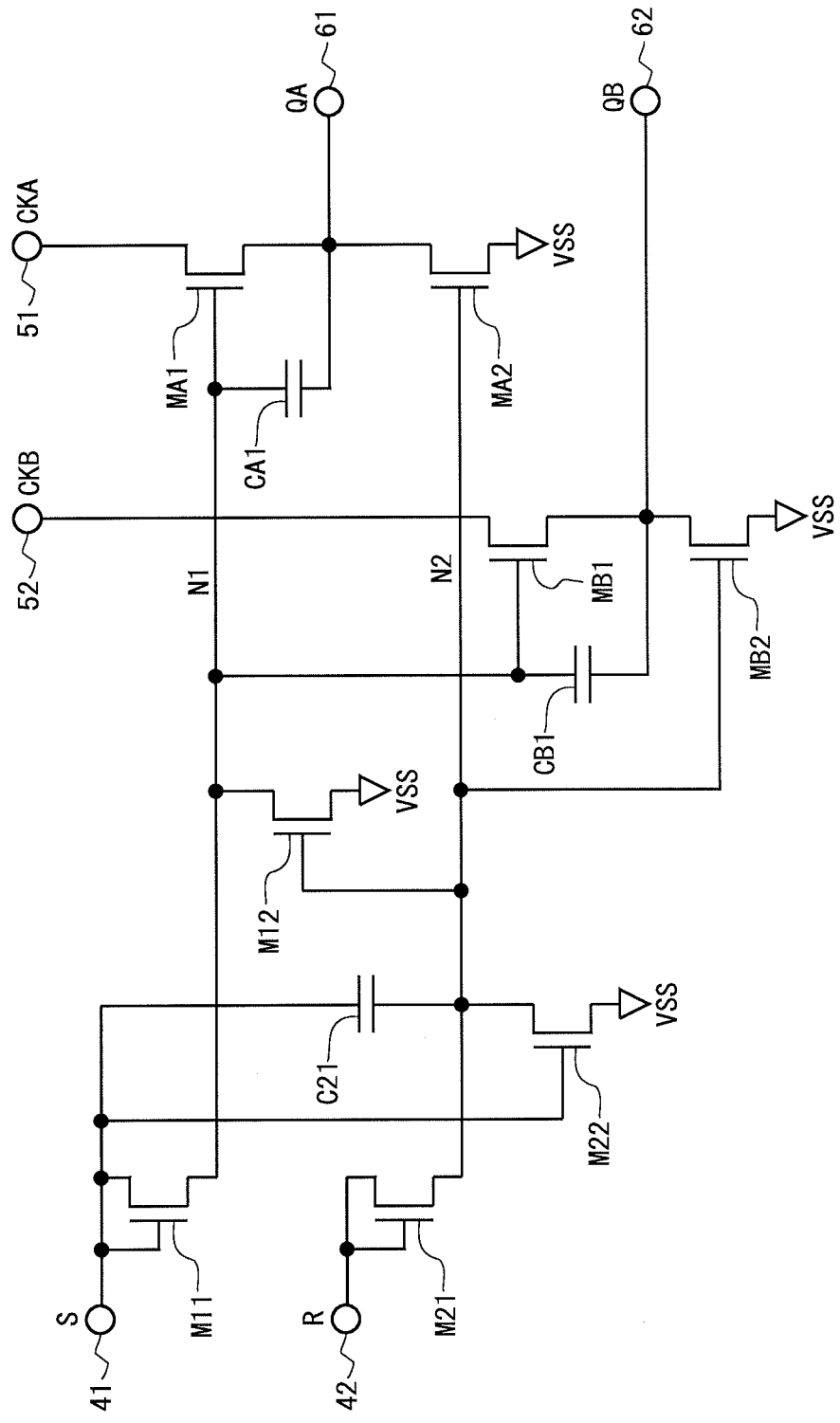
FIG. 17 is a circuit diagram showing a detailed configuration of the stage constituent circuit according to the third embodiment.

FIG. 17 is a circuit diagram showing a detailed configuration of the stage constituent circuit according to this embodiment. The input terminals 51 and 52 for receiving the first clock CKA and the second clock CKB out of the four-phase clock signals are provided in place of the input terminals 43 and 44 according to the first embodiment (see FIG. 6). Specifically, in this embodiment, the first clock CKA and the second clock CKB realize the output control clock signals.

3.3 Operation of Stage Constituent Circuit

Figure 18:
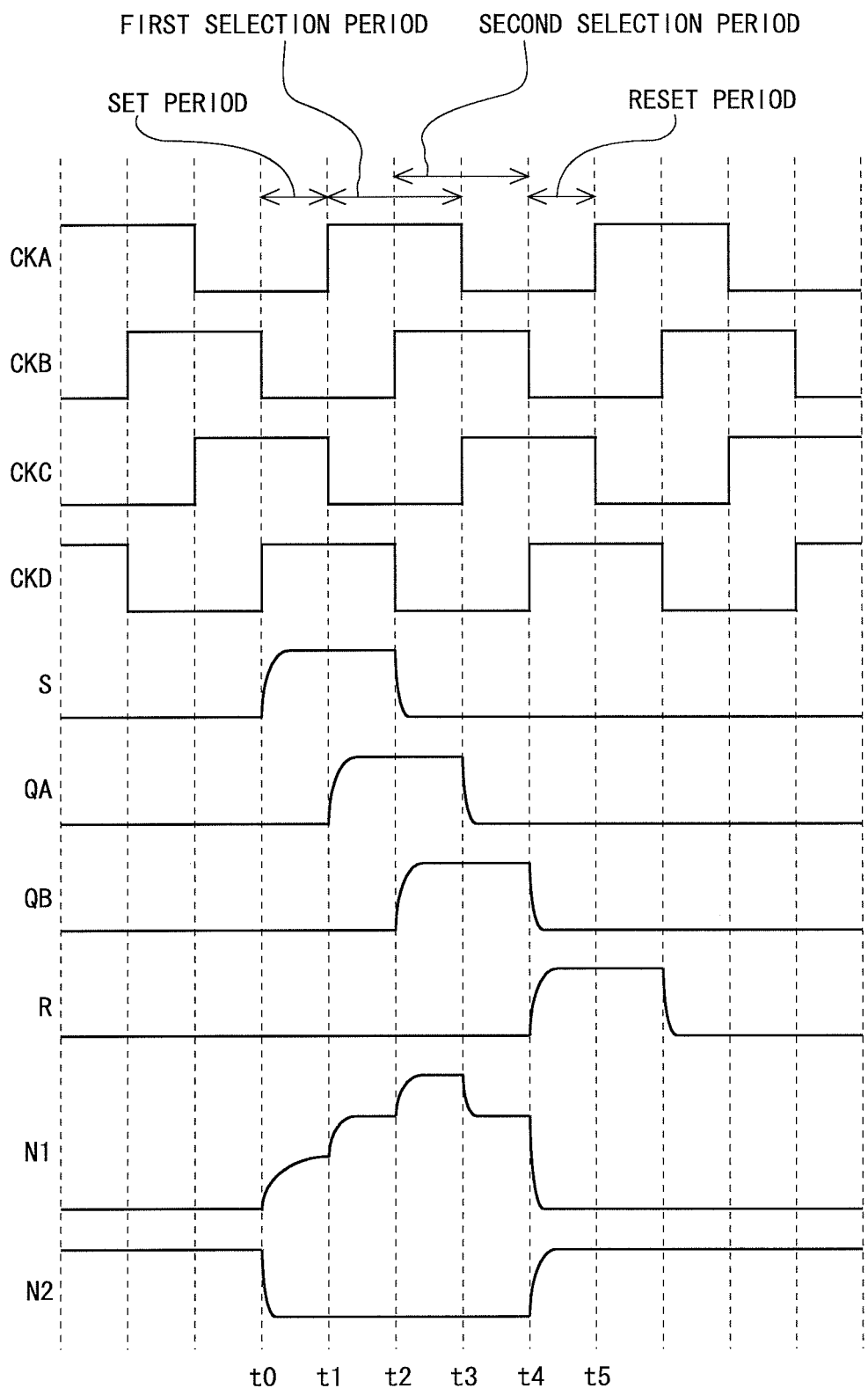
FIG. 18 is a signal waveform diagram for illustration of an operation of the stage constituent circuit according to the third embodiment.

Next, an operation of the stage constituent circuit according to this embodiment will be described with reference to FIG. 17 and FIG. 18. In FIG. 18, a period from time t1 to time t3 corresponds to the first selection period, and a period from time t2 to time t4 corresponds to the second selection period. In each of the first selection period and the second selection period, a former half of the period is for a preliminary charge (precharge) to the pixel capacitance, and a latter half of the period is for primary charge (main charge) to the pixel capacitance.

In the normal operation period, similarly to the first embodiment, the potential of the first-node N1, the potential of the first state signal QA, and the potential of the second state signal QB are maintained at the low level. In the set period, similarly to the first embodiment, the potential of the first-node N1 changes from the low level to the high level, and the thin-film transistors MA1 and MB1 are turned to the ON state.

In the first selection period (at time t1), the first clock CKA changes from the low level to the high level. With this, similarly to the first embodiment, the potential of the first state signal QA increases up to a level sufficient for turning the gate bus line connected to the output terminal 61 of this stage constituent circuit to the selected state.

In the second selection period (at time t2), the second clock CKB changes from the low level to the high level. With this, similarly to the first embodiment, the potential of the second state signal QB increases up to a level sufficient for turning the gate bus line connected to the output terminal 62 of this stage constituent circuit to the selected state. In the meantime, in this embodiment, the first clock CKA is maintained at the high level at time t2. Accordingly, the potential of the first state signal QA is maintained at the high level also after time t2. Therefore, the potential of the first-node N1 may not decrease via the capacitor CA1 at time t2. Here, similarly to the first embodiment, at time t2, the potential of the first-node N1 is going to increase as a potential of the input terminal 52 increases due to the presence of the parasitic capacitance between the gate and the drain of the thin-film transistor MB1. Thus, at time t2, the potential of the first-node N1 further increases.

When the first selection period ends (at time t3), the first clock CKA changes from the high level to the low level. The thin-film transistor MA1 is in the ON state at time t3, and therefore the potential of the first state signal QA decreases as a potential of the input terminal 51 decreases. By the potential of the first state signal QA decreasing in this manner, the potential of the first-node N1 also decreases via the capacitor CA1. However, the potential of the first-node N1 is maintained at a level sufficient for maintaining the thin-film transistor MB1 at the ON state.

In the reset period (at time t4), similarly to the first embodiment, the potential of the first-node N1 and the potential of the second state signal QB decrease down to the low level, and the potential of the first state signal QA reliably decreases down to the low level regardless of the presence of noises and such.

It should be noted that while an increased value of the voltage due to bootstrap (an increased value of the potential of the first-node N1 after the first selection period starts) will not exceed the voltage (amplitude) of the clock signal, FIG. 18 shows that the potential of the first-node N1 increases largely for the sake of explanation (specifically, the value of the voltage in this signal waveform diagram is not exactly correct). This also applies to FIG. 22, FIG. 24, and FIG. 29.

3.4 Effects

According to this embodiment, in the liquid crystal display device having the precharge period and the main charge period regarding the charge to the pixel capacitance, similarly to the first embodiment, it is possible to drive the gate bus lines as a whole as in the conventional example using a monolithic gate driver configured by a smaller number of circuit elements as compared to the conventional example. Accordingly, a yield ratio is improved as compared to the conventional example. Further, as an area of circuits for the gate driver is reduced, it is possible to downsize the liquid crystal display device.

3.5 Modified Examples

Next, modified examples of the third embodiment will be described.

3.5.1 First Modified Example

Figure 19:
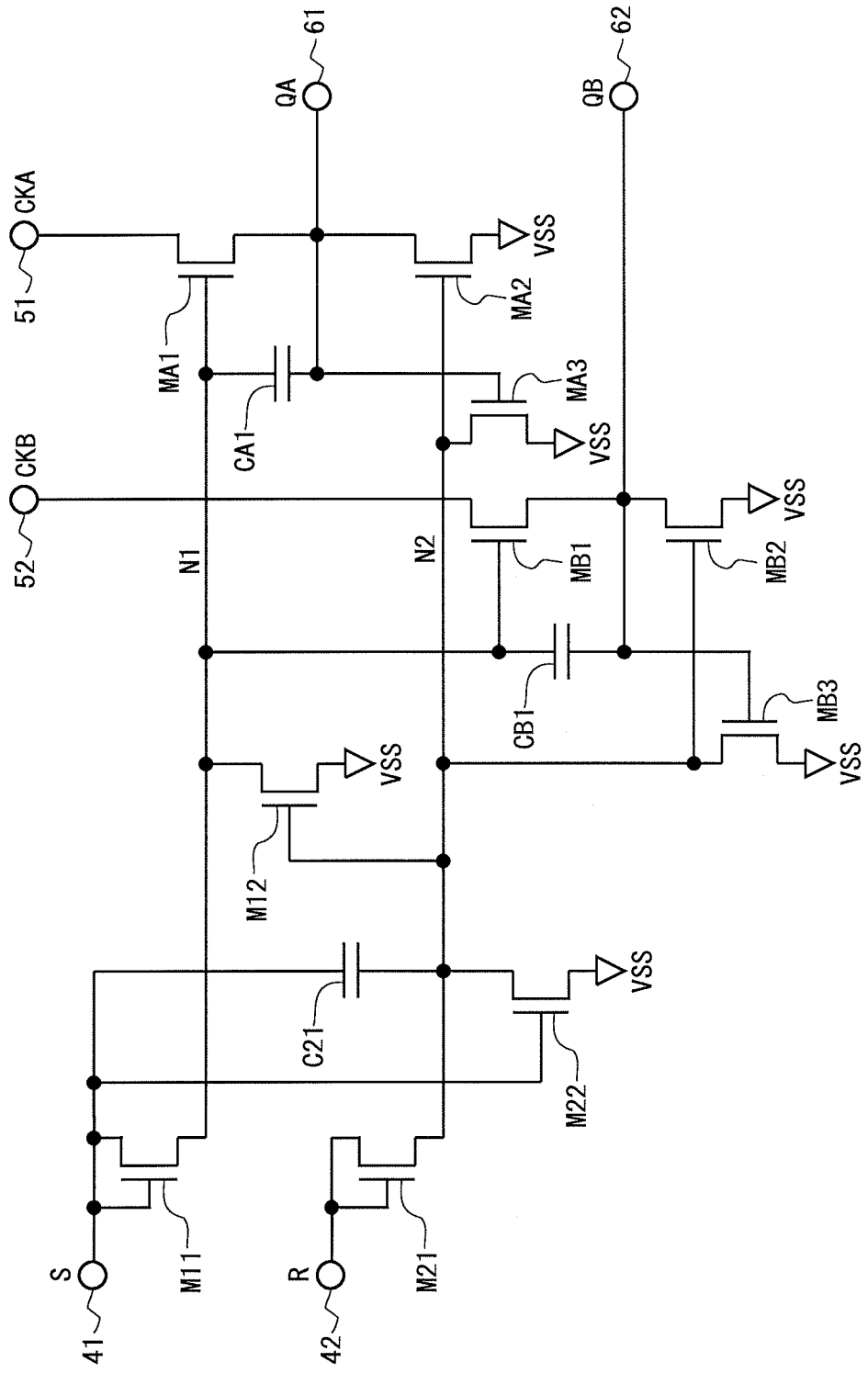
FIG. 19 is a circuit diagram showing a detailed configuration of the stage constituent circuit according to a first modified example of the third embodiment.

FIG. 19 is a circuit diagram showing a detailed configuration of the stage constituent circuit according to a first modified example of the third embodiment. Here, an overall configuration and an operation of the liquid crystal display device and a configuration and an operation of the gate driver are the same as those in the third embodiment, and therefore descriptions for these are omitted. The stage constituent circuit in this modified example is configured in the same manner as the first modified example of the first embodiment (see FIG. 8). However, in this modified example, the input terminals 51 and 52 for receiving the first clock CKA and the second clock CKB out of the four-phase clock signals are provided in place of the input terminals 43 and 44 of the first modified example of the first embodiment.

According to this modified example, similarly to the first modified example of the first embodiment, throughout the first selection period and the second selection period (the period from time t1 to time t4 in FIG. 18), the potential of the second-node N2 is reliably maintained at the low level, and the stability of the circuit operation is improved.

3.5.2 Second Modified Example

Figure 20:
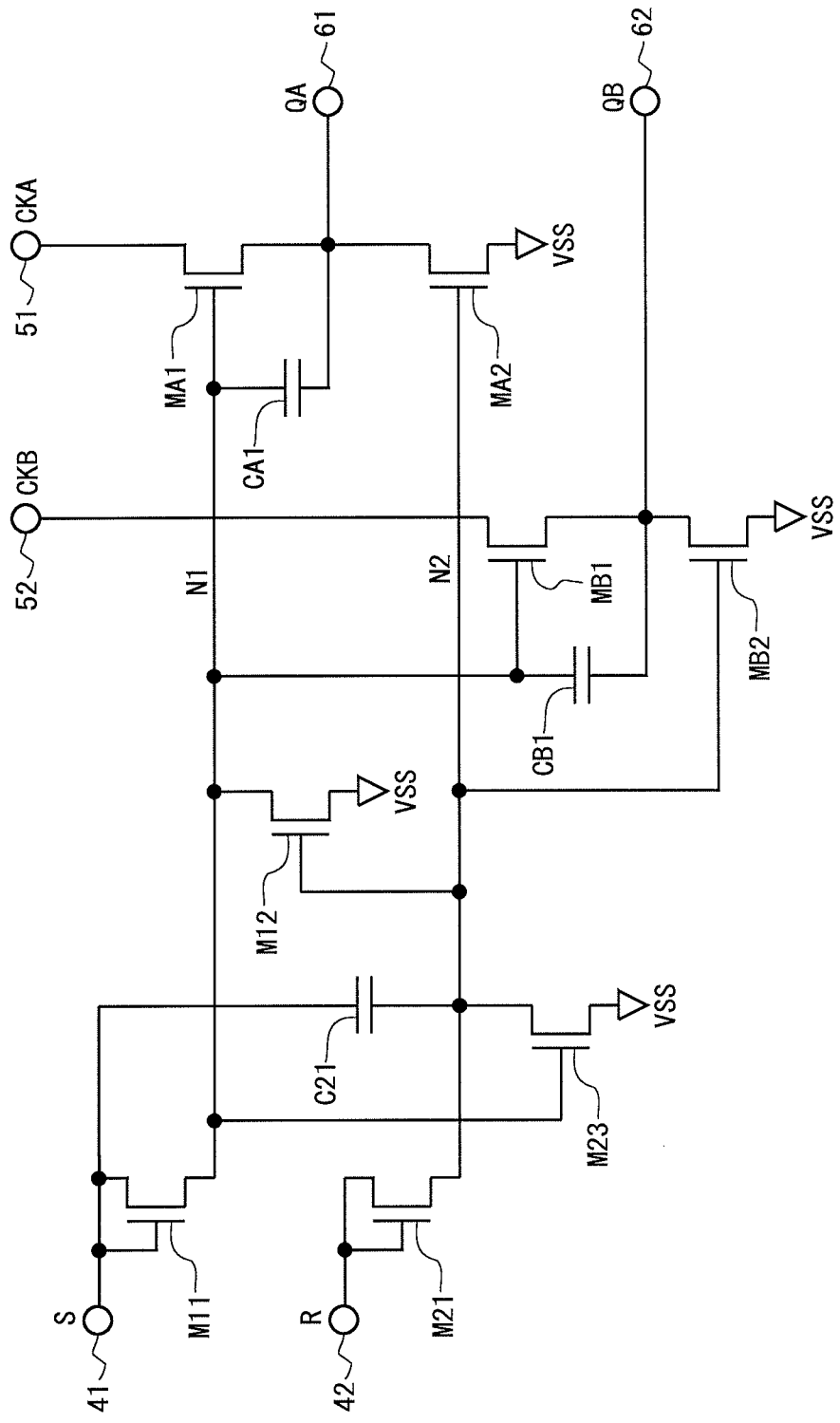
FIG. 20 is a circuit diagram showing a detailed configuration of the stage constituent circuit according to a second modified example of the third embodiment.

FIG. 20 is a circuit diagram showing a detailed configuration of the stage constituent circuit according to a second modified example of the third embodiment. Here, an overall configuration and an operation of a liquid crystal display device and a configuration and an operation of a gate driver are the same as those in the third embodiment, and therefore descriptions for these are omitted. The stage constituent circuit in this modified example is configured in the same manner as the second modified example of the first embodiment (see FIG. 9). However, in this modified example, the input terminals 51 and 52 for receiving the first clock CKA and the second clock CKB out of the four-phase clock signals are provided in place of the input terminals 43 and 44 of the first modified example of the first embodiment.

In this modified example, in the set period, the potential of the first-node N1 changes from the low level to the high level by the set signal S changing from the low level to the high level and the thin-film transistor M11 being turned to the ON state. Then, by the potential of the first-node N1 being turned to the high level, the thin-film transistor M23 is turned to the ON state, and the potential of the second-node N2 is turned to the low level. An operation other than this part is the same as that of the third embodiment.

3.5.3 Third Modified Example

Figure 21:
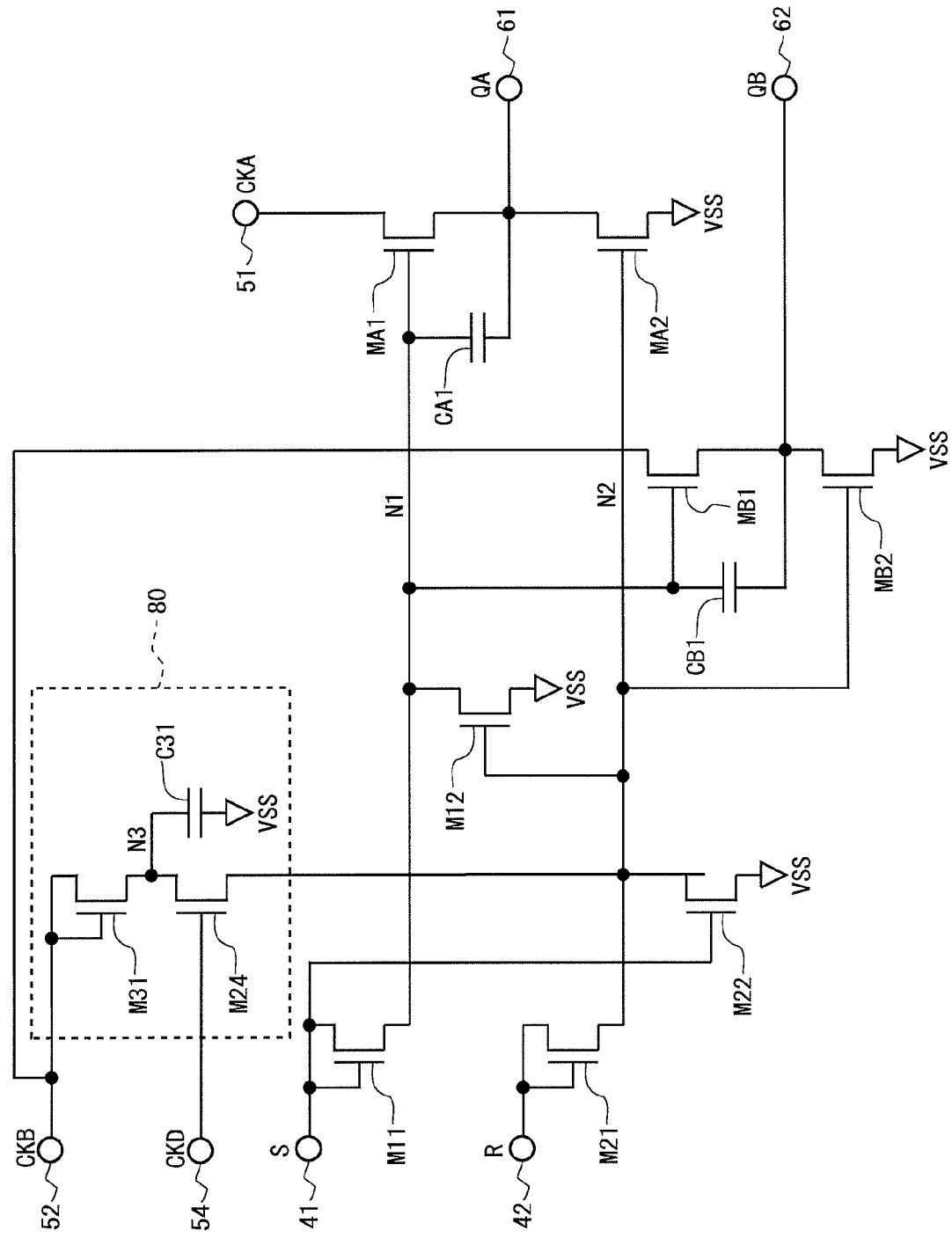
FIG. 21 is a circuit diagram showing a detailed configuration of the stage constituent circuit according to a third modified example of the third embodiment.

FIG. 21 is a circuit diagram showing a detailed configuration of the stage constituent circuit according to a third modified example of the third embodiment. Here, an overall configuration and an operation of a liquid crystal display device and a configuration and an operation of a gate driver are the same as those in the third embodiment, and therefore descriptions for these are omitted. The stage constituent circuit in this modified example is configured in the same manner as the third modified example of the first embodiment (see FIG. 10). However, in this modified example, the input terminals 51 and 52, and an input terminal 54 respectively for receiving the first clock CKA, the second clock CKB, and the fourth clock CKD out of the four-phase clock signals are provided in place of the input terminals 43, 44, and 45 of the third modified example of the first embodiment.

Figure 22:
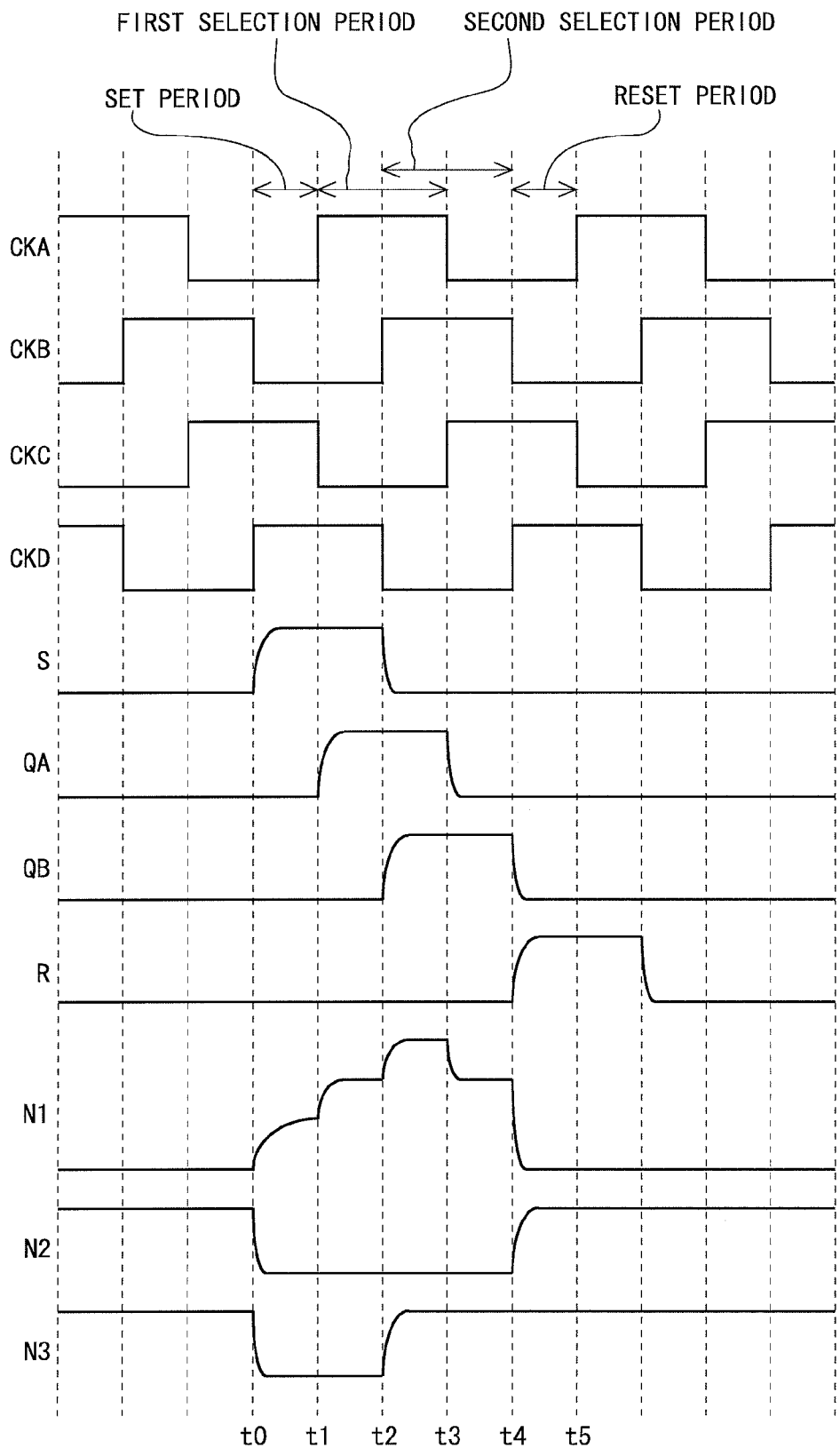
FIG. 22 is a signal waveform diagram for illustration of an operation of the stage constituent circuit according to the third modified example of the third embodiment.

According to this modified example, similarly to the third modified example of the first embodiment, during the normal operation period, even when a current leakage occurs in a thin-film transistor connected to the second-node N2, the potential of the second-node N2 is reliably maintained at the high level by the supply of an electric charge. With this, particularly when low-frequency driving is performed, it is possible to effectively suppress an occurrence of an abnormal operation due to the decrease of the potential of the second-node N2, and the stability of the circuit operation is improved. It should be noted that the waveforms of the signals are as illustrated in FIG. 22.

4. Fourth Embodiment

4.1 Configuration of Stage Constituent Circuit

Figure 23:
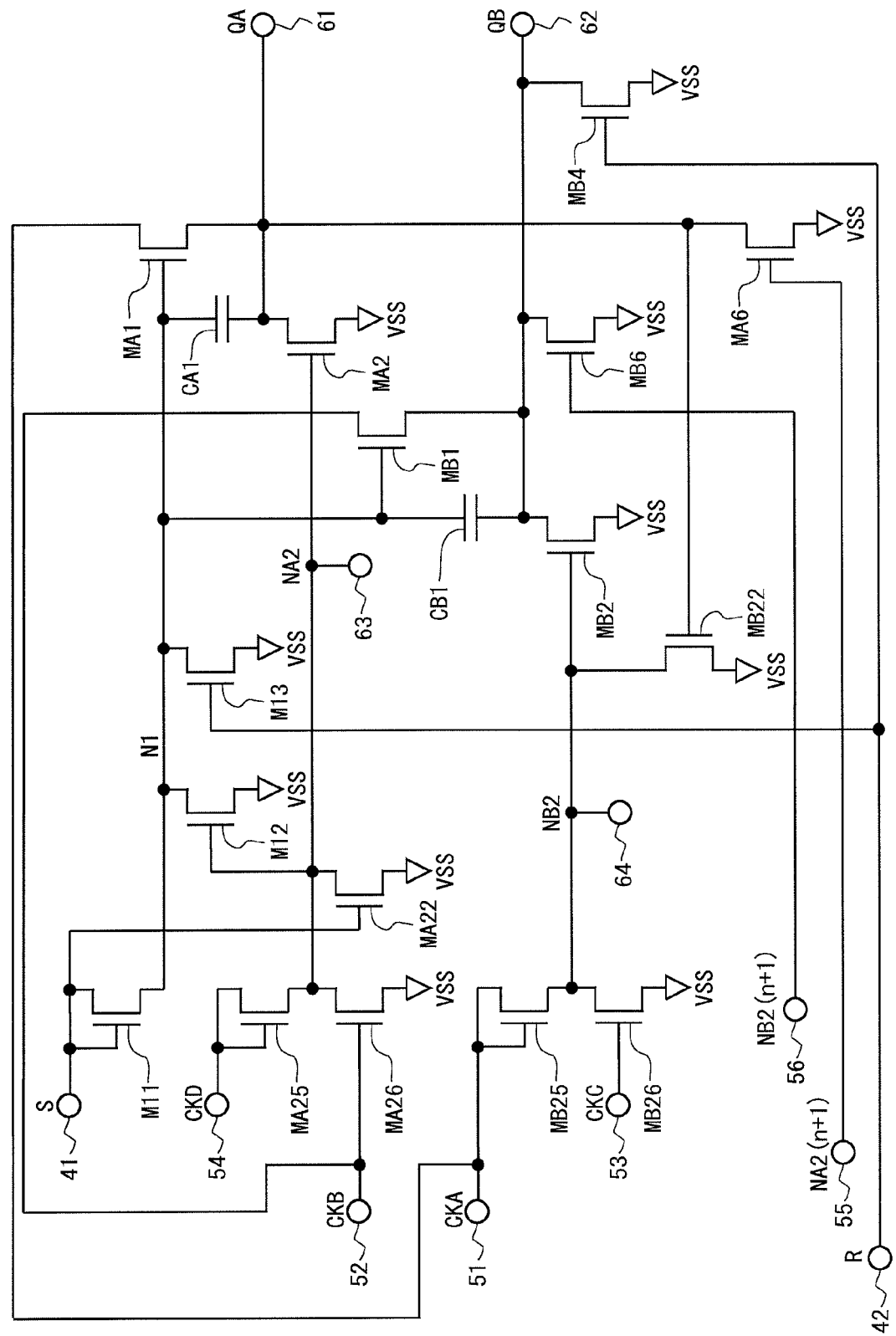
FIG. 23 is a circuit diagram showing a detailed configuration of a stage constituent circuit according to a fourth embodiment of the present invention.

FIG. 23 is a circuit diagram showing a detailed configuration of a stage constituent circuit according to a fourth embodiment of the present invention. Here, an overall configuration and an operation of a liquid crystal display device and a configuration and an operation of a gate driver are the same as those in the third embodiment, and therefore descriptions for these are omitted.

As illustrated in FIG. 23, this stage constituent circuit is provided with sixteen thin-film transistors M11, M12, M13, MA1, MA2, MA6, MA22, MA25, MA26, MB1, MB2, MB4, MB6, MB22, MB25, and MB26, and the two capacitors CA1 and CB1. Additionally, this stage constituent circuit includes eight input terminals 41, 42, 51-54, 55, and 56 and four output terminal 61-64, in addition to the input terminal for the low-level DC power supply potential VSS. It should be noted that an output terminal for supplying a potential of a node indicated by a reference numeral NA2 (hereinafter referred to as a "first second-node") to the previous-stage stage constituent circuit is indicated by the reference numeral 63, an output terminal for supplying a potential of a node indicated by a reference numeral NB2 (hereinafter referred to as a "second second-node") to the previous-stage stage constituent circuit is indicated by the reference numeral 64, an input terminal for receiving the potential of the first second-node NA2 of a next-stage stage constituent circuit is indicated by the reference numeral 55, and an input terminal for receiving a potential of the second second-node NB2 of the next-stage stage constituent circuit is indicated by the reference numeral 56.

Next, a connecting relation among components within the stage constituent circuit is described. The source terminal of the thin-film transistor M11, the drain terminal of the thin-film transistor M12, a drain terminal of the thin-film transistor M13, the gate terminal of the thin-film transistor MA1, the gate terminal of the thin-film transistor MB1, the one end of the capacitor CA1, and the one end of the capacitor CB1 are connected to each other via the first-node N1. The gate terminal of the thin-film transistor M12, the drain terminal of the thin-film transistor M22, the gate terminal of the thin-film transistor MA2, a source terminal of the thin-film transistor MA25, and a drain terminal of the thin-film transistor MA26 are connected to each other via the first second-node NA2. The gate terminal of the thin-film transistor MB2, a drain terminal of the thin-film transistor MB22, a source terminal of the thin-film transistor MB25, and a drain terminal of the thin-film transistor MB26 are connected to each other via the second second-node NB2.

For the thin-film transistor M11, the gate terminal and the drain terminal are connected to the input terminal 41 (that is, diode-connected), and the source terminal is connected to the first-node N1. For the thin-film transistor M12, the gate terminal is connected to the first second-node NA2, the drain terminal is connected to the first-node N1, and the source terminal is connected to the input terminal for the DC power supply potential VSS. For the thin-film transistor M13, a gate terminal is connected to the input terminal 42, the drain terminal is connected to the first-node N1, and a source terminal is connected to the input terminal for the DC power supply potential VSS. For the thin-film transistor MA1, the gate terminal is connected to the first-node N1, the drain terminal is connected to the input terminal 51, and the source terminal is connected to the output terminal 61. For the thin-film transistor MA2, the gate terminal is connected to the first second-node NA2, the drain terminal is connected to the output terminal 61, and the source terminal is connected to the input terminal for the DC power supply potential VSS. For the thin-film transistor MA6, a gate terminal is connected to the input terminal 55, a drain terminal is connected to the output terminal 61, and a source terminal is connected to the input terminal for the DC power supply potential VSS. For the thin-film transistor M22, the gate terminal is connected to the input terminal 41, the drain terminal is connected to the first second-node NA2, and the source terminal is connected to the input terminal for the DC power supply potential VSS. For the thin-film transistor MA25, a gate terminal and a drain terminal are connected to the input terminal 54 (that is, diode-connected), and the source terminal is connected to the first second-node NA2. For the thin-film transistor MA26, a gate terminal is connected to the input terminal 52, the drain terminal is connected to the first second-node NA2, and a source terminal is connected to the input terminal for the DC power supply potential VSS. For the thin-film transistor MB1, the gate terminal is connected to the first-node N1, the drain terminal is connected to the input terminal 52, and the source terminal is connected to the output terminal 62. For the thin-film transistor MB2, the gate terminal is connected to the second second-node NB2, the drain terminal is connected to the output terminal 62, and the source terminal is connected to the input terminal for the DC power supply potential VSS. For the thin-film transistor MB4, the gate terminal is connected to the input terminal 42, the drain terminal is connected to the output terminal 62, and the source terminal is connected to the input terminal for the DC power supply potential VDD. For the thin-film transistor MB6, a gate terminal is connected to the input terminal 56, a drain terminal is connected to the output terminal 62, and a source terminal is connected to the input terminal for the DC power supply potential VDD. For the thin-film transistor MB22, a gate terminal is connected to the output terminal 61, the drain terminal is connected to the second second-node NB2, and a source terminal is connected to the input terminal for the DC power supply potential VDD. For the thin-film transistor MB25, a gate terminal and a drain terminal are connected to the input terminal 51 (that is, diode-connected), and the source terminal is connected to the second second-node NB2. For the thin-film transistor MB26, a gate terminal is connected to the input terminal 53, the drain terminal is connected to the second second-node NB2, and a source terminal is connected to the input terminal for the DC power supply potential VSS. For the capacitor CA1, the one end is connected to the first-node N1, and the other end is connected to the output terminal 61. For the capacitor CB1, the one end is connected to the first-node N1, and the other end is connected to the output terminal 62.

Next, functions of the components in the stage constituent circuit are described. The thin-film transistor M11 changes the potential of the first-node N1 to the high level when the set signal S is at the high level. The thin-film transistor M12 changes the potential of the first-node N1 to the VSS potential when the potential of the first second-node NA2 is at the high level. The thin-film transistor M13 changes the potential of the first-node N1 to the VSS potential when the reset signal R is at the high level. The thin-film transistor MA1 supplies the potential of the first clock CKA to the output terminal 61 when the potential of the first-node N1 is at the high level. The thin-film transistor MA2 changes the potential of the output terminal 61 to the VSS potential when the potential of the first second-node NA2 is at the high level. The thin-film transistor MA6 changes the potential of the output terminal 61 to the VSS potential when the potential of the first second-node NA2 of the next-stage stage constituent circuit is at the high level. The thin-film transistor MA22 changes the potential of the first second-node NA2 to the VSS potential when the set signal S is at the high level. The thin-film transistor MA25 changes the potential of the first second-node NA2 to the high level when the fourth clock CKD is at the high level. The thin-film transistor MA26 changes the potential of the first second-node NA2 to the VSS potential when the second clock CKB is at the high level. The thin-film transistor MB1 supplies the potential of the second clock CKB to the output terminal 62 when the potential of the first-node N1 is at the high level. The thin-film transistor MB2 changes the potential of the output terminal 62 to the VSS potential when the potential of the second second-node NB2 is at the high level. The thin-film transistor MB4 changes the potential of the output terminal 62 to the VSS potential when the reset signal R is at the high level. The thin-film transistor MB6 changes the potential of the output terminal 62 to the VSS potential when the potential of the second second-node NB2 of the next-stage stage constituent circuit is at the high level. The thin-film transistor MB22 changes the potential of the second second-node NB2 to the VSS potential when the potential of the output terminal 61 is at the high level. The thin-film transistor MB25 changes the potential of the second second-node NB2 to the high level when the first clock CKA is at the high level. The thin-film transistor MB26 changes the potential of the second second-node NB2 to the VSS potential when the third clock CKC is at the high level. The capacitor CA1 functions as the compensation capacitance for maintaining the potential of the first-node N1 at the high level during the period in which the gate bus line connected to the output terminal 61 is in the selected state. The capacitor CB1 functions as the compensation capacitance for maintaining the potential of the first-node N1 at the high level during the period in which the gate bus line connected to the output terminal 62 is in the selected state.

4.2 Operation of Stage Constituent Circuit

Figure 24:
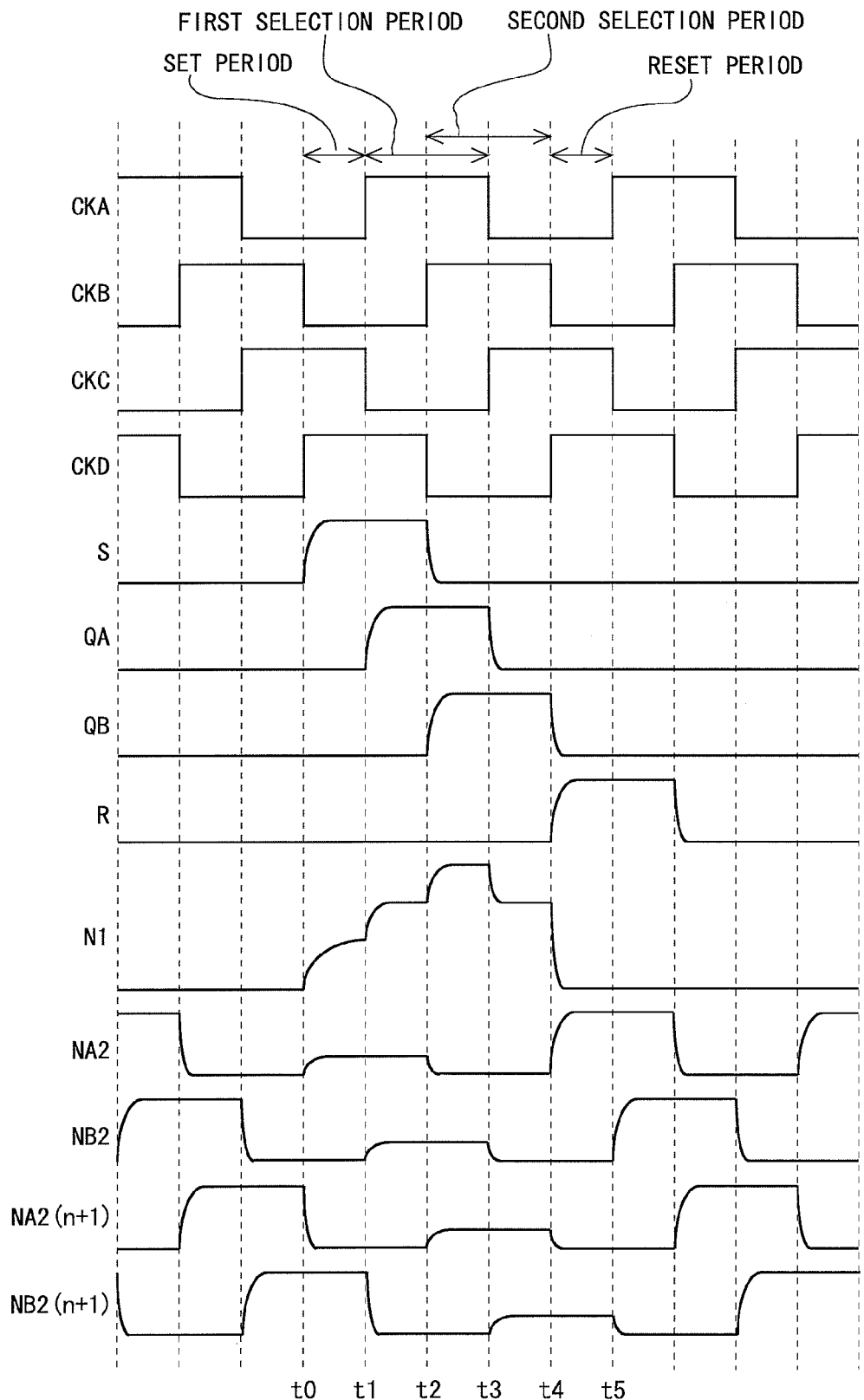
FIG. 24 is a signal waveform diagram for illustration of an operation of the stage constituent circuit according to the fourth embodiment.

Next, an operation of the stage constituent circuit according to this embodiment will be described with reference to FIG. 23 and FIG. 24. In the normal operation period (periods before time t0 and after time t5), the potential of the first second-node NA2 changes from the low level to the high level when the fourth clock CKD changes from the low level to the high level, and the potential of the first second-node NA2 changes from the high level to the low level when the second clock CKB changes from the low level to the high level. Further, as the next-stage stage constituent circuit is supplied with the clocks CKA-CKD whose phase is delayed by 180 degrees, the input terminal 55 is supplied with a potential of a waveform whose phase is delayed by 180 degrees as compared to a waveform of the potential of the first second-node NA2 of this stage constituent circuit. With this, the thin-film transistor MA2 and the thin-film transistor MA6 are alternately turned to the ON state. Accordingly, even when a noise occurs in the first state signal QA, the potential of the first state signal QA is reliably maintained at the low level. Likewise, in the normal operation period, as the thin-film transistor MB2 and the thin-film transistor MB6 are alternately turned to the ON state, the potential of the second state signal QB is reliably maintained at the low level even when a noise occurs in the second state signal QB.

In the set period, similarly to the third embodiment, the potential of the first-node N1 changes from the low level to the high level, and the thin-film transistors MA1 and MB1 are turned to the ON state. Here, while the thin-film transistor MA22 is turned to the ON state based on the set signal S, the potential of the first second-node NA2 slightly increases by the fourth clock CKD being driven to the high level. As this increase of the potential is suppressed to be small by an action of the thin-film transistor MA22, an action of the thin-film transistor M12 is suppressed and therefore the increase of the potential of the first-node N1 is not prevented. In the first selection period (at time t1), similarly to the third embodiment, the potential of the first state signal QA increases up to a level sufficient for turning the gate bus line connected to the output terminal 61 of this stage constituent circuit to the selected state. Further, in the first selection period, while the thin-film transistor MB22 is turned to the ON state based on the first state signal QA, the potential of the second second-node NB2 slightly increases by the first clock CKA being driven to the high level. This increase of the potential is suppressed to be small by an action of the thin-film transistor MB22. In the second selection period (at time t2), similarly to the third embodiment, the potential of the second state signal QB increases up to a level sufficient for turning the gate bus line connected to the output terminal 62 of this stage constituent circuit to the selected state. Here, as the thin-film transistor MA26 is turned to the ON state by the second clock CKB being driven to the high level, the potential of the first second-node NA2 is completely pulled to the low level. When the first selection period ends (at time t3), similarly to the third embodiment, the potential of the first state signal QA and the potential of the first-node N1 decrease. Here, as the thin-film transistor MB26 is turned to the ON state by the third clock CKC being driven to the high level, the potential of the second second-node NB2 is completely pulled to the low level. In the reset period (at time t4), similarly to the third embodiment, the potential of the first-node N1 and the potential of the second state signal QB decrease down to the low level, and the potential of the first state signal QA reliably decreases down to the low level regardless of the presence of noises and such.

4.3 Effect

According to this embodiment, it is possible to reduce a period during which a thin-film transistor whose gate electrode is connected to one of the first second-node NA2 and the second second-node NB2 (such as the thin-film transistor M12) is in the ON state. With this, the shift register can be configured such that no thin-film transistor is turned to the ON state for an extended period of time. Accordingly, even when a shift register is configured by switching elements that may deteriorate when driving for an extended period of time, it is possible to stably drive the shift register using a small number of elements.

5. Fifth Embodiment

5.1 Configuration of Shift Register

Figure 25:
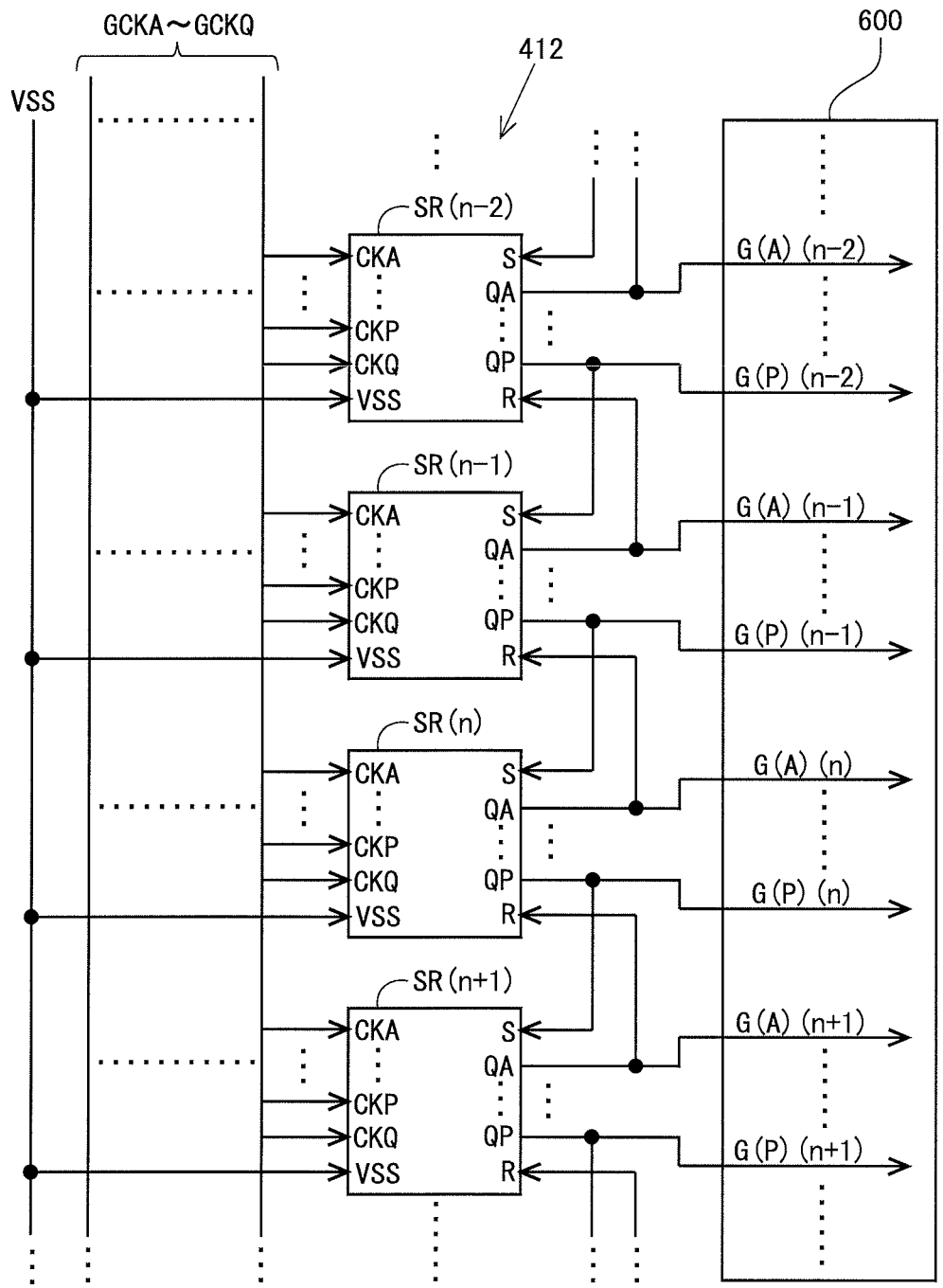
FIG. 25 is a block diagram showing a configuration of a shift register according to a fifth embodiment of the present invention.

FIG. 25 is a block diagram showing a configuration of a shift register 412 according to a fifth embodiment of the present invention. Similarly to the first embodiment (see FIG. 3 and FIG. 4), the shift register 412 is configured by the z stage constituent circuits SR(1)-SR(z). Each stage constituent circuit includes Q input terminals (Q is an integer equal to or greater than 3) for receiving clock signals CKA-CKQ, the input terminal for receiving the low-level DC power supply potential VSS, an input terminal for receiving the set signal S, the input terminal for receiving the reset signal R, and P output terminals (P is an integer equals to or greater 2) for outputting state signals. As described above, in this embodiment, each stage of the shift register 412 is provided with the P output terminals, and a single stage of the shift register 412 corresponds to P lines of the pixel matrix (see FIG. 3). It should be noted that regarding the Q input terminals, while input terminals for receiving P output control clock signals corresponding to the P output terminals are indispensable component, (Q-P) input terminals other than the P input terminals are not necessarily required.

The shift register 412 is supplied with, as the gate clock signal GCK, the Q-phase clock signals GCKA-GCKQ. Here, in this embodiment, Q=P+1 is established, and on-duty of the Q-phase clock signals GCKA-GCKQ is substantially (1/Q). The Q-phase clock signals GCKA-GCKQ are out of phase with each other by (360/Q) degrees, and delayed by (360/Q) degrees in the order of "GCKA, GCKB, GCKC, . . . , GCKP, and GCKQ" (see FIG. 26).

Clock signals supplied to the input terminals of each stage (each stage constituent circuit) of the shift register 412 are as described below. It is assumed that a first stage out of Q stages is supplied with the clock signal GCKA as the clock signal CKA, the clock signal GCKB as the clock signal CKB, the clock signal GCKC as the clock signal CKC, . . . , and the clock signal GCKQ as the clock signal CKQ. At this time, a second stage out of the Q stages is supplied with the clock signal GCKQ as the clock signal CKA, the clock signal GCKA as the clock signal CKB, the clock signal GCKB as the clock signal CKC, . . . , and clock signal GCKP as the clock signal CKQ. In this manner, correspondence between the clock signals GCKA-GCKQ and the clock signals CKA-CKQ goes out of stage one by one. Further, the output terminals of each stage of the shift register 412 output P state signals QA-QP. Further, an any stage is supplied with the state signal QP outputted from the previous stage as the set signal S, and the state signal QA outputted from the next stage as the reset signal R. However, the first stage is supplied with the gate start pulse signal GSP as the set signal S, and the z-th stage (final stage) is supplied with the gate end pulse signal GEP as the reset signal R.

Figure 26:
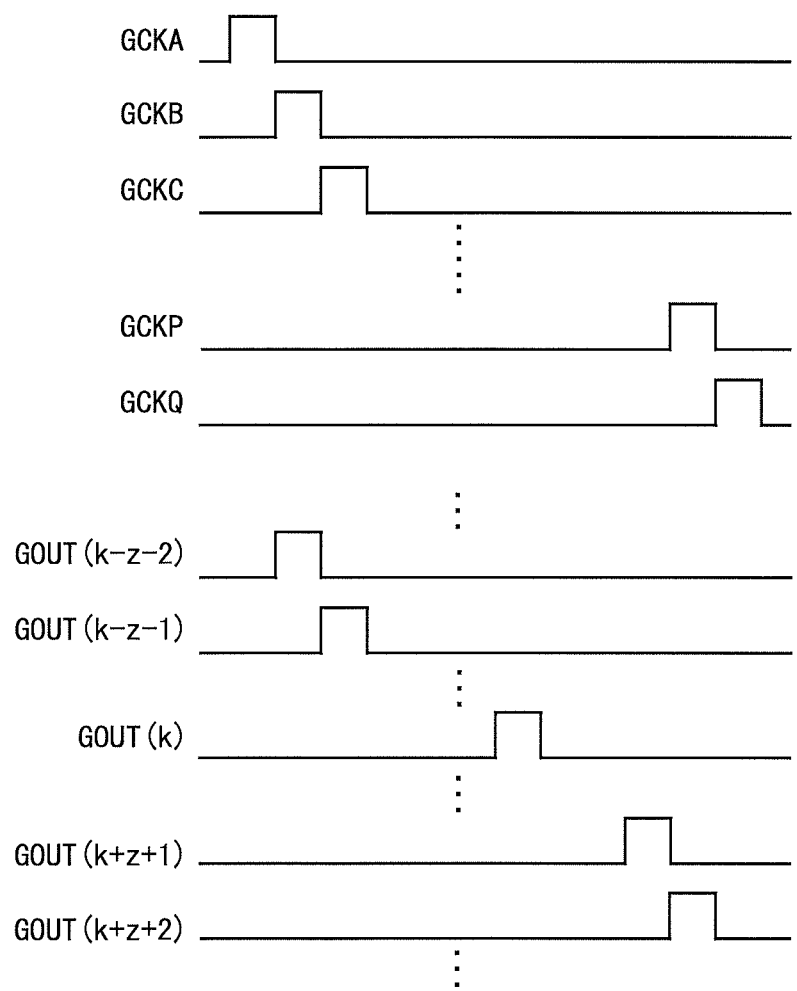
FIG. 26 is a signal waveform diagram for illustration of an operation of a gate driver according to the fifth embodiment.

In the configuration described above, when the gate start pulse signal GSP is supplied as the set signal S to the first stage SR(1) of the shift register 412, a pulse included in the gate start pulse signal GSP (this pulse is included in the state signal QP outputted from each stage) is transferred sequentially from the first stage SR(1) to the z-th stage SR(z) based on the gate clock signals GCKA-GCKQ. Then, corresponding to the transferring of the pulse, "the state signal QA outputted from the first stage SR(1)" to "the state signal QP outputted from the z-th stage SR(z)" are sequentially driven to the high level. These state signals QA-QP are respectively supplied to the gate bus lines GL1-GLi as the scanning signals GOUT(1)-GOUT(i). In this manner, as illustrated in FIG. 26, the scanning signals that are sequentially driven to the high level (active) for a single horizontal scanning period are supplied to the gate bus lines within the display unit 600.

5.2 Configuration of Stage Constituent Circuit

Figure 27:
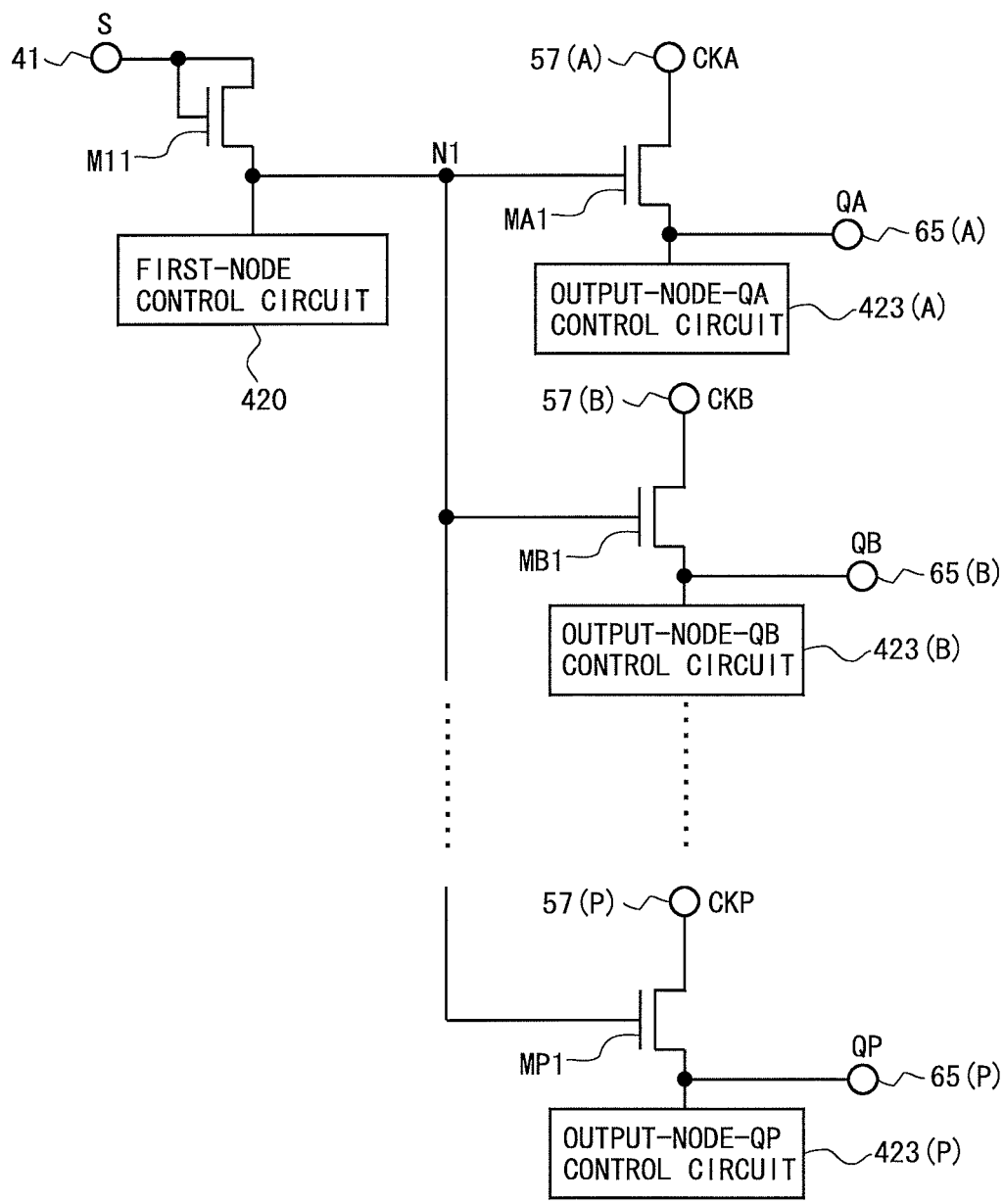
FIG. 27 is a configurational diagram schematically showing a main section of a stage constituent circuit according to the fifth embodiment.

FIG. 27 is a configurational diagram schematically showing a main section of the stage constituent circuit according to this embodiment. As illustrated in FIG. 27, this stage constituent circuit includes, as main components, the thin-film transistor M11, the input terminal 41 for receiving the set signal S, P output terminals 65(A)-65(P), P thin-film transistor MA1-MP1 as an output control switching element, input terminals 57(A)-57(P) for receiving clock signals CKA-CKP, the first-node control circuit 420 for controlling the potential of the first-node N1, and P output node control circuits 423 (A)-423(P) for controlling potentials of the output terminals 65(A)-65(P). Here, gate terminals of the P thin-film transistors MA1-MP1 are connected to the first-node N1.

It should be noted that in this embodiment, the thin-film transistors MA1-MP1 realize the output control switching elements, the output terminals 65(A)-65(P) realize the output nodes, and the clock signals CKA-CKP realize the output control clock signals.

5.3 Operation of Stage Constituent Circuit

Figure 28:
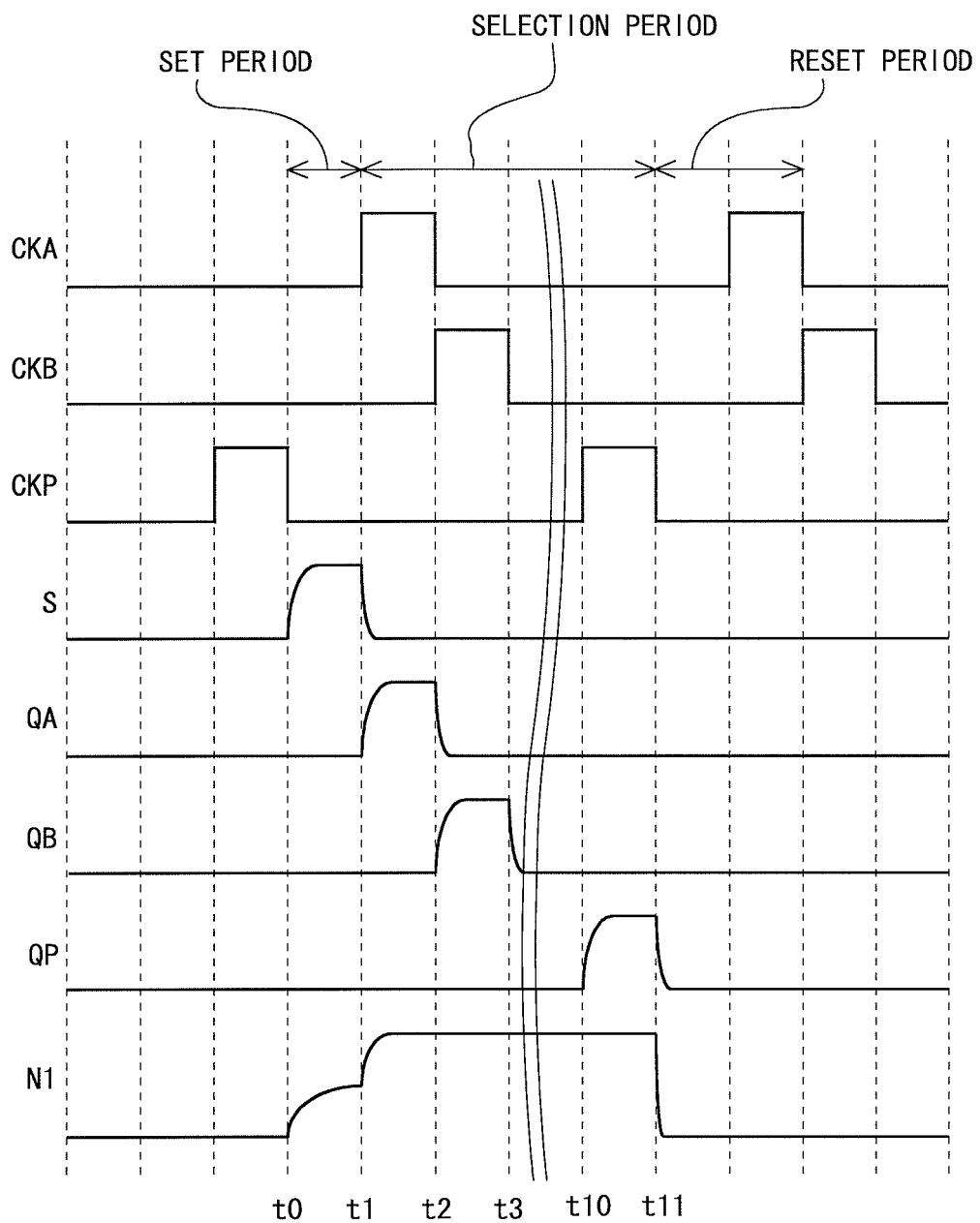
FIG. 28 is a signal waveform diagram for illustration of an operation of the stage constituent circuit according to the fifth embodiment.

FIG. 28 is a signal waveform diagram for illustration of an operation of the stage constituent circuit according to this embodiment. In the set period (at time t0), the set signal S changes from the low level to the high level. It should be noted that the set signal S changes from the low level to the high level during a period in which all of the clocks CKA-CKP are maintained at the low level. As the thin-film transistor M11 is diode-connected as illustrated in FIG. 27, the thin-film transistor M11 is turned to the ON state by the set signal S being driven to the high level, and the potential of the first-node N1 increases. With this, the thin-film transistors MA1-MP1 are turned to the ON state.

At time t1, the clock signal CKA changes from the low level to the high level. With this, the potential of the first-node N1 increases as the potential of the input terminal 57(A) increases (the first-node N1 is bootstrapped). As a result, the thin-film transistor MA1 is fully turned to the ON state, and the potential of the state signal QA increases up to a level sufficient for turning a gate bus line connected to the output terminal 65(A) of this stage constituent circuit to the selected state.

At time t2, the clock signal CKA changes from the high level to the low level. With this, the potential of the first state signal QA decreases as the potential of the input terminal 57(A) decreases. By the potential of the state signal QA decreasing, the potential of the first-node N1 is also going to decrease. However, at time t2, the potential of the first-node N1 is going to increase as the potential of the input terminal 57(B) increases by the clock signal CKB changing from the low level to the high level. As a result, the potential of the first-node N1 is maintained at the high level. Further, at time t2, by the facts that the thin-film transistor MB1 is fully in the ON state and that the clock signal CKB has changed to the high level, the potential of the state signal QB increases up to a level sufficient for turning a gate bus line connected to the output terminal 65(B) of this stage constituent circuit to the selected state. Similarly, from time t3 to time t10, potentials of the state signals QC-QP sequentially increase for a single horizontal scanning period.

At time t11, the clock signal CKP changes from the high level to the low level. With this, the potential of the first-node N1 decreases. Further, the first-node control circuit 420 causes the potential of the first-node N1 to decrease down to the low level.

5.4 Effects

According to this embodiment, each stage of the shift register 412 is provided with the P output terminals 65(A)-65(P) for outputting scanning signals. The clock signals CKA-CKP that are different from each other are supplied to the drain terminals of the P thin-film transistors MA1-MP1 as the output control switching elements whose source terminals are respectively connected to the P output terminals 65(A)-65(P). Accordingly, the P scanning signals that are sequentially driven to the ON level are outputted from each stage of the shift register 412. Specifically, each stage of the shift register 412 drives P gate bus lines. With this, as each stage of the shift register 412 drives the P gate bus lines even though the number of the circuit elements is significantly reduced as compared to the conventional example, the gate bus lines as a whole are driven as in the conventional example. As described above, it is possible to realize a monolithic gate driver capable of operating with a relatively small number of circuit elements as compared to the conventional example, and it is possible to improve a yield ratio and to downsize the liquid crystal display device.

5.5 Modified Example

Figure 29:
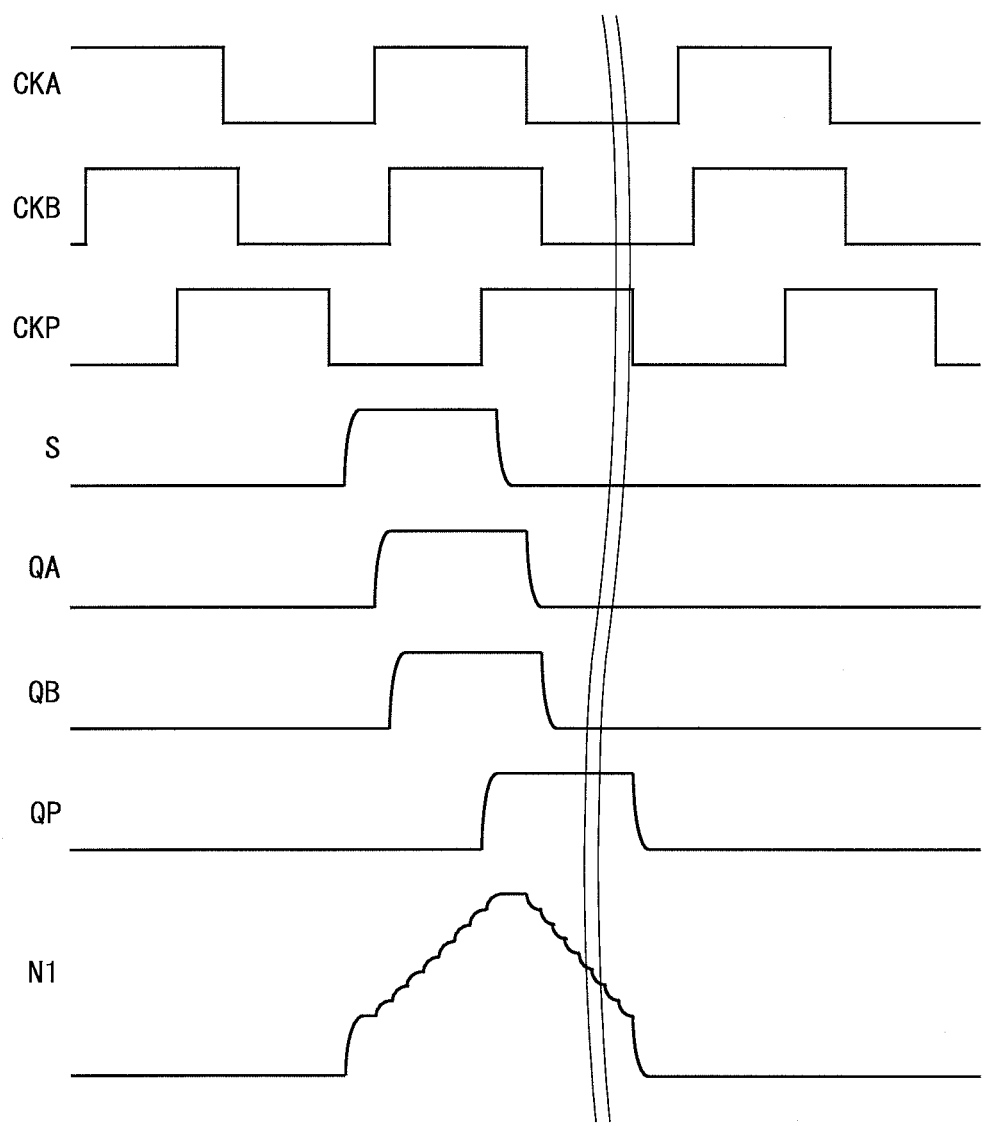
FIG. 29 is a signal waveform diagram for illustration of an operation of the stage constituent circuit according to a modified example of the fifth embodiment.

FIG. 29 is a signal waveform diagram for illustration of an operation of the stage constituent circuit according to a modified example of the fifth embodiment. In this modified example, while a difference between the phases of the clock signals CKA-CKQ is the same as in the fifth embodiment, Q=2P is established (that is, the number of phases of the clock signals is twice as large as the number of output terminals included in each stage of the shift register), and on-duty of the clock signals CKA-CKQ is substantially (½). Further, an any stage (stage constituent circuit) of the shift register is supplied with the state signal QP outputted from the previous stage as the set signal S, and the state signal QP outputted from the next stage as the reset signal R. In this modified example, as illustrated in FIG. 29, the scanning signals that are sequentially driven to the high level (active) are supplied to the gate bus lines within the display unit 600 such that there is a period in which the plurality of scanning signals respectively supplied to the plurality of gate bus lines are driven to the high level at the same time. With this, in the liquid crystal display device having the precharge period and the main charge period regarding the charge to the pixel capacitance, similarly to the fifth embodiment, it is possible to drive the gate bus lines as a whole as in the conventional example using a monolithic gate driver configured by a significantly smaller number of circuit elements as compared to the conventional example. Accordingly, it is possible to improve a yield ratio and to downsize the liquid crystal display device.

5.6 Clock Signals

When employing a configuration in which the shift register is operated using the Q-phase clock signals as described above, it is sufficient to drive each of the P output control clock signals to the high level only at one time during a period in which the potential of the first-node N1 is maintained at the high level, while satisfying an expression (1) listed below. With this, the scanning signals show substantially the same waveform in all the gate bus lines, and it is possible to suppress an occurrence of display unevenness.

$$(P/Q)+(1/R) \le 1 \quad (1)$$

Here, it is assumed that the Q-phase clock signals are out of phase with each other by (360/Q) degrees, and on-duty of them is (1/R). Further, as for the P output control clock signals supplied to each stage constituent circuit, P clock signals, which are successively out of phase with each other by (360/Q) degrees, out of the Q clock signals are not necessarily employed, and signals can be employed according to the required waveform of the scanning signal. Moreover, R is not necessarily required to be an integer.

Furthermore, in order to further reduce the number of the clock signals, an expression (2) listed below may be satisfied.

$$(P/Q)+(1/R)=1 \quad (2)$$

At this time, the P output control clock signals supplied to the stage constituent circuits are the P clock signals successively out of phase with each other by (360/Q) degrees. Further, an any stage (stage constituent circuit) of the shift register is supplied with a state signal that is P-th driven to the high level out of the state signals outputted from the previous stage as the set signal S, and a state signal that is (Q-P)th driven to the high level out of the state signals outputted from the next stage and subsequent stages as the reset signal R. Here, when "Q>2P", "(Q-P)>P" is established, and therefore a state signal outputted from a stage next to the next stage and subsequent stages becomes the reset signal R.

It should be noted that the first embodiment corresponds to a case in which a relation of "P=2, Q=3, and R=3" is established, and the second embodiment corresponds to a case in which a relation of "P=2, Q=4, and R=2" is established. As for the first embodiment and the second embodiment, because the expression (2) is satisfied, it is considered that a monolithic gate driver is realized using a smaller number of clock signals and a smaller number of circuit elements.

6. Sixth Embodiment

6.1 Configuration of Stage Constituent Circuit

Figure 30:
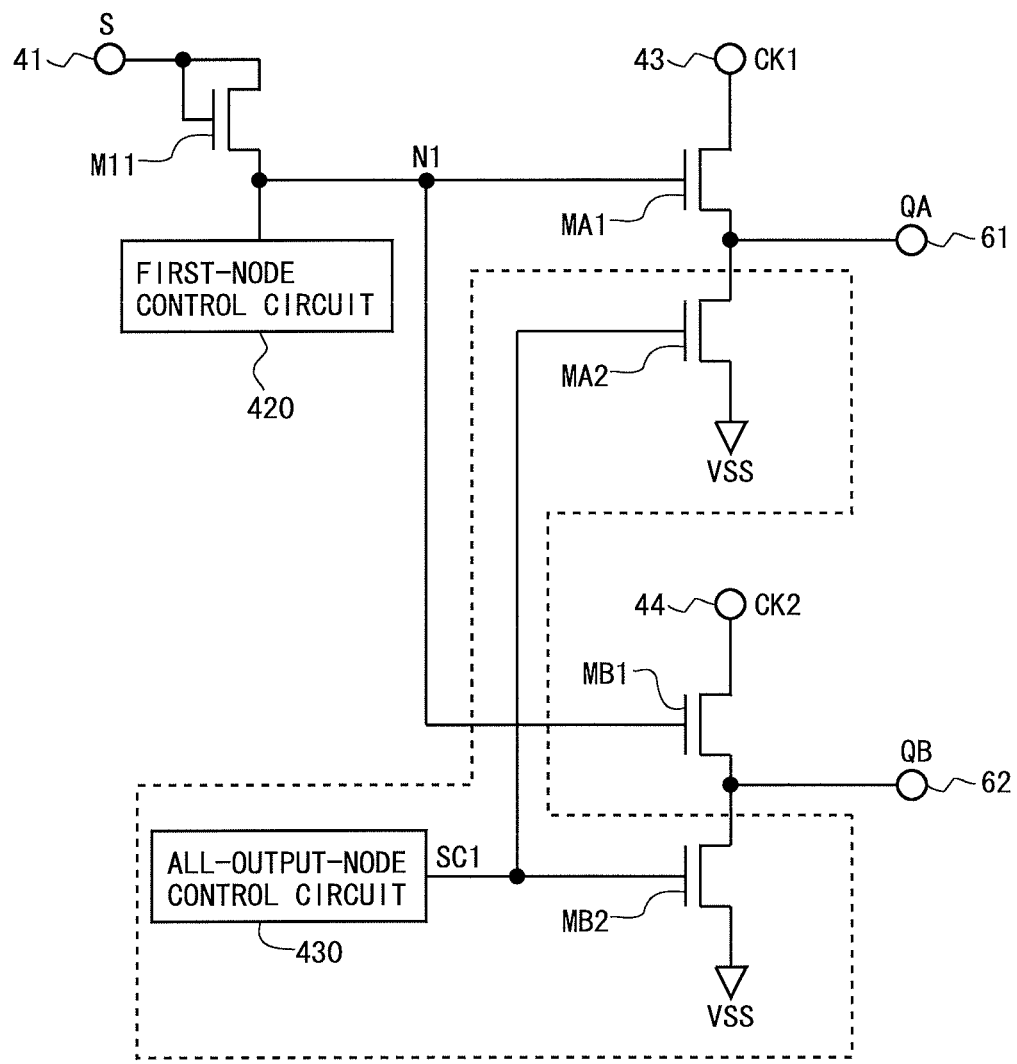
FIG. 30 is a configurational diagram schematically showing a main section of a stage constituent circuit according to a sixth embodiment of the present invention.

FIG. 30 is a configurational diagram schematically showing a main section of a stage constituent circuit according to a sixth embodiment of the present invention. In this embodiment, the preceding output-node control circuit 421 and the succeeding output-node control circuit 422 in the first embodiment are configured as a single control circuit (hereinafter referred to as an "all-output-node control circuit") 430. Further, this stage constituent circuit is provided with the thin-film transistor MA2 for changing the potential of the output terminal 61 (the first state signal QA) to the VSS potential based on an outputted signal (hereinafter referred to as an "all-output-node control signal") SC1 from the all-output-node control circuit 430, and the thin-film transistor MB2 for changing the potential of the output terminal 62 (the second state signal QB) to the VSS potential based on the all-output-node control signal SC1. Here, as a specific configuration of this stage constituent circuit, it is possible to employ the configuration according to the first embodiment illustrated in FIG. 6, for example. In addition, also in a case in which each stage constituent circuit is configured to output the P state signals as in the fifth embodiment, it is possible to configure the P output node control circuits as the all-output-node control circuit 430.

In the meantime, the all-output-node control circuit 430 within one stage constituent circuit can control the thin-film transistors MA2 and MB2 within the plurality of stage constituent circuits. For example, it is possible to configure such that the all-output-node control circuit 430 within an odd-numbered-stage stage constituent circuit controls the thin-film transistors MA2 and MB2 of this stage constituent circuit and the thin-film transistors MA2 and MB2 of the next-stage stage constituent circuit.

6.2 Operation of Stage Constituent Circuit

Figure 31:
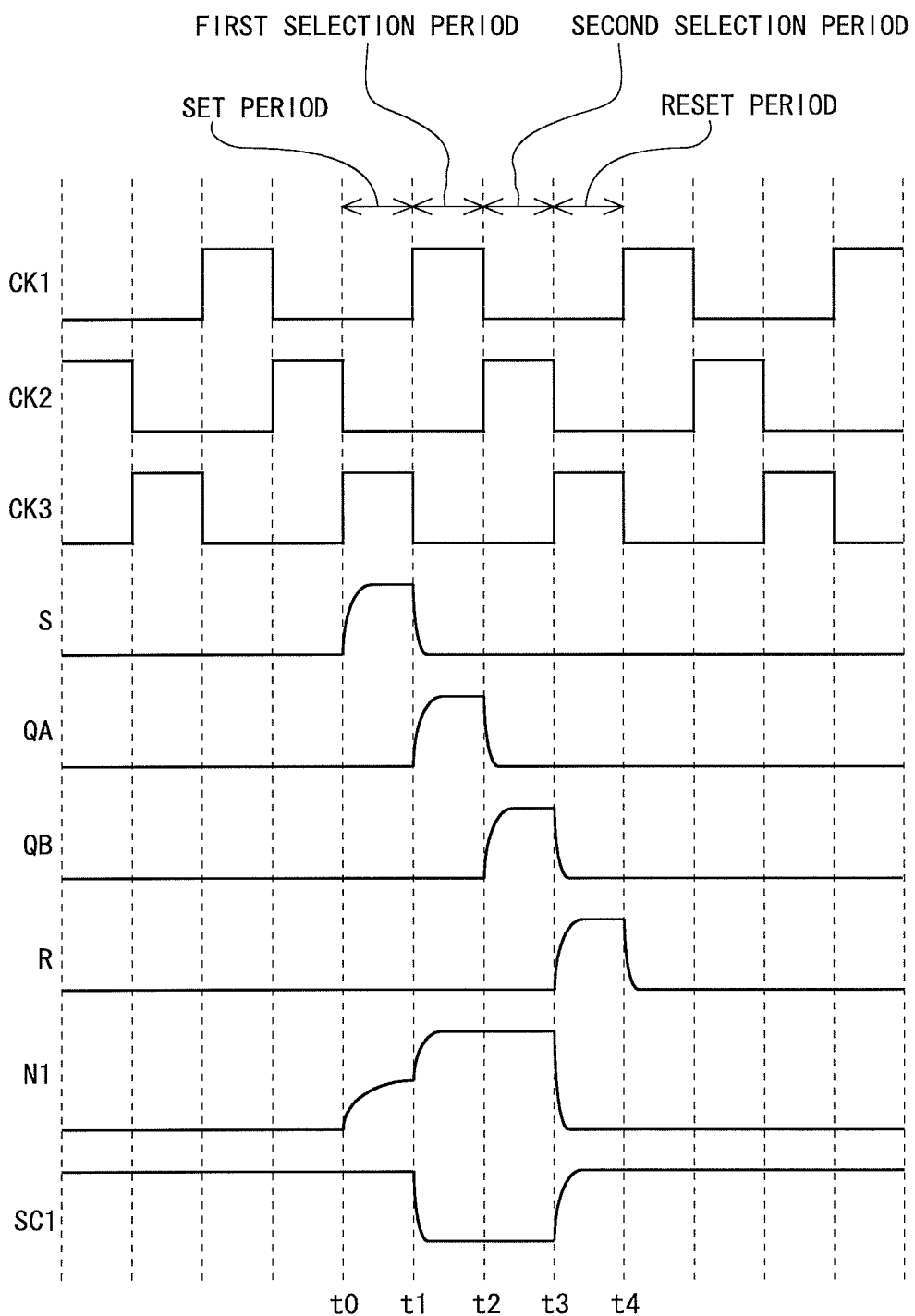
FIG. 31 is a signal waveform diagram for illustration of an operation of the stage constituent circuit according to the sixth embodiment.

FIG. 31 is a signal waveform diagram for illustration of an operation of the stage constituent circuit according to this embodiment. In this embodiment, the all-output-node control signal SC1 is driven to the low level during the first selection period and the second selection period, and to the high level during periods other than these periods. With this, in the first selection period and the second selection period, the thin-film transistors MA2 and MB2 are in the OFF state. In the first selection period, as the potential of the first-node N1 is in the high level and the first clock CK1 is driven to the high level, the first state signal QA is driven to the high level. In the second selection period, as the potential of the first-node N1 is in the high level and the second clock CK2 is driven to the high level, the second state signal QB is driven to the high level. Further, in the periods other than "the first selection period and the second selection period", the thin-film transistors MA2 and MB2 are in the ON state. Therefore, during these periods, the potential of the first state signal QA and the potential of the second state signal QB are maintained at the low level.

It should be noted that the timing for changing the all-output-node control signal SC1 from the high level to the low level can be the timing at which any one of a signal that is first driven to the high level out of the state signals outputted from the stage constituent circuit (here, the first state signal QA), a clock signal for driving this signal to the high level (here, the first clock CK1), the set signal S, and the potential of the first-node N1 changes from the low level to the high level.

6.3 Effect

According to this embodiment, in the stage constituent circuit, the plurality of thin-film transistors for respectively turning the potentials of the plurality of output terminals for outputting the state signals to the low level (OFF level) are controlled based on a single signal (the all-output-node control signal SC1) outputted from the all-output-node control circuit 430. With this, it is possible to reduce the number of the circuit elements that constitute the shift register.

7. Seventh Embodiment

7.1 Configuration of Stage Constituent Circuit

Figure 32:
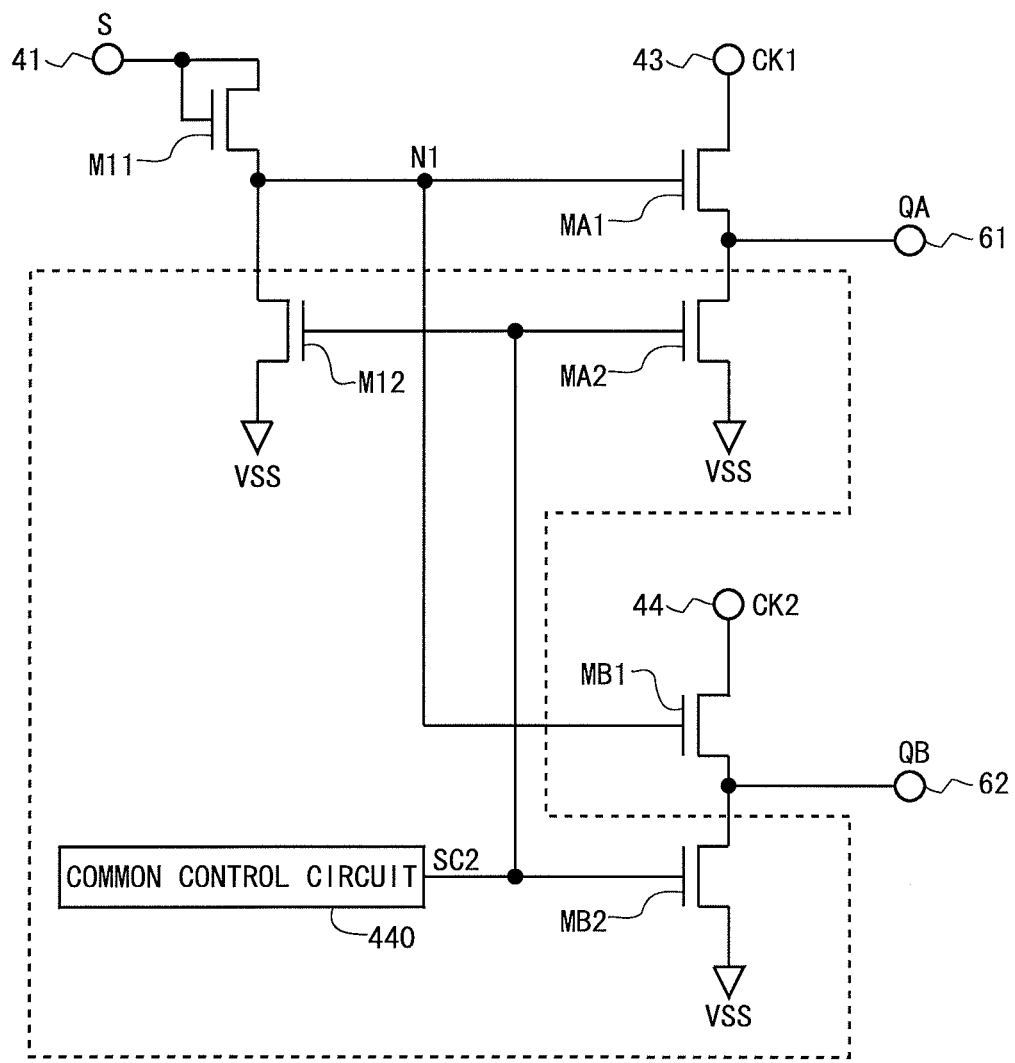
FIG. 32 is a configurational diagram schematically showing a main section of a stage constituent circuit according to a seventh embodiment of the present invention.

FIG. 32 is a configurational diagram schematically showing a main section of a stage constituent circuit according to a seventh embodiment of the present invention. In this embodiment, the first-node control circuit 420, the preceding output-node control circuit 421, and the succeeding output-node control circuit 422 in the first embodiment are configured as a single control circuit (hereinafter referred to as a "common control circuit") 440. Further, this stage constituent circuit is provided with the thin-film transistor M12 for changing the potential of the first-node N1 to the VSS potential based on an outputted signal (hereinafter referred to as a "common control signal") from the common control circuit 440 SC2, the thin-film transistor MA2 for changing the potential of the output terminal 61 (the first state signal QA) to the VSS potential based on the common control signal SC2, and the thin-film transistor MB2 for changing the potential of the output terminal 62 (the second state signal QB) to the VSS potential based on the common control signal SC2. Here, as a specific configuration of this stage constituent circuit, it is possible to employ the configuration according to the first embodiment illustrated in FIG. 6, for example. In addition, also in a case in which each stage constituent circuit is configured to output the P state signals as in the fifth embodiment, it is possible to configure the first-node control circuit 420 and the P output node control circuits as the common control circuit 440.

In the meantime, the common control circuit 440 within one stage constituent circuit can control the thin-film transistors M12, MA2, and MB2 within the plurality of stage constituent circuits. For example, it is possible to configure such that the common control circuit 440 within an odd-numbered-stage stage constituent circuit controls the thin-film transistors M12, MA2, and MB2 of this stage constituent circuit and the thin-film transistors M12, MA2, and MB2 of the next-stage stage constituent circuit.

7.2 Operation of Stage Constituent Circuit

Figure 33:
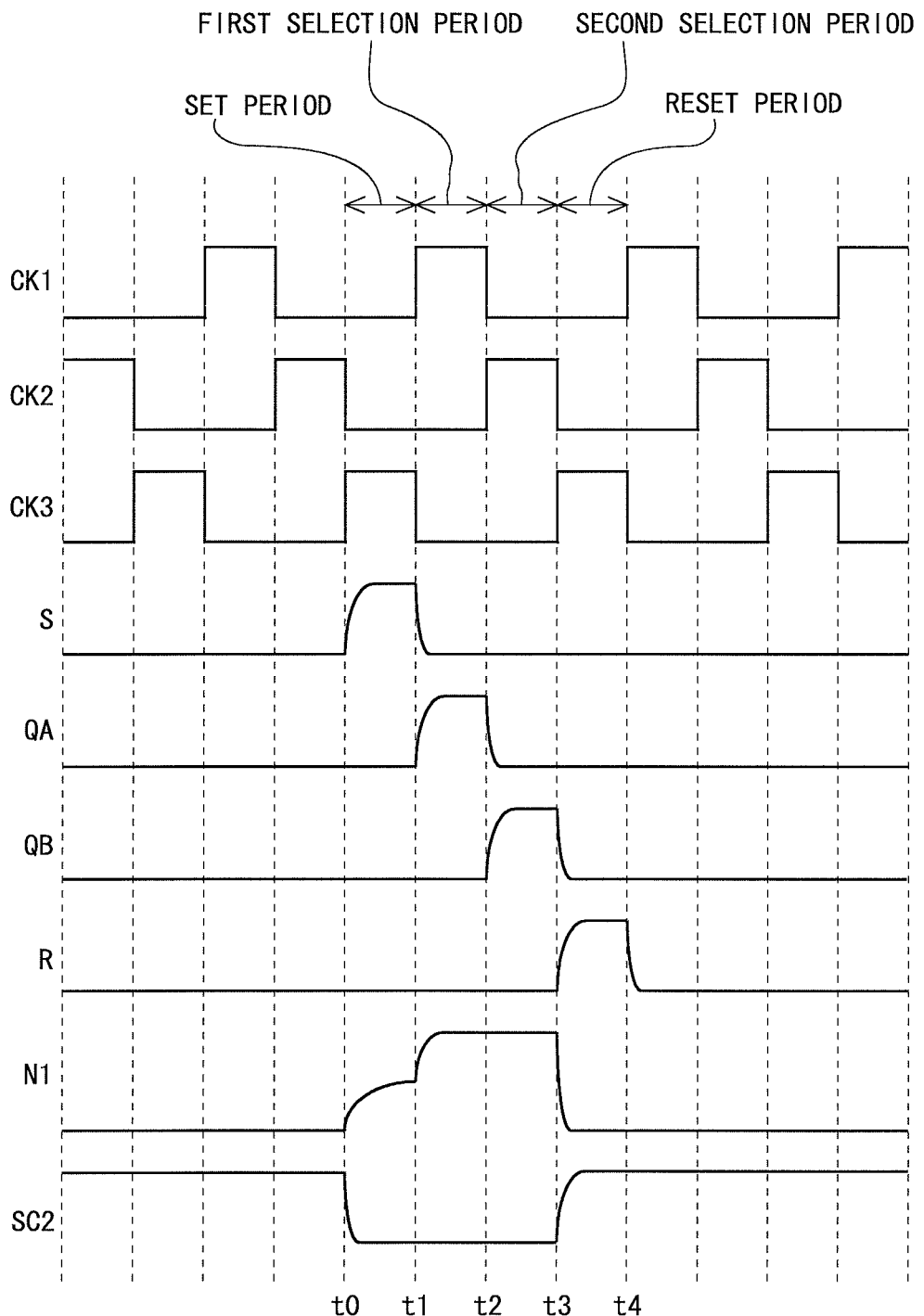
FIG. 33 is a signal waveform diagram for illustration of an operation of the stage constituent circuit according to the seventh embodiment.

FIG. 33 is a signal waveform diagram for illustration of an operation of the stage constituent circuit according to this embodiment. In this embodiment, the common control signal SC2 is driven to the low level during the set period, the first selection period, and the second selection period, and to the high level during periods other than these periods. With this, in the set period, the first selection period, and the second selection period, the thin-film transistors M12, MA2, and MB2 are in the OFF state. In the set period, as the set signal S is driven to the high level, the potential of the first-node N1 is turned to the high level. In the first selection period, as the potential of the first-node N1 is in the high level and the first clock CK1 is driven to the high level, the first state signal QA is driven to the high level. In the second selection period, as the potential of the first-node N1 is in the high level and the second clock CK2 is driven to the high level, the second state signal QB is driven to the high level. Further, in the periods other than "the set period, the first selection period, and the second selection period", the thin-film transistors M12, MA2, and MB2 are in the ON state. Therefore, during these periods, the potential of the first-node N1, the potential of the first state signal QA, and the potential of the second state signal QB are maintained at the low level.

It should be noted that the timing for changing the common control signal SC2 from the high level to the low level can be the timing at which any one of the set signal S and the potential of the first-node N1 changes from the low level to the high level.

7.3 Effect

According to this embodiment, in the stage constituent circuit, the thin-film transistor for turning the potential of the first-node N1 to the low level and the plurality of thin-film transistors for respectively turning the potentials of the plurality of output terminals for outputting the state signals to the low level (OFF level) are controlled based on a single signal (the common control signal SC2) outputted from the common control circuit 440. With this, it is possible to effectively reduce the number of the circuit elements that constitute the shift register.

7.4 Modified Example

Figure 34:
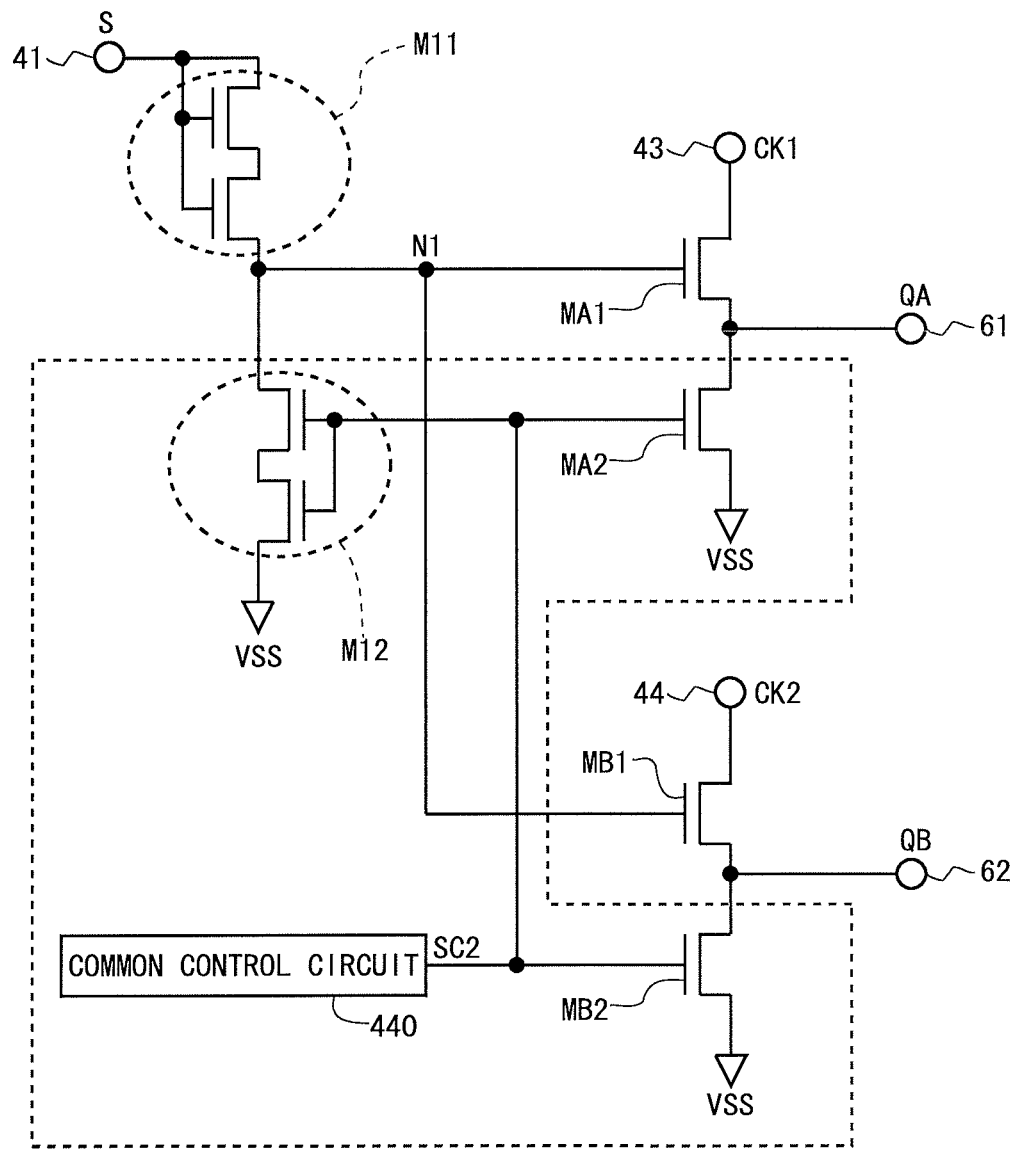
FIG. 34 is a configurational diagram schematically showing a main section of the stage constituent circuit according to a modified example of the seventh embodiment.

FIG. 34 is a configurational diagram schematically showing a main section of the stage constituent circuit according to a modified example of the seventh embodiment. In this modified example, as illustrated in FIG. 34, the thin-film transistors M11 and M12 are multigated. In the seventh embodiment, in a case in which a thin-film transistor whose leak current (the leak current when the voltage between the gate and the source is 0V) when a high voltage is applied between the drain and the source is large (e.g., a thin-film transistor using microcrystalline silicon (μc-Si) for its semiconductor layer) is employed, there is a concern that the potential of the first-node N1 decreases during the first selection period and the second selection period. However, according to this modified example, as the OFF currents of the thin-film transistors M11 and M12 are relatively small, the decrease of the potential of the first-node N1 during the first selection period and the second selection period is suppressed, the potential of the first state signal QA sufficiently increases in the first selection period, and the potential of the second state signal QB sufficiently increases in the second selection period. It should be noted that, also in the embodiments described above (including the modified examples), the same effect is obtained by multigating the thin-film transistors M11 and M12.

8. Eighth Embodiment

8.1 Configuration of Shift Register

Figure 35:
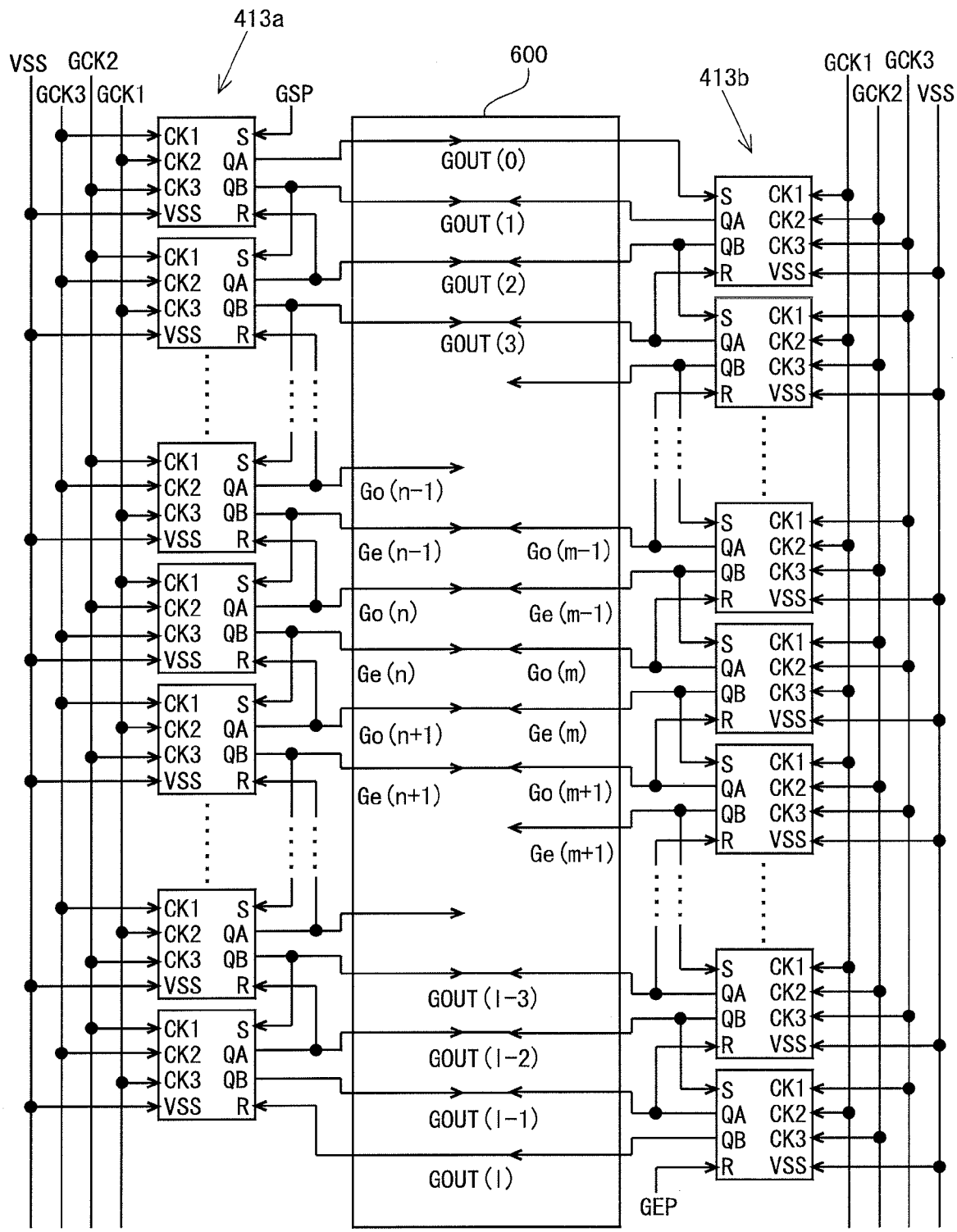
FIG. 35 is a block diagram showing a configuration of a shift register according to an eighth embodiment of the present invention.

FIG. 35 is a block diagram showing a configuration of a shift register according to an eighth embodiment of the present invention. As illustrated in FIG. 35, this shift register is configured by a first shift register 413a within a gate driver provided on one side of the display unit 600 and a second shift register 413b within a gate driver provided on the other side of the display unit 600. Both of the first shift register 413a and the second shift register 413b have the same configuration as that of the shift register 410 according to the first embodiment (see FIG. 4). The configurations of stage constituent circuits within the first shift register 413a and the second shift register 413b are the same as that of the first embodiment (see FIG. 1 and FIG. 6).

By the configuration as described above, each gate bus line is driven by the one and the other sides of the display unit 600. Here, focusing on an any gate bus line, a state signal that is a scanning signal applied to this gate bus line is different between the first shift register 413a and the second shift register 413b. For example, the signals which become the scanning signal GOUT(2) in FIG. 35 are the first state signal QA as for a signal outputted from the first shift register 413a, and the second state signal QB as for a signal outputted from the second shift register 413b. Further, the signals which become the scanning signal GOUT(3) in FIG. 35 are the second state signal QB as for a signal outputted from the first shift register 413a and the first state signal QA as for a signal outputted from the second shift register 413b.

The second shift register 413b is configured to start its operation based on the outputted signal from the first shift register 413a (that is, the first state signal QA outputted from the stage constituent circuit of the first stage). Specifically, the second shift register 413b is not supplied with the gate start pulse signal GSP. The first shift register 413a is configured to stop its operation based on the outputted signal from the second shift register 413b (that is, the second state signal QB outputted from the stage constituent circuit of the last stage). Specifically, the first shift register 413a is not supplied with the gate end pulse signal GEP.

It should be noted that while the two gate drivers are provided so as to sandwich the display unit 600 from the one and the other sides thereof in FIG. 35, the two gate drivers are not necessarily required to be provided in such a manner. In addition, it is not necessarily required to supply all the scanning signals to an active area (effective display area). For example, the scanning signal GOUT(0) that is first activated in each vertical scanning period and the scanning signal GOUT(1) that is last activated in each vertical scanning period are not required to be supplied to the active area (effective display area).

8.2 Effects

Figure 36:
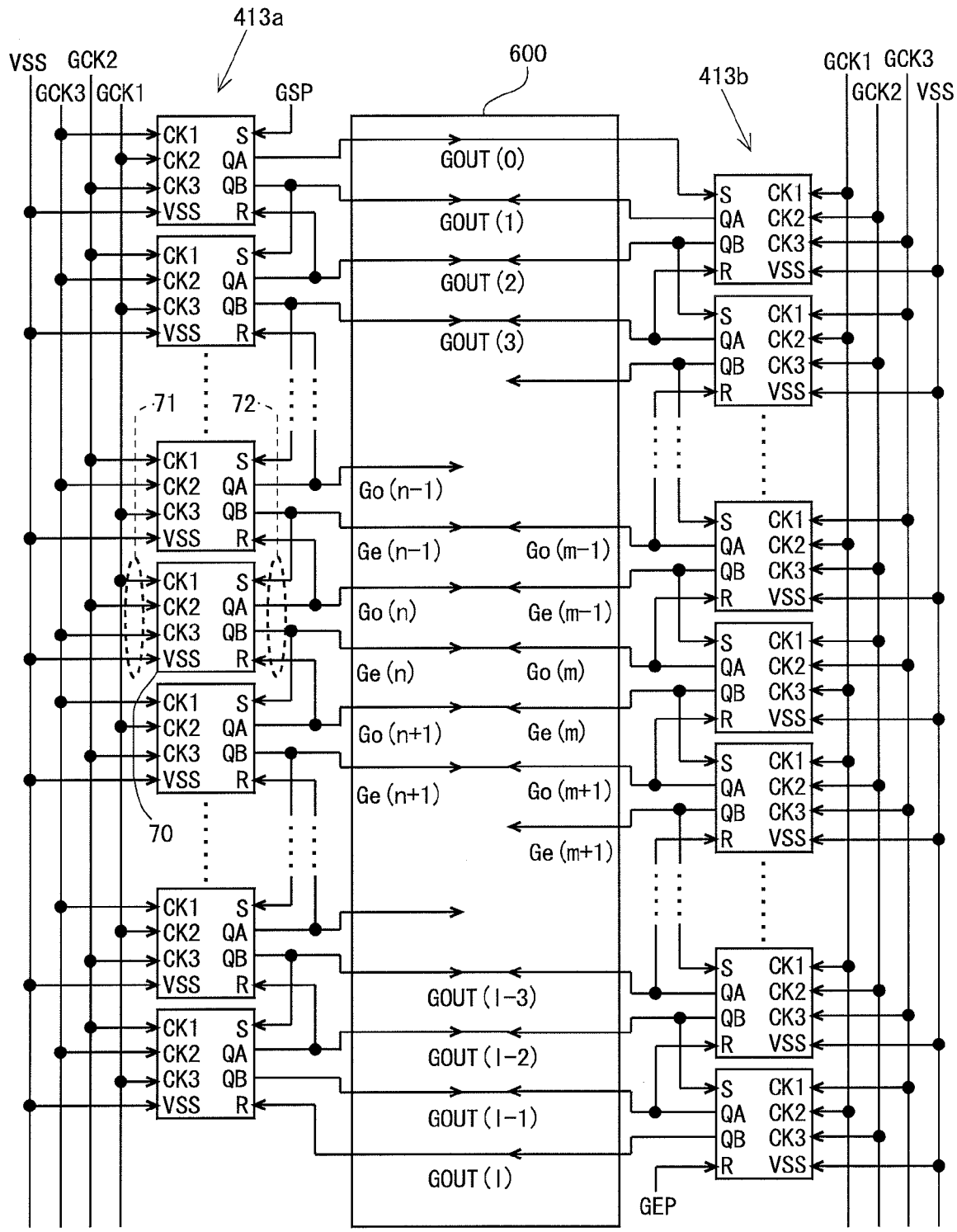
FIG. 36 is a diagram for illustration of an effect of the eighth embodiment.
Figure 37:
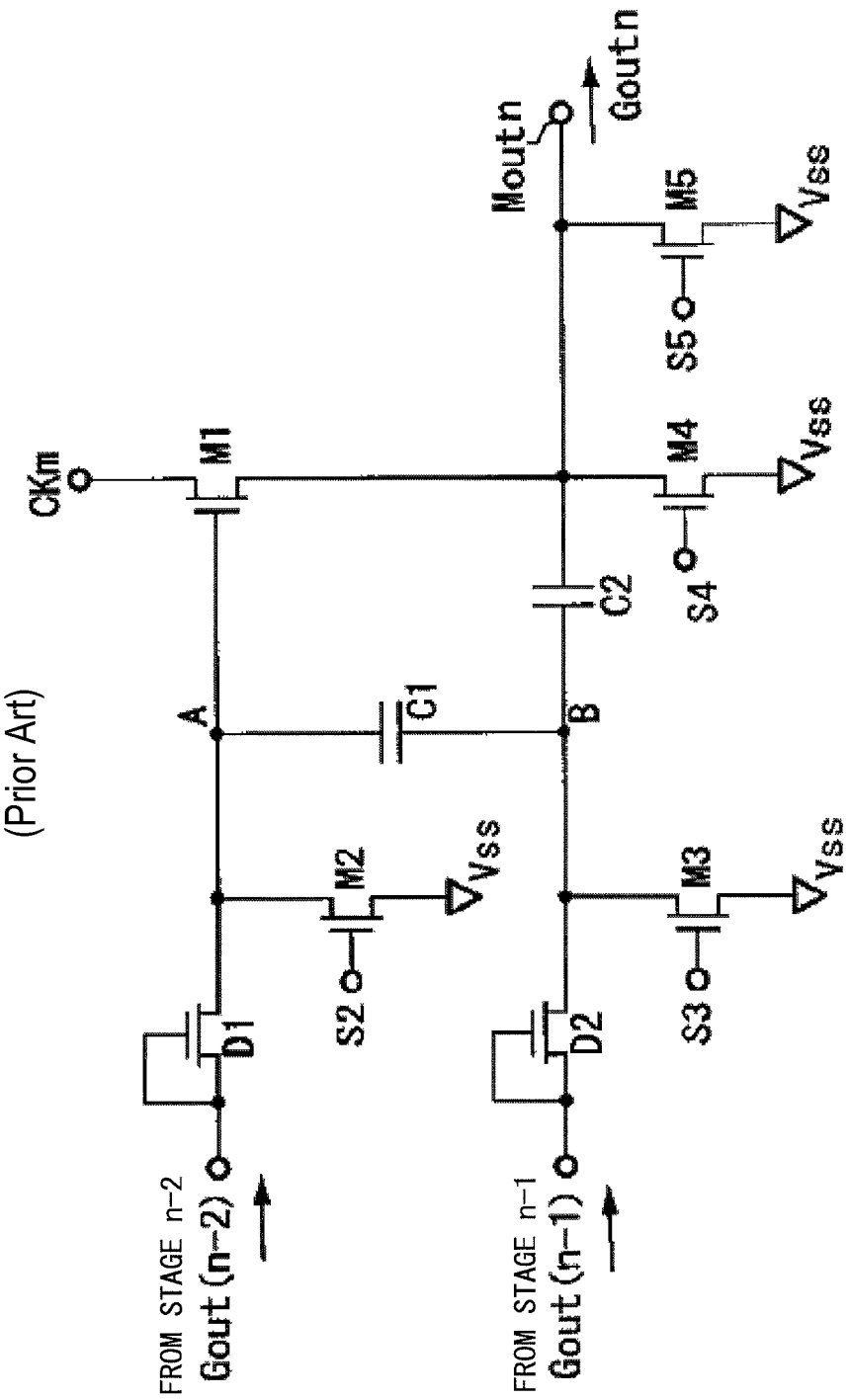
FIG. 37 is a circuit diagram showing one example of a configuration of each stage in a shift register of a conventional display device.
Figure 38:
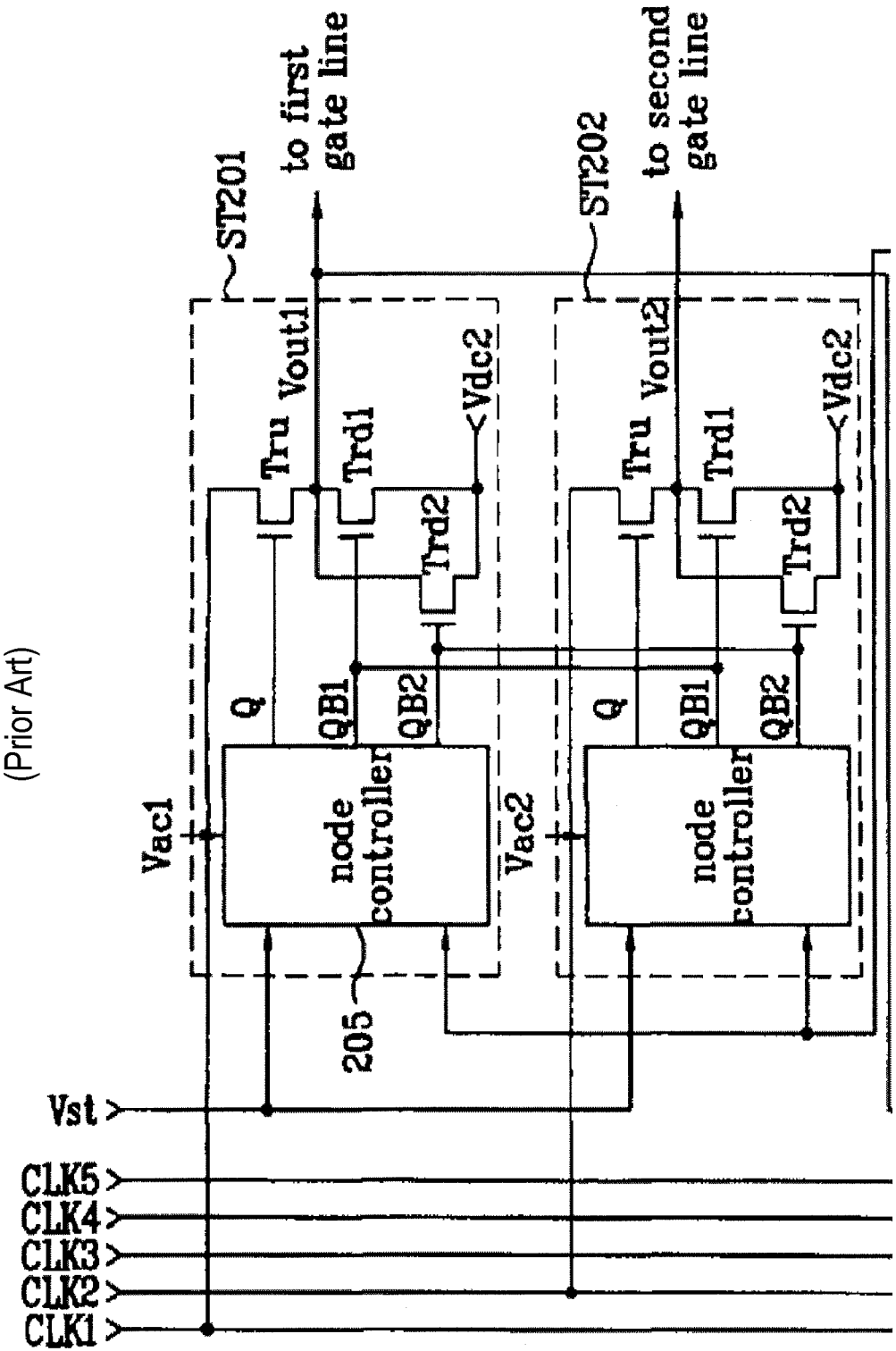
FIG. 38 is a circuit diagram showing another example of the configuration of each stage in the shift register of the conventional display device.

According to this embodiment, it is possible to realize a liquid crystal display device configured such that each gate bus line is driven by the plurality of gate drivers using a smaller number of circuit elements as compared to the conventional example. Further, even when a defect occurs in one gate driver, the gate bus line is normally driven by the other gate driver. For example, even when a defect (for example, a leak defect) occurs in the stage constituent circuit indicated by a reference numeral 70 in FIG. 36, by isolating sections indicated by reference numerals 71 and 72, the gate bus line connected to this stage constituent circuit is normally driven.

Moreover, the first state signal QA outputted from the first shift register 413a and the second state signal QB outputted from the second shift register 413b are the scanning signals for driving the same gate bus line, and the second state signal QB outputted from the first shift register 413a and the first state signal QA outputted from the second shift register 413b are the scanning signals for driving the same gate bus line. Accordingly, even when there is a difference between a waveform of the first state signal QA and a waveform of the second state signal QB, the scanning signals show substantially the same waveform for all of the gate bus lines. With this, it is possible to suppress an occurrence of display unevenness.

Furthermore, in the configuration in which the plurality of gate drivers are provided, an outputted signal from one gate driver becomes the gate start pulse signal GSP for a different gate driver. Likewise, an outputted signal from one gate driver becomes the gate end pulse signal GEP for a different gate driver. With this, as compared to the configuration in which one gate start pulse signal GSP and one gate end pulse signal GEP are used for each gate driver, it is possible to reduce the number of the gate start pulse signals GSP and the gate end pulse signals GEP that are required for the liquid crystal display device as a whole.

9. Others

While the above embodiments have been described taking the liquid crystal display device as an example, the present invention is not limited to this. The present invention can be applied to other display devices such as organic EL (Electro Luminescence).

The invention claimed is:

1. A scanning signal line drive circuit configured to drive scanning signal lines of a display unit, the scanning signal line drive circuit comprising:
  a shift register having a plurality of stages that sequentially transfer a shift pulse based on a plurality of clock signals that are externally inputted and are cyclically driven to one of a first level and a second level, wherein
  a stage constituent circuit constituting each stage of the shift register includes
    P output nodes connected to the scanning signal lines and each configured to output a scanning signal for driving the scanning signal line, where P is an integer equal to or greater than 2,
    P output control switching elements respectively corresponding to the P output nodes, each of the P output control switching elements having a second electrode to which an output control clock signal for controlling a level of the scanning signal outputted from the output node is supplied and a third electrode connected to the output node, and
    a first-node commonly connected to first electrodes of the P output control switching elements,
  the second electrode of each of the P output control switching elements included in the stage constituent circuit is supplied with one of the plurality of clock signals as the output control clock signal such that signals different from each other are respectively supplied to the second electrodes of the P output control switching elements,
  in each stage constituent circuit,
    the scanning signal outputted from one of the P output nodes is supplied as the shift pulse to a stage constituent circuit subsequent to the each stage constituent circuit, and
    the first-node changes to an ON level based on the shift pulse outputted from a stage constituent circuit preceding the each stage constituent circuit,
  the stage constituent circuit includes two output nodes as the P output nodes and two output control switching elements as the P output control switching elements,
  two clock signals are inputted as the output control clock signals to the stage constituent circuit, on-duty of the two clock signals being substantially one thirds, the two clock signals being out of phase by 120 degrees,
  the stage constituent circuit
    further includes a first-node controller configured to turn the first-node to an OFF level, and
    receives one of the two clock signals as a first clock and the other of the two clock signals as a second clock, the two clock signals being inputted as the output control clock signals, the one of the two clock signals being first driven to the ON level during a period in which the first-node is in the ON level, the other of the two clock signals being later driven to the ON level during this period,
  each stage constituent circuit is supplied with, as the shift pulse, a scanning signal later driven to the ON level out of two scanning signals outputted from the two output nodes included in a previous-stage stage constituent circuit of the each stage constituent circuit, and
  the first-node controller changes the first-node from the ON level to the OFF level during a period after a scanning signal later driven to the ON level out of two scanning signals outputted from the two output nodes included in the stage constituent circuit or the second clock changes from the ON level to the OFF level until the first clock next changes from the OFF level to the ON level.

2. The scanning signal line drive circuit according to claim 1, wherein
  in each stage constituent circuit, the first-node controller changes the first-node from the ON level to the OFF level based on a scanning signal first driven to the ON level out of two scanning signals outputted from the two output nodes included in a next-stage stage constituent circuit of the each stage constituent circuit or a clock signal inputted as the first clock to the next-stage stage constituent circuit of the each stage constituent circuit.

3. A scanning signal line drive circuit configured to drive scanning signal lines of a display unit, the scanning signal line drive circuit comprising:
  a shift register having a plurality of stages that sequentially transfer a shift pulse based on a plurality of clock signals that are externally inputted and are cyclically driven to one of a first level and a second level, wherein
  a stage constituent circuit constituting each stage of the shift register includes
    P output nodes connected to the scanning signal lines and each configured to output a scanning signal for driving the scanning signal line, where P is an integer equal to or greater than 2,
    P output control switching elements respectively corresponding to the P output nodes, each of the P output control switching elements having a second electrode to which an output control clock signal for controlling a level of the scanning signal outputted from the output node is supplied and a third electrode connected to the output node, and
    a first-node commonly connected to first electrodes of the P output control switching elements,
  the second electrode of each of the P output control switching elements included in the stage constituent circuit is supplied with one of the plurality of clock signals as the output control clock signal such that signals different from each other are respectively supplied to the second electrodes of the P output control switching elements,
  in each stage constituent circuit,
    the scanning signal outputted from one of the P output nodes is supplied as the shift pulse to a stage constituent circuit subsequent to the each stage constituent circuit, and
    the first-node changes to an ON level based on the shift pulse outputted from a stage constituent circuit preceding the each stage constituent circuit,
  the stage constituent circuit includes two output nodes as the P output nodes and two output control switching elements as the P output control switching elements,
  two clock signals are inputted as the output control clock signals to the stage constituent circuit, on-duty of the two clock signals being substantially half, the two clock signals being out of phase by 90 degrees,
  the stage constituent circuit
    further includes a first-node controller configured to turn the first-node to an OFF level, and
    receives one of the two clock signals as a first clock and the other of the two clock signals as a second clock, the two clock signals being inputted as the output control clock signals, the one of the two clock signals being first driven to the ON level during a period in which the first-node is in the ON level, the other of the two clock signals being later driven to the ON level during this period, each stage constituent circuit is supplied with, as the shift pulse, a scanning signal later driven to the ON level out of two scanning signals outputted from the two output nodes included in a previous-stage stage constituent circuit of the each stage constituent circuit, and the first-node controller changes the first-node from the ON level to the OFF level during a period after a scanning signal later driven to the ON level out of two scanning signals outputted from the two output nodes included in the stage constituent circuit or the second clock changes from the ON level to the OFF level until the first clock next changes from the OFF level to the ON level.

4. The scanning signal line drive circuit according to claim 3, wherein in each stage constituent circuit, the first-node controller changes the first-node from the ON level to the OFF level based on a scanning signal later driven to the ON level out of two scanning signals outputted from the two output nodes included in a next-stage stage constituent circuit of the each stage constituent circuit or a clock signal inputted as the second clock to the next-stage stage constituent circuit of the each stage constituent circuit.

5. A scanning signal line drive circuit configured to drive scanning signal lines of a display unit, the scanning signal line drive circuit comprising:

a shift register having a plurality of stages that sequentially transfer a shift pulse based on a plurality of clock signals that are externally inputted and are cyclically driven to one of a first level and a second level, wherein a stage constituent circuit constituting each stage of the shift register includes P output nodes connected to the scanning signal lines and each configured to output a scanning signal for driving the scanning signal line, where P is an integer equal to or greater than 2, P output control switching elements respectively corresponding to the P output nodes, each of the P output control switching elements having a second electrode to which an output control clock signal for controlling a level of the scanning signal outputted from the output node is supplied and a third electrode connected to the output node, and a first-node commonly connected to first electrodes of the P output control switching elements, the second electrode of each of the P output control switching elements included in the stage constituent circuit is supplied with one of the plurality of clock signals as the output control clock signal such that signals different from each other are respectively supplied to the second electrodes of the P output control switching elements, in each stage constituent circuit, the scanning signal outputted from one of the P output nodes is supplied as the shift pulse to a stage constituent circuit subsequent to the each stage constituent circuit, and the first-node changes to an ON level based on the shift pulse outputted from a stage constituent circuit preceding the each stage constituent circuit, and P clock signals out of Q clock signals are inputted as the output control clock signals to the stage constituent circuit, where Q is an integer equal to or greater than 3, on-duty of the Q clock signals being substantially an R-th part, the Q clock signals being out of phase by (360/Q) degrees, a relation between P, Q, and R satisfying an expression listed below;

$$(P/Q)+(1/R) \le 1.$$

6. The scanning signal line drive circuit according to claim 5, wherein a relation between P, Q, and R satisfies an expression listed below, and in each stage constituent circuit, the first-node changes to the ON level based on a scanning signal that is P-th driven to the ON level out of the scanning signals outputted from the output nodes included in a previous-stage constituent circuit of the each stage constituent circuit, and changes to an OFF level based on a scanning signal that is (Q-P)th driven to the ON level out of the scanning signals outputted from the output nodes included in the stage constituent circuit subsequent to the each stage constituent circuit;

$$(P/Q)+(1/R)=1.$$

7. The scanning signal line drive circuit according to claim 5, wherein the stage constituent circuit further includes a first-node controller configured to turn the first-node to an OFF level, and receives one of the P clock signals as a first-outputted clock and a different one of the P clock signals as a last-outputted clock, the one of the P clock signals being first driven to the ON level during a period in which the first-node is in the ON level, the different one of the P clock signals being last driven to the ON level during this period, the stage constituent circuit is supplied with, as the shift pulse, a signal that changes from the OFF level to the ON level during a period after the last-outputted clock changes from the ON level to the OFF level until the first-outputted clock next changes from the OFF level to the ON level, and the first-node controller changes the first-node from the ON level to the OFF level during a period after a scanning signal last driven to the ON level out of P scanning signals outputted from the P output nodes included in the stage constituent circuit or the last-outputted clock changes from the ON level to the OFF level until the first-outputted clock next changes from the OFF level to the ON level.

8. The scanning signal line drive circuit according to claim 7, wherein in each stage constituent circuit, the first-node controller changes the first-node from the ON level to the OFF level based on one scanning signal out of the scanning signals outputted from the output nodes included in a stage constituent circuits subsequent to the each stage constituent circuit or the output control clock signal supplied to the second electrode of the output control switching element having the third electrode connected to the output node for outputting the one scanning signal, the one scanning signal being driven to the ON level during a period after a scanning signal last driven to the ON level out of P scanning signals outputted from the P output nodes included in the each stage constituent circuit or the last-outputted clock changes from the ON level to the OFF level until the first-outputted clock next changes from the OFF level to the ON level.

* * * * *